United States Patent [19]

Carrison et al.

[11] Patent Number: 4,468,727
[45] Date of Patent: Aug. 28, 1984

[54] INTEGRATED CELLULAR ARRAY PARALLEL PROCESSOR

[75] Inventors: Craig L. Carrison, Golden Valley; James D. Joseph, Oakdale; Patrenahalli M. Narendra, Plymouth, all of Minn.

[73] Assignee: Honeywell Inc., Minneapolis, Minn.

[21] Appl. No.: 263,536

[22] Filed: May 14, 1981

[51] Int. Cl.³ .................. G06F 7/00; G06K 9/12
[52] U.S. Cl. .................................................. 364/200
[58] Field of Search ... 364/200 MS File, 900 MS File, 364/518, 819, 822, 824, 825, 826, 827, 864; 307/221 C, 221 D; 357/24

[56] References Cited

U.S. PATENT DOCUMENTS

| | | |
|---|---|---|
| 3,106,698 | 10/1963 | Unger . |
| 3,940,602 | 2/1976 | Lagnado et al. . |
| 3,947,705 | 3/1976 | Emmons . |
| 4,012,767 | 3/1977 | Brown et al. .......................... 357/24 |
| 4,034,199 | 7/1977 | Lampe et al. . |
| 4,058,717 | 11/1977 | Engeler ................................ 364/824 |
| 4,065,808 | 12/1977 | Schomberg et al. ................. 364/200 |
| 4,071,906 | 1/1978 | Buss . |
| 4,084,256 | 4/1976 | Engeler et al. ...................... 364/862 |
| 4,084,257 | 4/1978 | Burke et al. ......................... 364/826 |
| 4,099,250 | 7/1978 | Finnila et al. . |
| 4,120,035 | 10/1978 | Cases et al. . |
| 4,156,284 | 5/1979 | Engeler . |
| 4,161,785 | 7/1979 | Gasparek . |
| 4,174,514 | 11/1979 | Sternberg . |
| 4,209,852 | 6/1980 | Hyatt ..................................... 357/24 |
| 4,215,401 | 7/1980 | Holsztynski et al. .............. 364/200 |
| 4,230,954 | 10/1980 | Heller .................................... 357/24 |
| 4,246,496 | 1/1981 | Heller .................................... 357/24 |
| 4,288,803 | 9/1981 | Ronen .................................... 357/24 |
| 4,350,902 | 9/1982 | Knauer ................................... 357/24 |

Primary Examiner—Felix D. Gruber
Assistant Examiner—Daniel K. Dorsey
Attorney, Agent, or Firm—Theodore F. Neils

[57] ABSTRACT

A monolithic integrated circuit is provided in which signals from concurrently operating information sources are each provided to a corresponding signal processing cell in an array thereof. These cells can each communicate directly with surrounding nearest neighbor cells both to and from. Each such signal processing cell is capable of being directed in parallel to perform selected signal processing operations including operations involving data from many cells. Communications between cells can be effected using charge coupled devices, and the signal processing operations in a cell can be performed by a floating gate regenerator.

67 Claims, 36 Drawing Figures

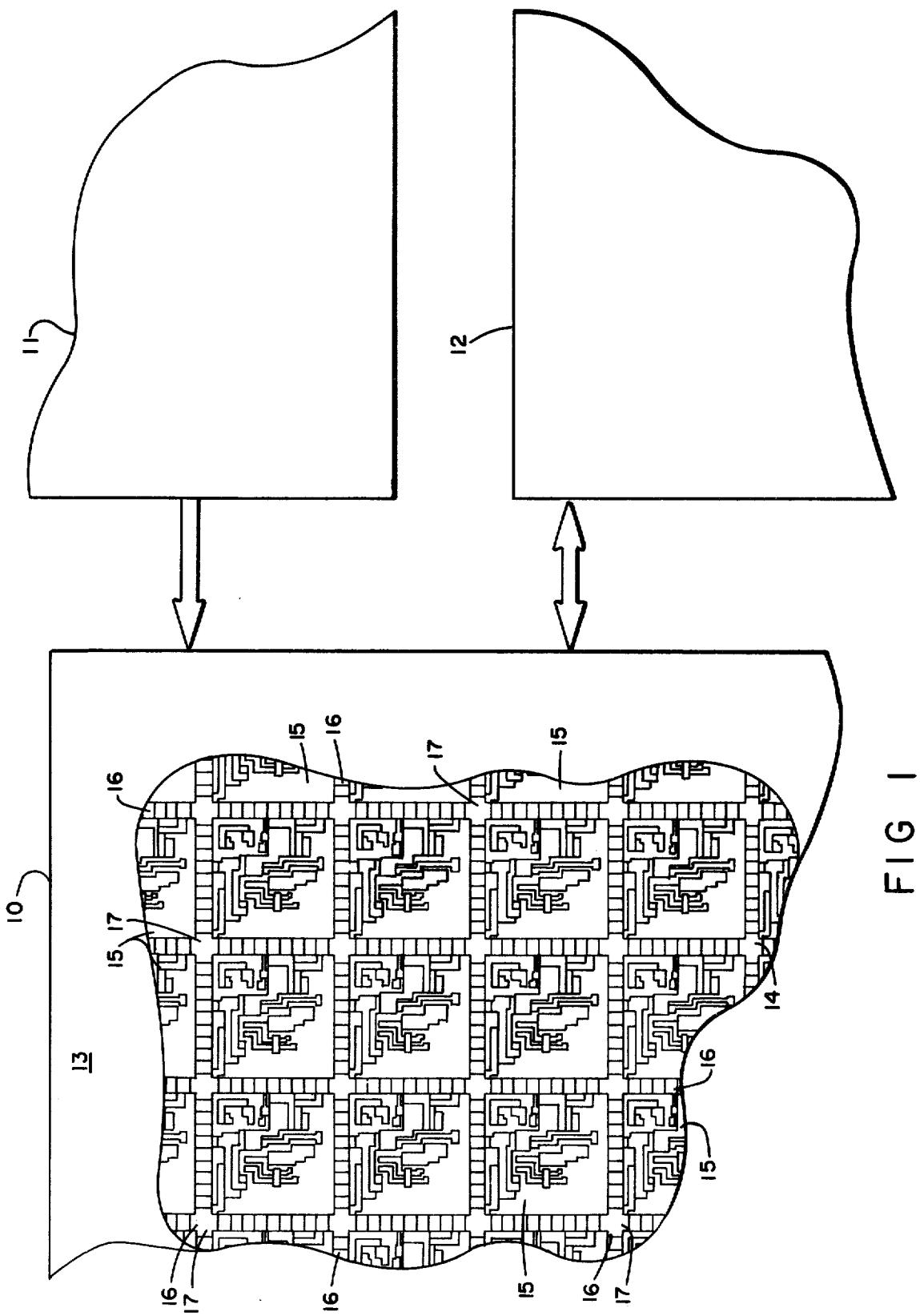

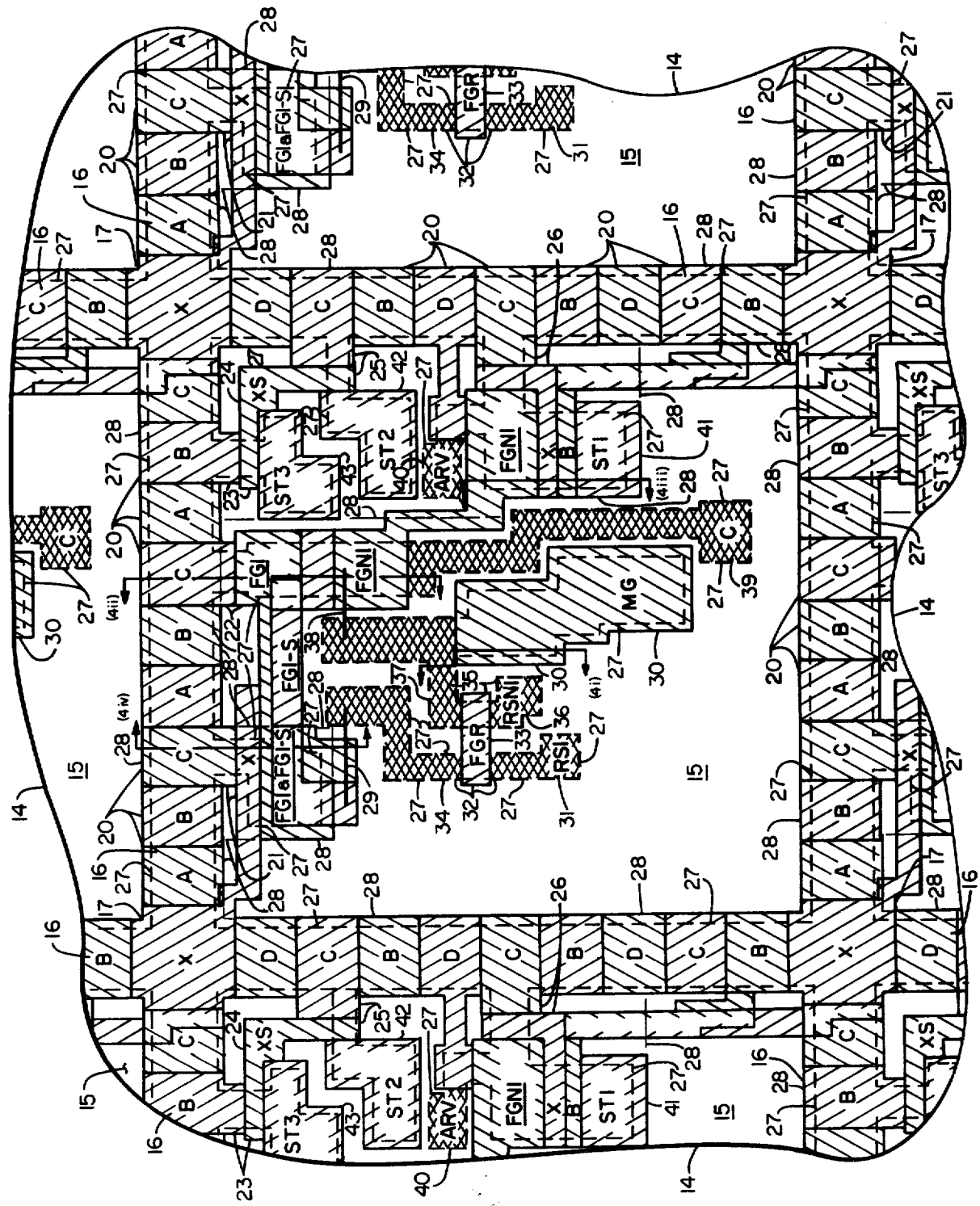

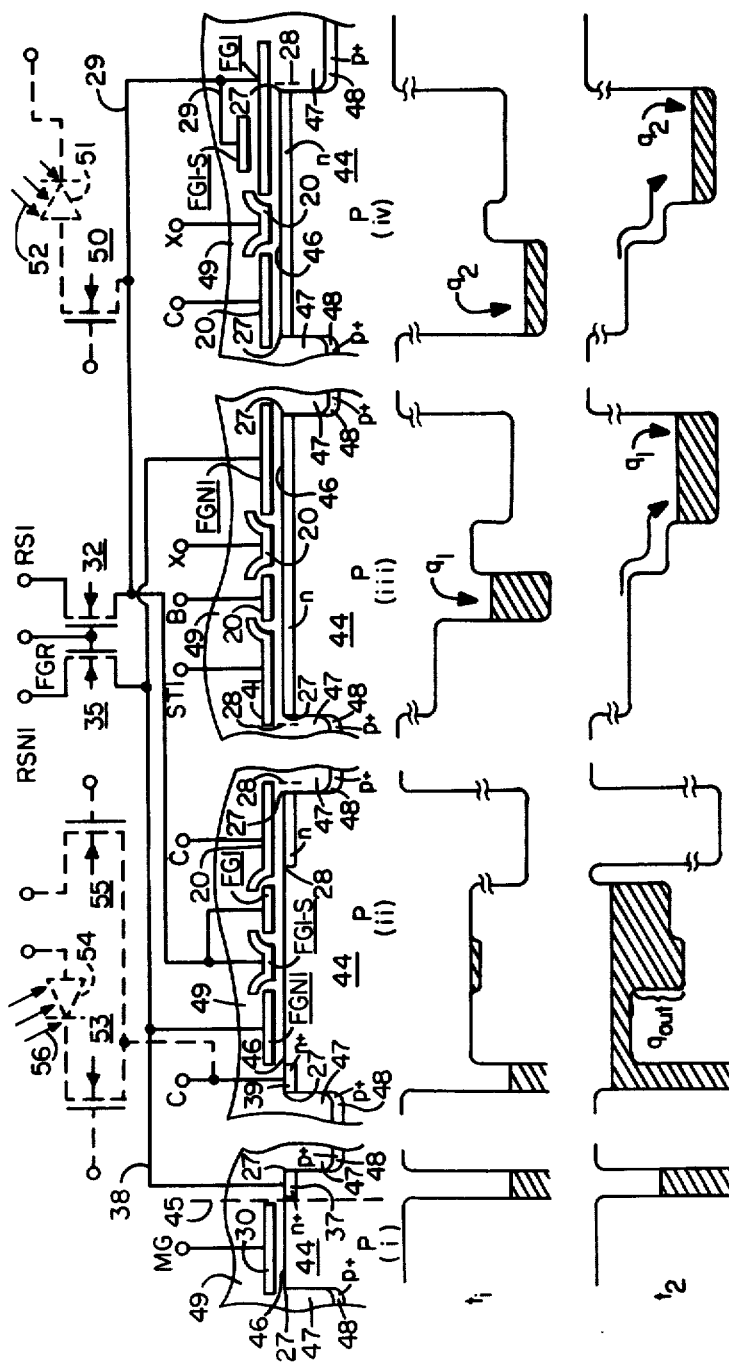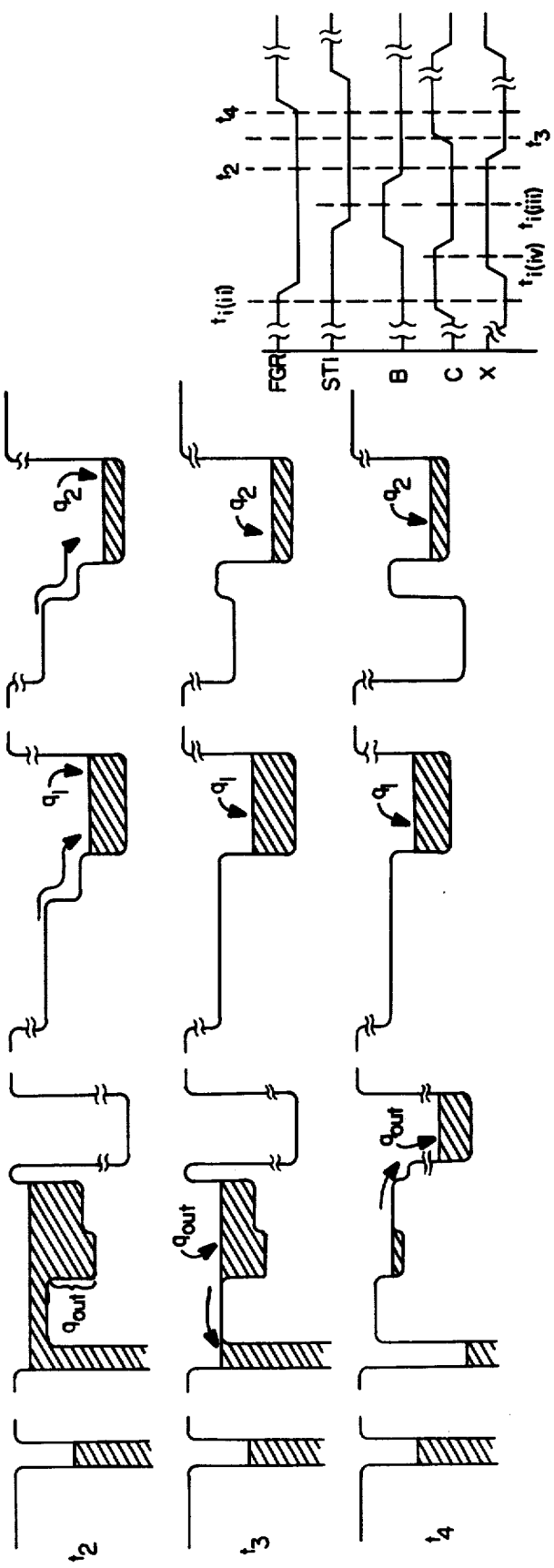
FIG 4

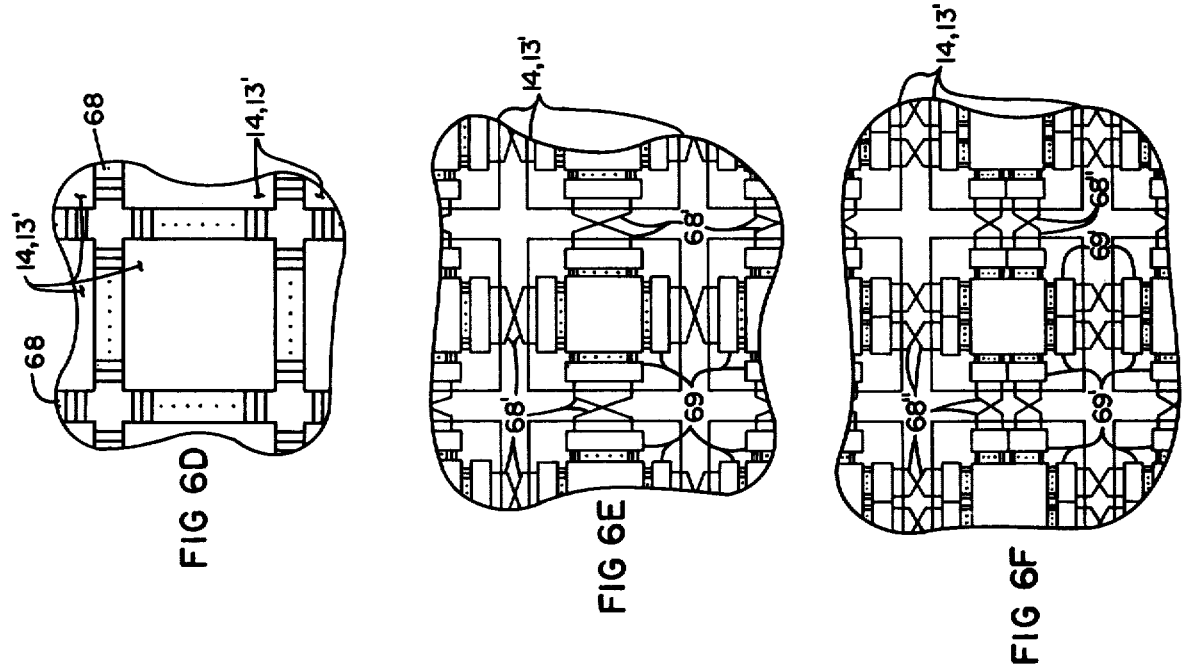
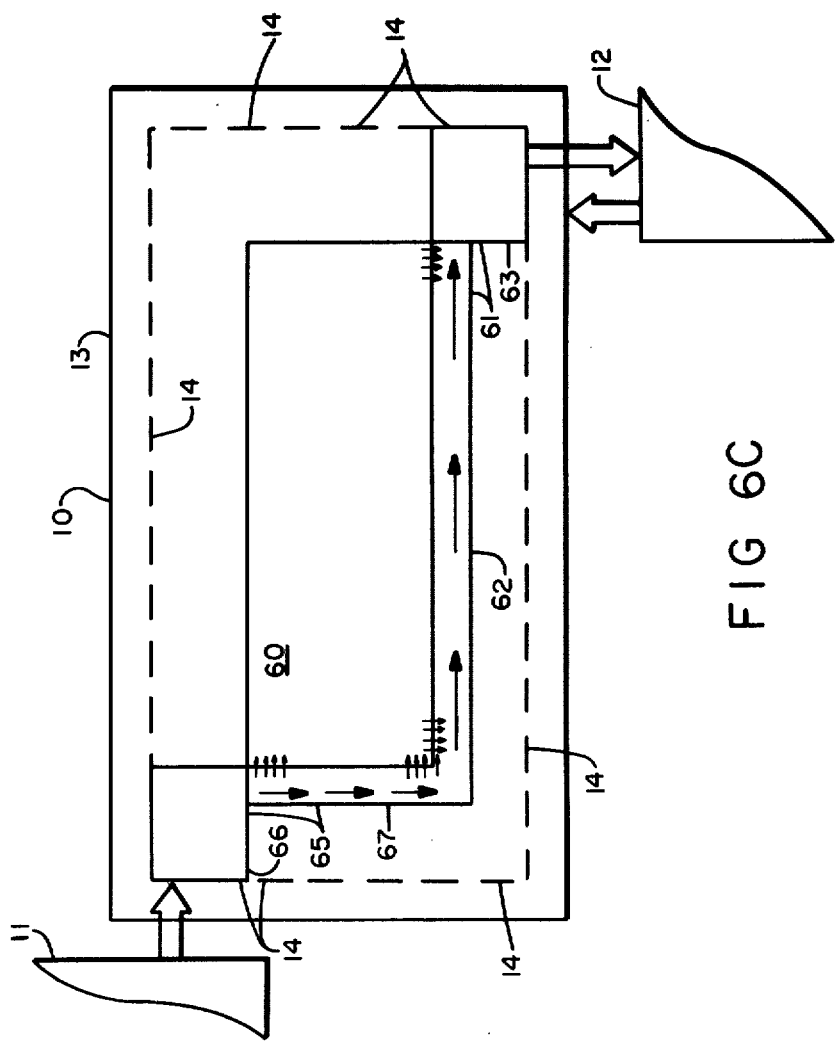

(I/O)

(SR)

(SL)

(SD)

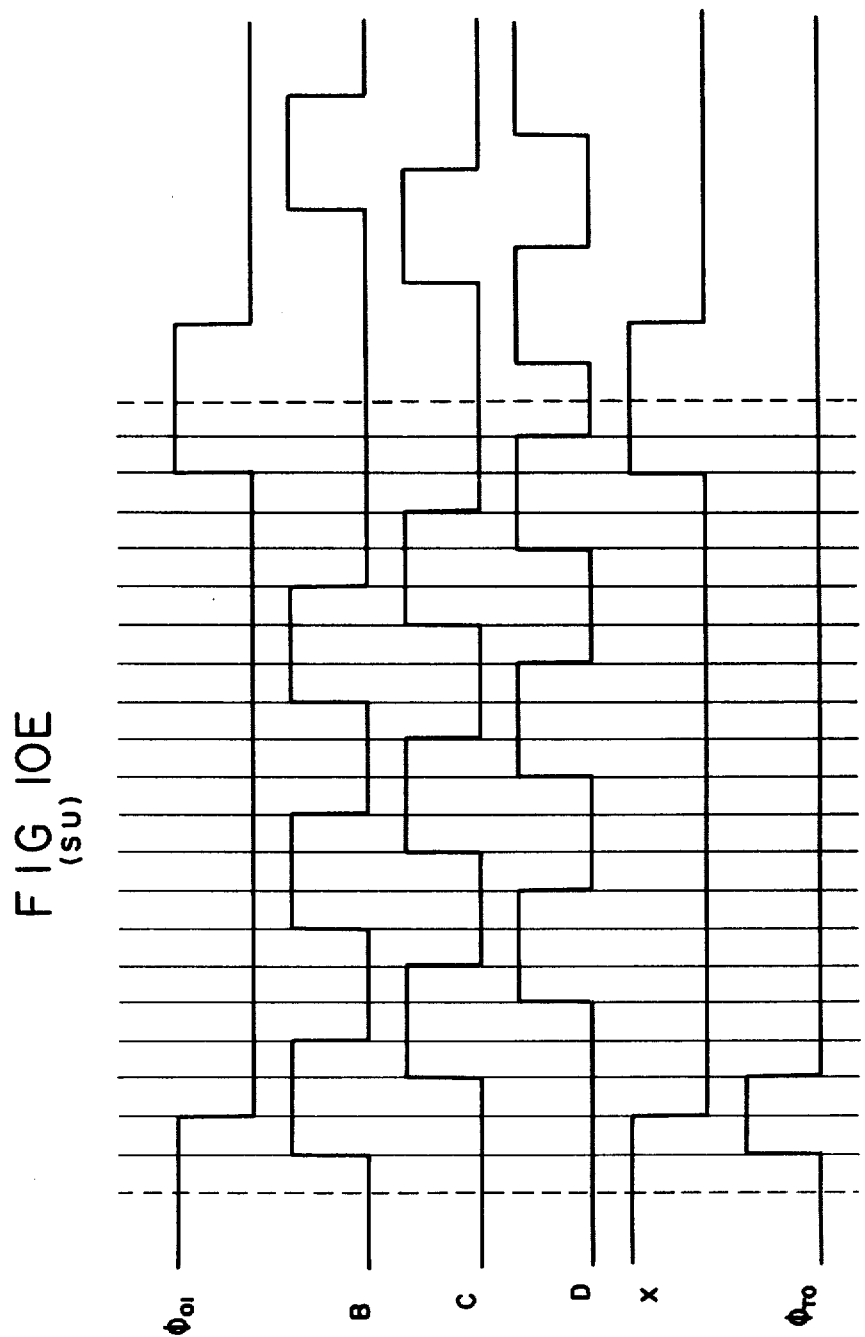

(L1)

(L2)

(L3)

(RI=STI×MG)

(R 2)

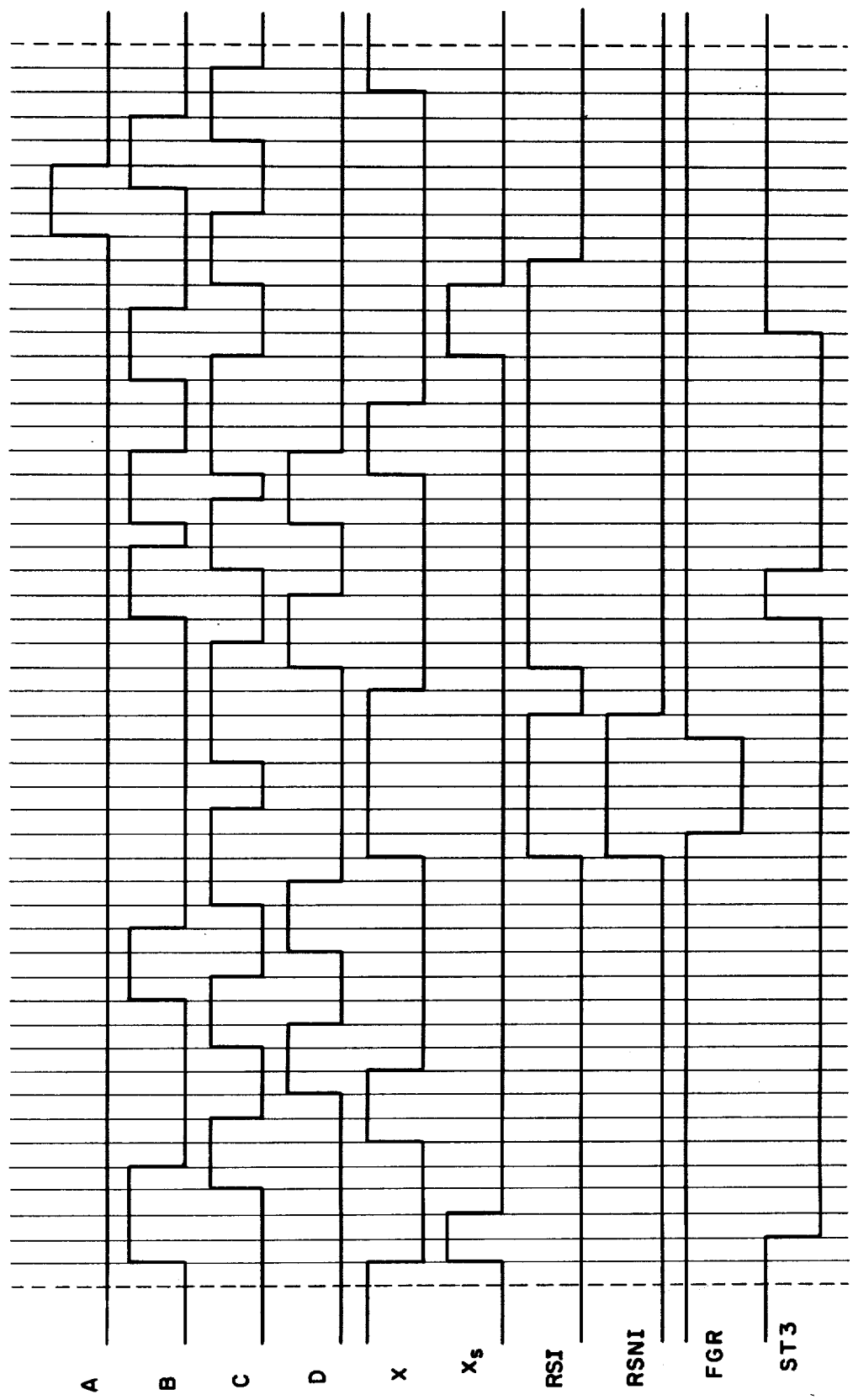
FIG. 10K (R3)

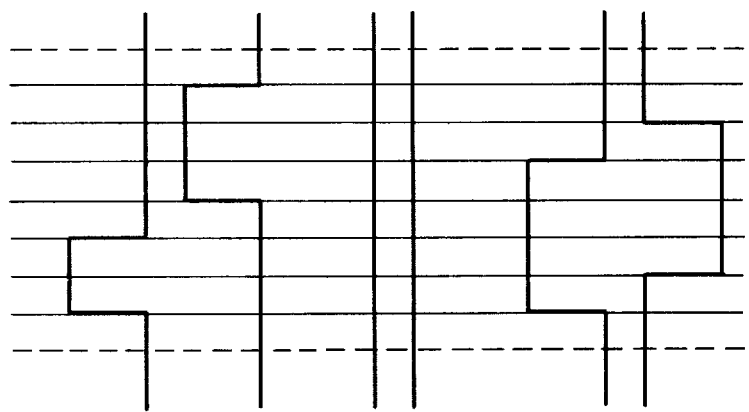
FIG. 10N (U3)
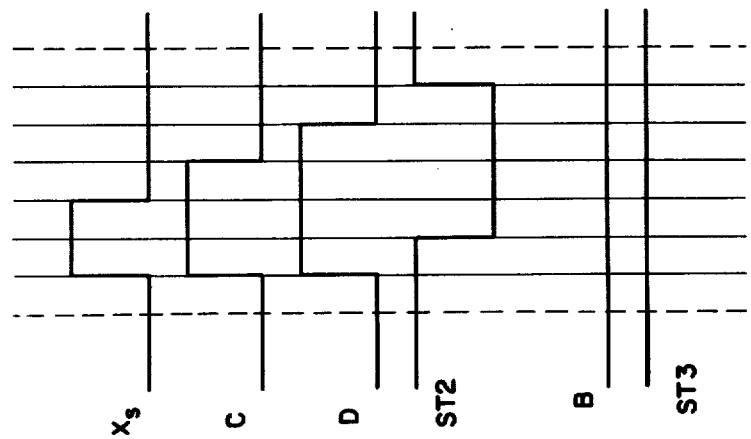
FIG. 10M (U2)
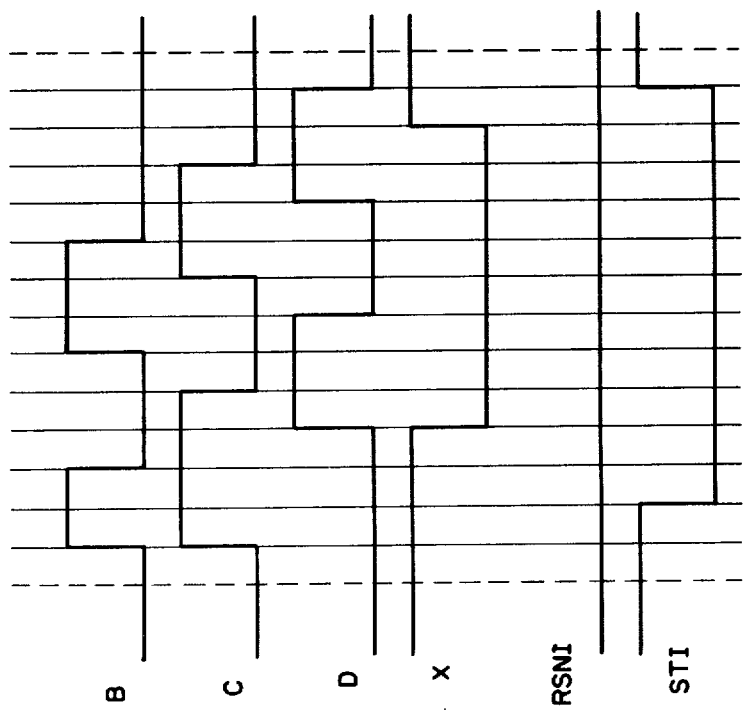
FIG. 10L (U1)

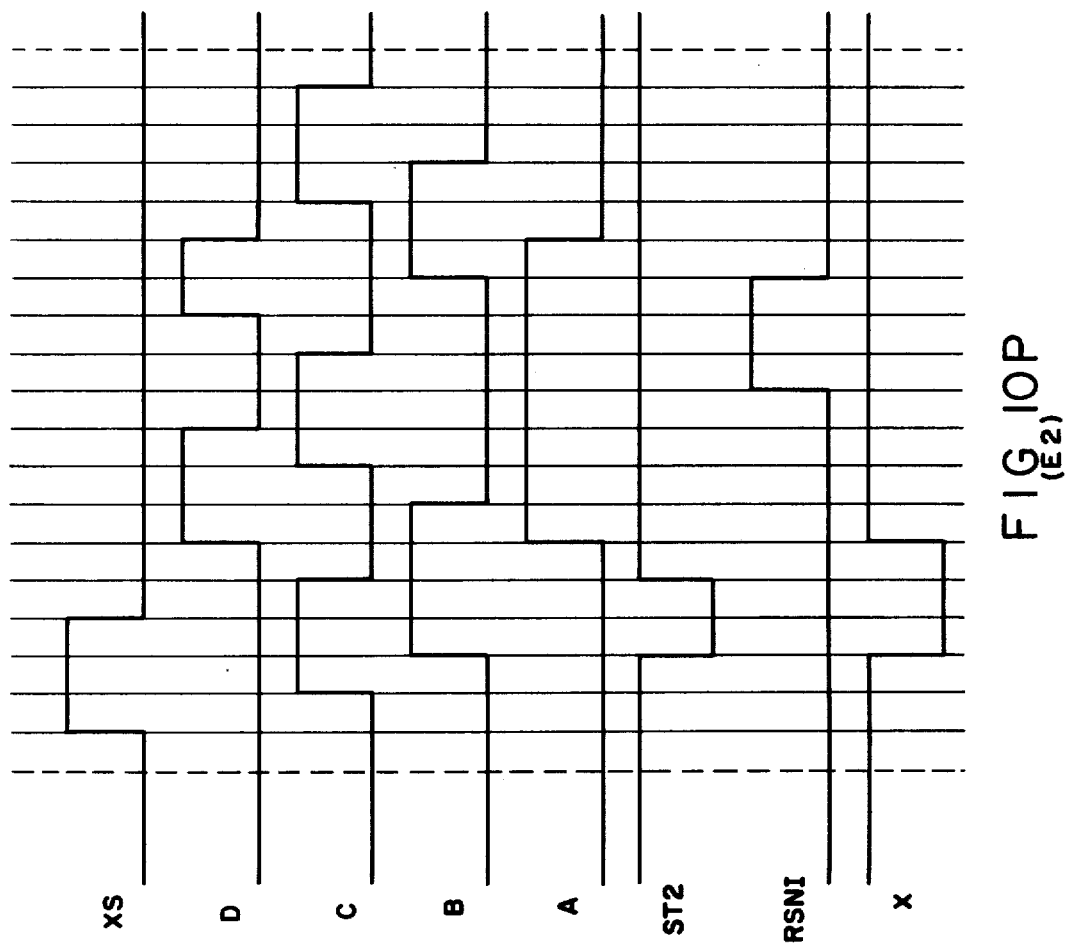
FIG. 10P (E2)
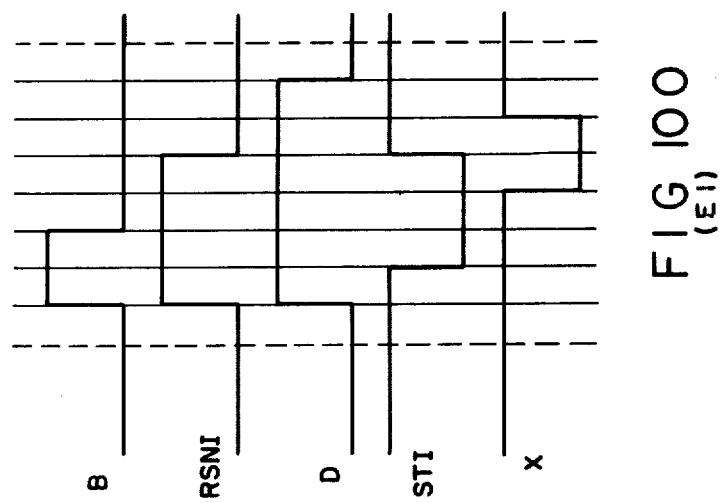
FIG. 10O (E1)

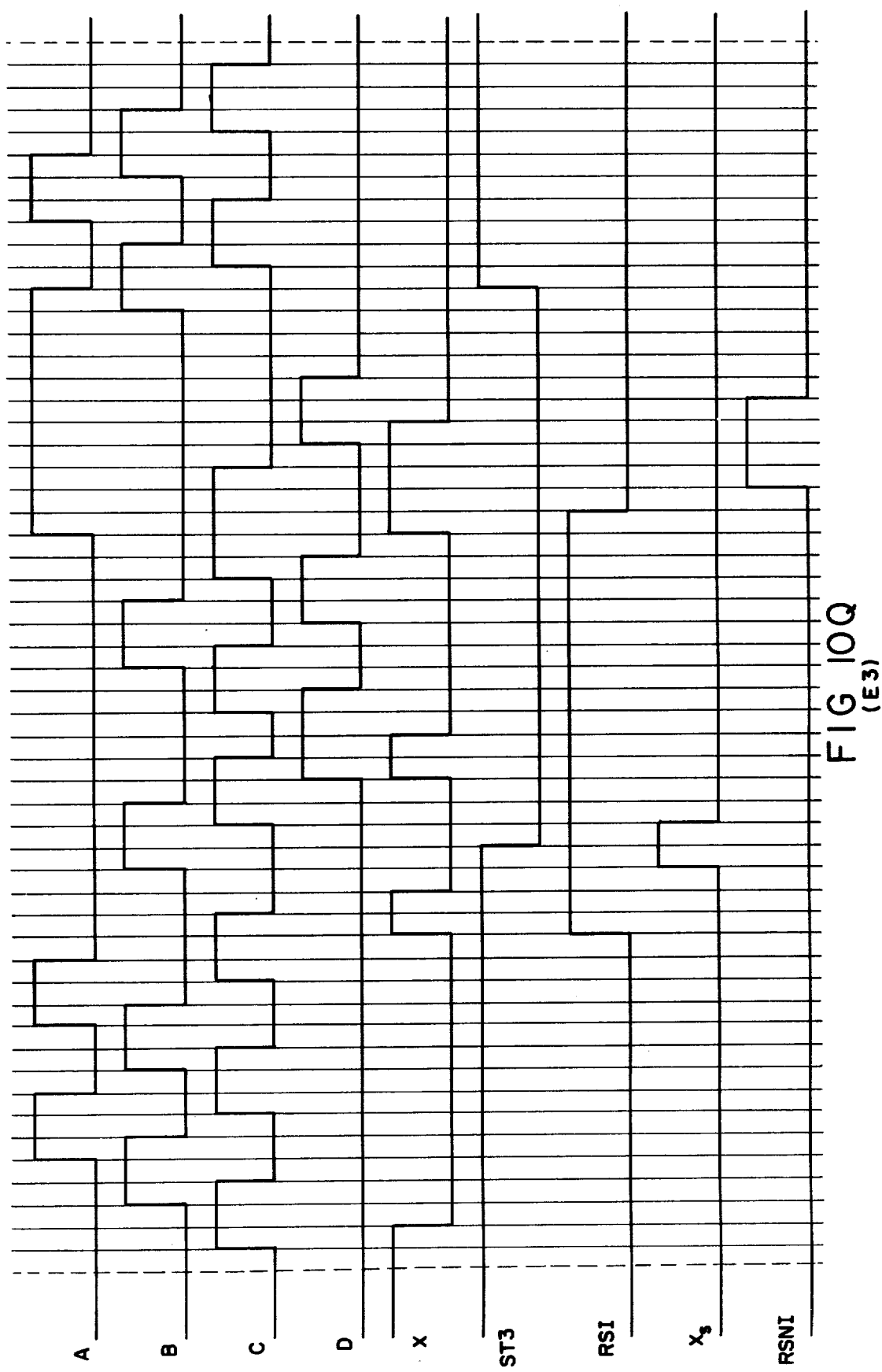
FIG. 10Q (E3)

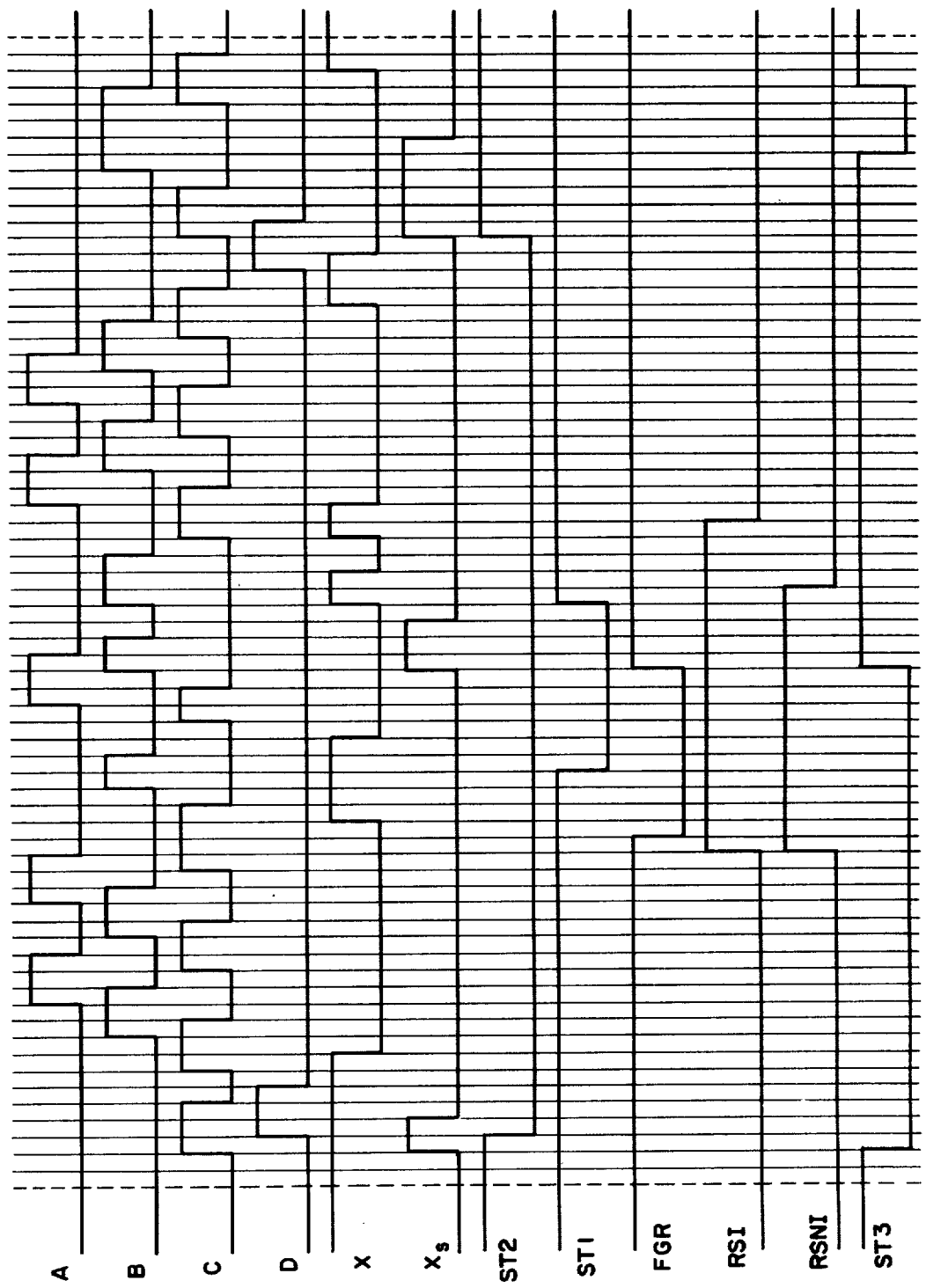
FIG. IOR (M2)

INTEGRATED CELLULAR ARRAY PARALLEL PROCESSOR

BACKGROUND OF THE INVENTION

The present invention relates to electronic signal processing circuits for processing a plurality of signals concurrently, and more particularly, to a monolithic integrated circuit capable of processing concurrently such a plurality of signals formed as discrete data samples through manipulating such data samples and entities derived therefrom in accord with selected algorithms.

There are various systems requiring therein the manipulation of information and in which additional information is acquired from a multiplicity of information sources operating concurrently. The information acquired from each of these sources may constitute a separate signal from each source resulting in the number of signals for processing being equal to the number of concurrently operating sources present or, in some cases, the information from some of the sources may be somehow grouped yielding a reduced number of information signals for manipulation.

A common system of this nature is an image processing system in which an image of some scene of interest is provided on a sensing surface, this surface comprising of a number of individual radiation detectors to each indicate the amount of radiation occurring in that part of the image falling on that radiation detector. Such radiation may be electromagnetic in the visible light portion or infared portion of the spectrum, for instance, and the radiation detector would then be a photodetector. Typically, each radiation detector provides a voltage or current output signal over time which contains the information as to the amount of electromagnetic radiation falling on that photodetector over time. So, the signals of all the photodetectors taken together carry the information as to what radiation amount is occurring in the image portions falling across all those photodetectors at each point in time during which the image is provided on these photodetectors. This is equivalent to stating that these photodetector voltage, or current, output signals carry (i) the information as to what is in the field of view available to the system at any instant of time as it is reduced to an image by other portions of the system, and the (ii) information as to the changes occurring within this field of view over time.

As a result, the information in these photodetector output signals concerning the system field of view over time are often desired to be processed (i) to improve the image effectively obtained therefrom by removing unwanted aspects therefrom due to any system limitations or due to any adverse viewing conditions, or by making more prominent some of the features therein, or the processing is desired (ii) to provide a set of signals containing more specific information derived from features or occurrences in the system field of view. Thus, some of the goals of such signal processing can be to provide image feature enhancement, to provide reductions in the bandwidth of the signals carrying the image information, to find which portions of the features in the image are due to various parts of the electromagnetic radiation spectrum, to provide image feature cueing by feature type, to provide image feature motion detection and tracking thereof, etc.

A number of signal processing algorithms have been found which can be used to provide such image improvement or image information derivation. These algorithms are, in turn, a series of steps where each step is some basic mathematical or logical operation. If the information in the radiation detector signals is sampled so as to provide a discrete time or sampled data signal, these mathematical operations can be performed as a series of arithmetical and logic steps. Thus, a suitable signal processor must be able to perform a series of mathematical operations, and in the case of discrete time or sample data systems, these operations to be performed by such a signal processor will be a series of arithmetical or logic steps or both.

However, the amount of information contained in a set of signals obtained from a number of concurrently operating information sources, such as photodetectors in an optical image sensor, can be very great over some period of time. In an image sensor, for instance, there may be thousands of separate radiation detectors each providing an output signal which may lead to on the order of thirty million data samples in a second, or more, being provided by the image sensor. Furthermore, the use of various signal processing algorithms to manipulate this image sensor data to provide desired image improvements or to derive information, or both, can lead to requiring on the order of between five hundred million and a billion basic arithmetical or logic steps each second in the signal processor.

Providing these many basic operations in a second by use of a conventional digital computer as the signal processor, operating in serial fashion on the radiation detector signals, one after the other, is very difficult without resort to a large and expensive, very rapidly operating digital computer arrangement. Such computers are available for some purposes, but are quite impractical in many signal processing circumstances. For instance, an image sensor and signal processing system for operation in a space satellite or in an airplane must be small in size and low in power consumption while still providing substantial signal processing capability at a reasonable cost. Also, to yield a reasonably useful and effective overall system at a reasonable system cost, the signal processor portion of a system must often be capable of being directed to perform a changing set of algorithms as the applications for the system in question change and as the technology of signal processing advances.

An alternative manner in which to process such a set of signals at the required rates, and yet reduce the rapidity that a signal processor must perform any one basic arithmetical or logic operation, is to operate on the signals from the radiation detectors concurrently, i.e. in parallel, rather than acting on the signals one after the other in serial fashion. If done in a conventional digital computer arrangement provided to serve as the signal processor, this processing manner can reduce the capability required in an individual computer in the arrangement from that required of a digital computer operating on the signals in serial fashion, but this processing manner also increases the number of digital computers required to the point of one digital computer for each radiation detector signal or for each small group of such signals. Thus, while the capability requirement for each conventional digital computer in performing basic operations is eased in this manner, the power consumption, cost and size of a signal processor comprising such an arrangement of conventional digital computers is likely to substantially increase. Thus, a desirable signal processor would have a capability of processing the information source signals concurrently, but without requiring undue power consumption, cost or size.

SUMMARY OF THE INVENTION

The invention provides a monolithic integrated circuit, capable of concurrently processing signals obtained from concurrently operating information sources, in which each such signal in some form is provided to a corresponding signal processing cell in the integrated circuit where these cells can each communicate with its nearest neighbors. Each such signal processing cell is capable of certain basic arithmetical or logic operations, or both, and they can all be directed in parallel to perform selected ones, or sequences, of such operations.

The information source signal can be obtained in the form of discrete time data samples during processing. These data samples may each be represented as distinct charge aggregations which are selectively operated upon by the plurality of signal processing cells where such cells can interact with one another through an intercellular communication mesh formed by charge-transfer devices. At least one such processing cell will have such charge-transfer devices substantially surrounding all sides thereof to permit interaction with signal processing cell neighbors on any side thereof. Such charge-transfer devices are typically charge-coupled devices. Such a signal processing cell can be based on a charge-coupled device floating gate regenerator. The data samples from the concurrently operating information sources may enter each signal processing cell directly from such a source or through a multiplexing-demultiplexing arrangement where some portions of the arrangement can be included on the monolithic integrated chip.

BRIEF DESCRIPTION OF THE DRAWINGS

FIG. 1 is a schematic diagram representing system aspects of the present invention, FIG. 3 is a representational layout of a monolithic integrated circuit chip portion embodying an aspect of the present invention, FIG. 4 is a cross section of portions of the monolithic integrated circuit chip portion of FIG. 3 and an illustration of an operational sequence associated with those cross sections.

DESCRIPTION OF THE PREFERRED EMBODIMENTS

Figure 2A:
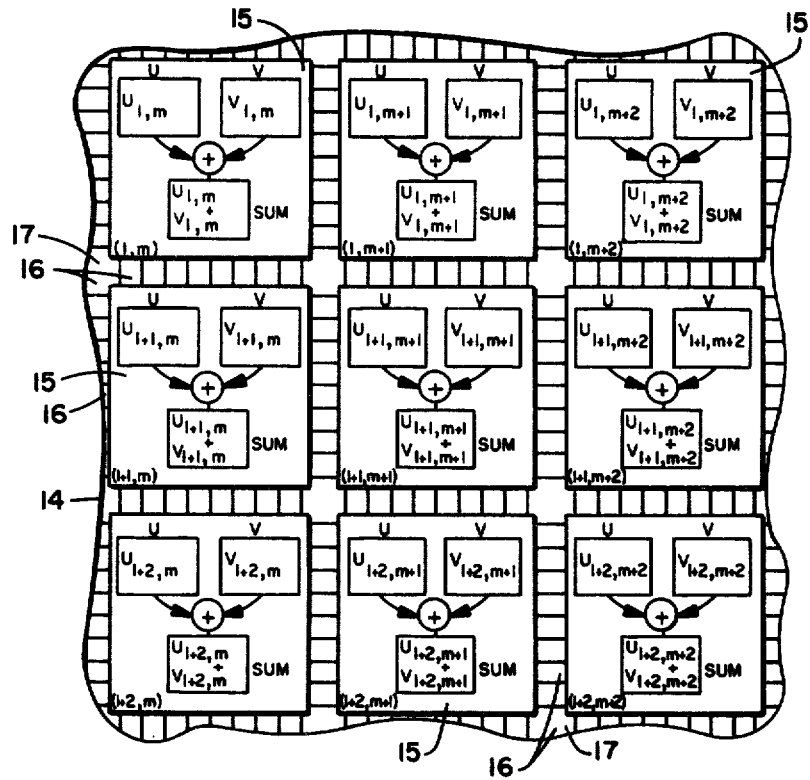
FIGS. 2A, 2B and 2C are illustrations of selected parallel processing operations.

A portion of a parallel signal processor, 10, is shown in FIG. 1 which can perform a number of arithmetical or logic operations concurrently, i.e. in parallel, on a plurality of input signals each obtained from output signals of a plurality of concurrently operating information sources. The acquisition of such input signals occurs through an information acquisition means, 11, shown separate from processor 10, though not necessarily separated in practice, where communication between processor 10 and means 11 is represented by a block-form arrow indicating provision of such input signals to parallel processor 10. Parallel processor 10, being a monolithic integrated circuit, can inherently be fabricated relatively inexpensively while being of small size and, by proper technology choice, can use relatively little power during operation. Furthermore, parallel processor 10 can be directed by system control means, 12, to provide a selectable sequence of a selectable number of arithmetical or logic operations, or both, to be performed upon the input signals to processor 10 derived from the concurrently operating information sources in means 11. Thus, the system of FIG. 2 including parallel processor 10 can perform whatever algorithms are desired by the system operator. Results of such signal processing operations can be passed on to system control means 12 for display purposes, control purposes, etc.

While information acquisition means 11 and system control means 12 are shown in FIG. 1 as portions of representative functional blocks, signal processor 10 is shown in FIG. 1 in somewhat more detailed, but still fairly abstract, representation of a portion of a monolithic integrated circuit chip housed in a portion of a chip package, 13. This portion of package 13 is shown partially broken away to reveal a monolithic integrated circuit chip, 14, inside. Although the scale of the drawing is too small to reveal the complete details of chip 14, some general features of the chip can be seen in FIG. 1. The metallization interconnection system between the various portions of the chip, and certain other interconnections, have been eliminated for purposes of clarity except for some termination electrodes.

The pattern displayed on chip portion 14 in FIG. 1 is that of a number of signal processing cells, 15, placed in the openings of an intercellular communication mesh, 16, so that each complete cell seen is substantially surrounded by the structural component links of the mesh which are formed as charge-transfer devices. Though cells 15 are shown to be rectangular in outline, and so fitting into rectangular openings in mesh 16, they need not be but can rather be any geometric shape convenient to the signal processing structure in the cells or convenient for providing mesh 16, or both. The charge-transfer device links of mesh 16 are charge-coupled devices which extend between the intersections, 17, at the corners of each signal processing cell 15 where a charge packet, i.e. a distinct charge aggregation having a quantity of charge representing a value, after translating along a charge-coupled device to an intersection 17, can at such an intersection be transferred from one charge-coupled device to another.

Each signal processing cell 15 in FIG. 1 can transfer charge packets within it from one portion thereof to another, and can perform arithmetical or logical operations, or both, on such charge packets to thereby accomplish performance of desired signal processing algorithms through performing sequences of such operations with respect to charge packets provided within the signal processing cell. Such sequences of operations lead to resultant charge packets differing by some specified relationship from the charge packets earlier received by the cell, which earlier received charge packets will, in some cases, be the original data samples obtained from the signals of the concurrently operating information sources.

Each signal cell 15 in FIG. 1 can also receive charge packets from, and transfer charge packets to, certain of the charge-coupled device links adjacent thereto in intercellular communication mesh 16 thereby permitting transfer of charge packets from one signal processing cell to another. This transfer capability in turn permits further operations to be performed on such transferred charge packets at the destination signal processing cell.

Thus, a selected sequence of such arithmetical or logic operations, or both, can be performed in the system of FIG. 1 to thereby permit use of chosen algorithms. These algorithms, comprising such sequences of operations, serve as the specifications for the manipulation of signals derived from concurrently operating information sources to accomplish the goals of such algorithms. The sequences of such arithmetical or logical operations can be selected through system control means 12 so that alternative algorithms, or a series of algorithms, can be performed on such data as a matter of choice to satisfy the desires of the system operator.

Figure 2B:
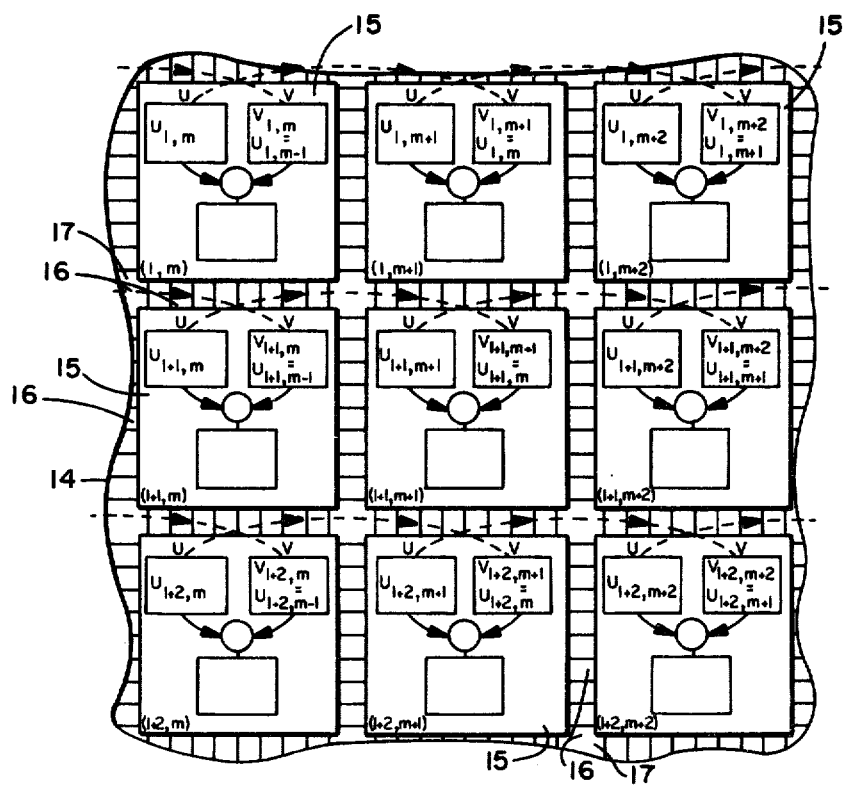
Figure 2C:
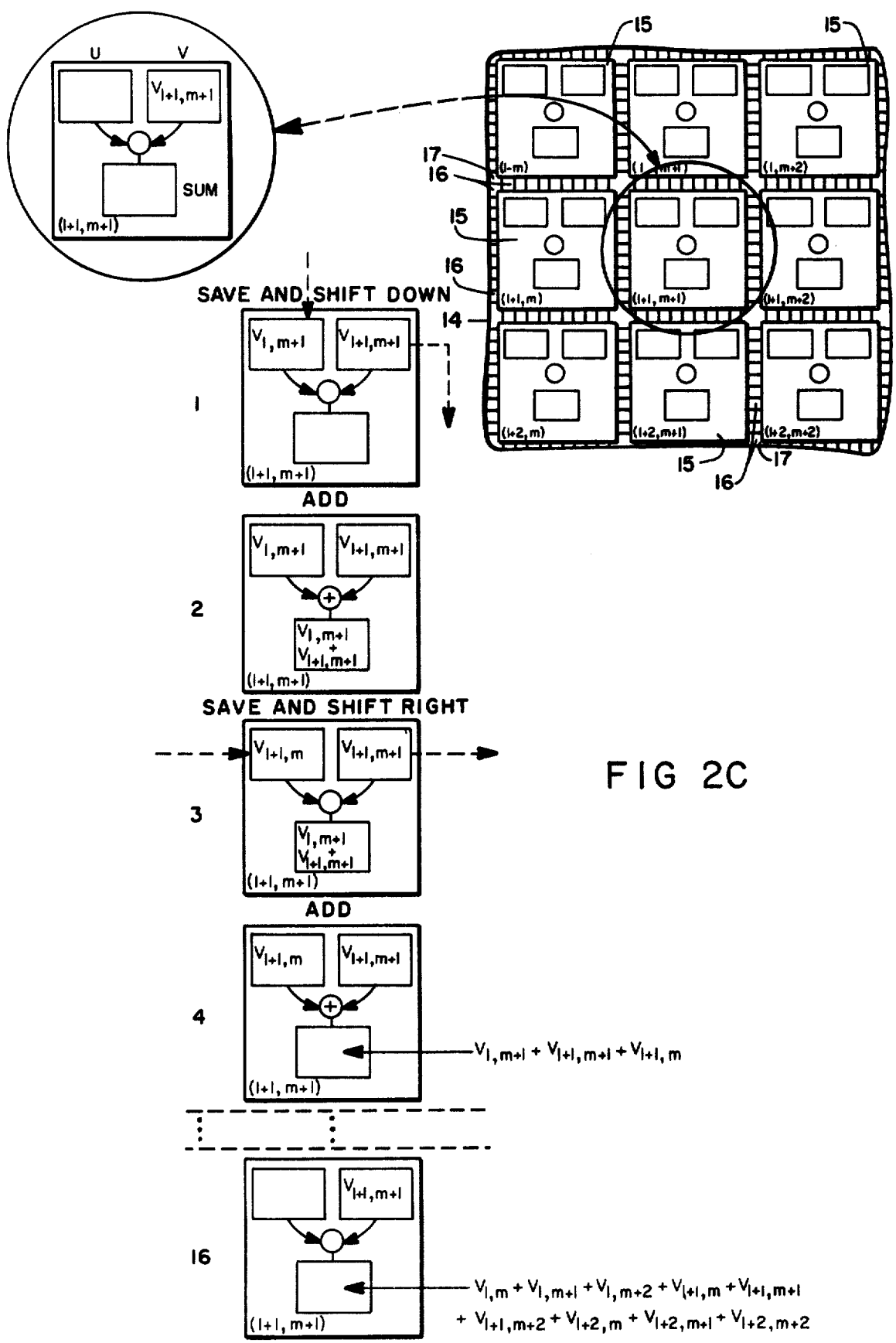

Some examples are shown in FIGS. 2A, 2B and 2C of the kinds of arithmetical and logical operations which can be performed by the system of FIG. 1 concurrently, i.e. in parallel, on representative charge packets earlier provided to each signal processing cell 15 shown. FIG. 2A depicts a parallel addition process, and this is shown in FIG. 2 taking place in part in a portion of chip 14, from FIG. 1. However, this portion of chip 14 is shown in FIG. 2 in a more abstract representation insofar as signal processing cells 15 are concerned as opposed to the representation shown therefor in FIG. 1.

Shown in FIG. 2A are signal processing cells 15 designated by a pair of numbers, the first cell to the upper left being designated by (1,m), the next cell in the same row being designated (1,m+1), etc. Each of signal processing cells 15 is shown to have three storage sites designated U, V, and SUM. Furthermore, each cell 15 is shown to have a summing mechanism represented by a plus sign inside a circle. Storage site U in each signal processing cell is indicated to have a charge packet therein of a charge quantity generally designated as $U_{j,k}$; in particular, there is charge quantity $U_{1,m}$ located in storage site U of the signal processing cell 15 designated (1,m), etc. Similarly, each storage site V in each signal processing cell 15 is indicated generally to have a quantity of charge $V_{j,k}$ which, in the signal processing cell designated (1,m), is equal to $V_{1,m}$, etc.

Upon application of proper directing signals to each of signal processing cells 15 in FIG. 2A, the summing mechanism provides a charge packet at storage site SUM equal to the sum of the charges stored at storage site U and at storage site V in each signal processing cell. The result for the signal processing cell designated (1,m) is $U_{1,m}+V_{1,m}$. These summing functions for each cell are performed concurrently so that if there are a thousand signal processing cells 15 in chip 14, a thousand additions are made in the same amount of time required to make any one of those additions.

FIG. 2B depicts parallel right shifts from one signal processing cell to another signal processing cell. Again, there is shown in FIG. 2B a portion of chip 14 of FIG. 1 but with signal processing cells 15 being presented again in a more abstract manner. Signal processing cells 15 are again designated by the notation (j,k) in general with the cell in the upper left-hand corner of 2B being designated in particular by the notation (1,m), etc. Each cell is shown again with storage sites U and V having charge packets therein of charge quantities generally designated $U_{j,k}$ and $V_{j,k}$. The operation circle is shown with a blank interior since no internal cell operation is planned here.

Dashed line arrows show the paths followed by the charge packet transfers during the right shift operation where a charge packet is transferred out of storage site $U_{j,k}$ of each signal processing cell 15, and then horizontally along the charge-coupled devices of intercellular communication mesh 16 through an intersection 17, and then into storage site $V_{j,k+1}$ of an adjacent signal processing cell (j,k+1) to the immediate right of the originating processing cell (j,k). The general result is that a charge packet is stored at a destination cell V storage site of a quantity $V_{j,k+1}$, which is equal to the charge in the transferred charge packet of quantity $U_{j,k}$. This is indicated for each of the signal processing cells shown in FIG. 2B. Again, where chip 14 has a thousand signal processing cells 15, a thousand right-hand shifts can be made in the time required for any one such shift.

Thus, FIG. 2A illustrates the performance of an arithmetical operation on charge packets contained within each signal processing cell 15, and FIG. 2B illustrates a communication operation between adjacent signal processing cells to transfer charge packets from one to another. Such basic signal processing operations can be performed in series in a sequence of such basic signal processing operations to implement algorithms as indicated above. FIG. 2C depicts a portion of such a sequence of signal processing operations, a sequence portion which is common to all discrete time convolution signal processing operations. Such a complex signal processing operation is often part of an algorithm used in manipulating data samples in the form of charge packets taken from the signals provided by concurrently operating information sources.

The operation illustrated in FIG. 2C serves to compute the sum of charge packets residing in the eight immediately neighboring signal processing cells of each of the signal processing cells provided in chip 14 (perhaps not of cells at the edge of the cell array). The resulting nine component sum is computed at each of these signal processing cells by combining repeated shifting-from-neighboring-cell-operations each followed by an addition operation. Considering this operation in more detail at cell (1+1,m+1) in FIG. 2C, a charge packet is transferred to cell (1+1,m+1) in turn from each signal processing cell neighbor thereof, and then added to the charge already accumulated in signal processing cell (1+1,m+1) from earlier provided, or shifted-in, charge packets. Since there are eight immediately neighboring signal processing cells to cell (1+1,m+1), there are required to be eight separate shifting operations transferring a charge packet from each of the neighboring signal processing cells in turn to signal processing cell (1+1,m+1). Once transferred, the charge from the incoming charge packet is added to the charge already accumulated in cell (1+1,m+1). Therefore, eight shifting steps and eight addition steps are required to provide a total of sixteen steps being needed to provide the nine component sum appearing in signal processing cell (1+1,m+1) in FIG. 2C at the conclusion of this sequence of operations.

Far more sophisticated operations may be performed by combining a variety of basic arithmetical or logical operations, or both, which can be performed by signal processing cells 15 coupled with various transferring steps between such cells. Many well known relatively complex signal operations can be performed by the arrangement shown on chip 14 of FIG. 1 for signal processing cells 15 having the capabilities set out below. Such relatively complex signal processing operations include the Sobel operator, the threshold operator, the correlation operator, etc. Such relatively complex signal processing operations are sometimes sufficient themselves as algorithms for the desired manipulation of the data samples obtained from the output signals of the concurrently operating information sources in means 11 of FIG. 1, and at other times these relatively complex operations are combined to provide still more complex algorithmic schemes.

A more detailed presentation is made in FIGS. 3 and 4 of a portion of monolithic integrated circuit chip 14 of FIG. 1 to indicate the capabilities, though not exhausting those capabilities possible to be provided in signal processing cells 15, and indicating the relationship between these cells and intercellular communication mesh 16. FIG. 3 shows a broken out portion of chip 14 which includes a complete signal processing cell 15 and a surrounding portion of intercellular communication mesh 16. As stated above, the charge-coupled device links of intercellular communication mesh 16 meet at intersections 17, which are also formed as charge-coupled device gates, and which serve to transfer a charge packet coming under such an intersection gate from an adjacent charge-coupled device link in mesh 16 to any of the charge-coupled device links in mesh 16 adjacent to that intersection 17. Portions of other signal processing cells 15, neighboring that particular signal processing cell 15 presented in its entirety in FIG. 3, can also be seen in that figure.

Each structural component link of mesh 16 between intersections 17 is a charge-coupled device operating on three clocking, or control, signal phases supplied to doped, polycrystalline silicon gates, 20. These doped, polycrystalline silicon, i.e., polysilicon, gates are applied in two separate polysilicon depositions such that gates formed from the second deposition slightly overlap the edges of gates formed from the first polysilicon deposition though, even in so overlapping, they are separated from one another by an insulating layer which is conveniently silicon dioxide. Thus, gates 20 should be represented in FIG. 3 in such a manner that there would be a dashed line, representing the edges of first deposition polysilicon gates, appearing underneath the second polysilicon gates just inside the edges of these gates. Such detail, however, has been omitted in FIG. 3 to avoid drawing complexity that is unnecessary for understanding, these omissions being made for purposes of clarity as have some other feature details.

Other measures have been taken in FIG. 3 to ease understanding. In particular, none of the metallization interconnection system portions have been shown, again for clarity because they would obscure that which lay below without much benefit to the ensuing explanation. That is, a number of the regions in FIG. 3 are electrically interconnected using metallic interconnection runs provided from a metallization deposition. Moreover, polysilicon, in both the first and second depositions thereof, is also used for certain electrical interconnections which in many instances have not been shown in FIG. 3 to improve clarity by avoiding complexity where it is of no particular aid to the description following. Furthermore, for consistency, all of the lines shown in FIG. 3 should be dashed in view of there being a protective insulating layer thereover, but this would make drawing understanding much more difficult and so has not been done. These omitted features are well known to those skilled in the art and can be provided by such persons without substantial difficulty. So, in the interest of providing a view of a portion of chip 14 which can be more easily understood, these omissions and other slight abstractions have been used.

To differentiate among gates 20 in FIG. 3, and among other polysilicon gates therein, crosshatching in the form of a series of same direction diagonals, having the lower portion thereof on the left and rising to the higher portion thereof on the right, is used to denote polysilicon gates obtained from the first polysilicon deposition. The gates obtained from the second polysilicon deposition are shown by a series of opposite, but common, direction diagonals: higher portions thereof on the left and lower portions thereof on the right. Thus, for example, intersections 17 are all obtained from the second polysilicon deposition while all of the gates immediately adjacent to each of intersections 17 are obtained from the first polysilicon deposition. In those situations in FIG. 3 where a structure obtained from the second polysilicon deposition is provided over a structure obtained from the first polysilicon deposition, just the beginnings of diagonals running in each direction are shown along the second polysilicon deposition structure to indicate that it is over a first polysilicon deposition structure.

The charge-coupled device links of mesh 16 between intersections 17 are, as above indicated, three phase charge-coupled devices. Designations of the clocking signals, or control signals, which are supplied to each polysilicon gate in FIG. 3 (and similarly to other polysilicon gates in chip 14 exceed gates intended to "float" at indirectly set potentials in some periods during operation) have been marked thereon in FIG. 3 in capital letters. The clocking signals for gates 20 can be seen to be provided thereto in a repetitive three signal sequence corresponding to three phase operation. Horizontal portions of mesh 16 are operated by the clocking signals A, B and C, while the vertical portions of mesh 16 are operated by the clocking signals B, C and D.

Assume that a charge packet is stored under any one of the gates 20 in mesh 16 by there being a positive voltage applied thereto and a much smaller positive voltage or no voltage being applied to the gates on either side thereof. Assume that there is a desire to shift this charge packet held under the gate having the relatively large positive voltage thereon to an immediately adjacent gate in the charge-coupled device on one side or the other of the gate presently storing the charge packet. The adjacent gate under which the charge packet is desired to be shifted is provided with a large positive voltage and, very shortly thereafter, the gate originally storing the charge packet has the large positive voltage thereon substantially reduced or made equal to zero. The gates having the third clocking signal applied thereto are kept a low or zero voltage during this sequence. As a result, the charge packet will shift under the gate now having the large positive voltage provided thereon and remain there until further directions to mesh 16 are provided in the form of changes in the clocking or control signals provided thereto.

This method in general of transferring charge packets is suitable even when one of the gates is either the initially storing gate or the adjacent gate intended to receive such a charge packet, and is also a gate at an intersection 17 where the clocking or control signal provided thereto is indicated in FIG. 3 to be denoted by X. Again, this method of transferring charge packets is also suitable for transferring charge packets into and out of signal processing cells 15 at one of the five entrance-exit ports provided in each: (i) port 21 located in the upper left-hand portion in each signal processing cell 15 comprising (a) that one of the gates 20 having clock signal C applied thereto adjacent to an extension of the gate at an intersection 17 having clock signal X applied thereto, and (b) this gate extension; (ii) port 22 located in the upper middle portion of each signal processing cell 15 comprising (a) that one of gates 20 having clock signal C applied thereto adjacent to a floating gate designated FGI, and (b) floating gate FGI; (iii) port 23 located in the upper right-hand portion of each signal processing cell 15 comprising (a) that one of gates 20 having clock signal B applied thereto adjacent to a storage transfer gate, 24, having a clock signal XS applied thereto, and (b) storage transfer gate 24; (iv) port 25 also located in the upper right-hand portion of each signal processing cell 15 comprising (a) that one of gates 20 having clock signal C applied thereto adjacent to storage transfer gate 24, and (b) storage transfer gate 24; and (v) port 26 located in the middle right-hand portion of each signal processing cell 15 comprising (a) that one of gates 20 having clock signal C applied thereto adjacent another extension of the gate at another intersection 17, and (b) this gate extension.

A further measure undertaken to confine charge packets to being (i) under those of gates 20 intended, as indicated by the application thereto of relatively large positive voltages, or (ii) under other intended polysilicon gates within signal processing cells 15 with such intention again being communicated through use of control signals of relatively large positive voltage values being applied to such gates, is the provision of "channel stops" in chip 14. The edges or boundaries of such "channel stop" regions are indicated in FIG. 3 by the numerical designation 27. Channel stop boundaries 27 are shown there in short dashed lines but, in some places, these are difficult to follow because solid lines indicating other structural features occur immediately thereover.

The channel stop line 27, located primarily along the periphery of signal processing cells 15 with dips into cells 15 at ports 21, 22, 23, 25 and 26, forms a closed major loop with the interior of this loop enclosing, except in selected portions around which other channel stop lines 27 occur, a structure of relatively thick silicon dioxide over $p^+$-type conductivity silicon portions which in turn are over other portions of the p-type conductivity silicon substrate of chip 14. The just mentioned exception portions within the major loop are bounded by closed minor loops of lines 27 outside of which occurs the thick oxide structure just set out. Outside the major loop formed by channel stop lines 27, primarily along the periphery of signal processing cells 15 in mesh 16 and in the dips into signal processing cells 15 at the ports thereof with the exception of the dip at port 22, the structure is that of relatively thin silicon dioxide over n-type conductivity silicon portions which in turn are over other portions of the p-type conductivity silicon substrate. At port 22 the structure outside line 27 is that of thin silicon dioxide over the p-type conductivity silicon substrate.

The potential energy of electrons at $p^+$-type conductivity silicon portions under thick oxide is relatively high so as to make the attractiveness to electrons relatively low to thereby serve to confine the electrons in a charge packet to regions of the n-type or p-type semiconductor material silicon under the thin oxide region. The thin oxide regions are, of course, just those above which the polysilicon gates in FIG. 3 are provided. Thus, the (i) thick oxide regions, and (ii) the positive voltages on selected polysilicon gates over the thin oxide regions, are together such to keep the charge packets confined to being under those selected gates.

Further, as the above structural description indicates, the charge-coupled device links in intercellular communication mesh 16 and intersections 17 together form buried channel charge-coupled devices. The polysilicon gates and the structure therebelow of each signal processing cell 15 in chip 14 in FIG. 3, except the gates and structure associated with port 22, also operate as buried channel charge-coupled devices. The polysilicon gates and the structure therebelow in chip 14 at port 22 in FIG. 3 operate as a surface channel charge-coupled device with a transition through port 22 to the buried channel charge-coupled device adjacent in mesh 16. Buried channels for the buried channel charge-coupled devices are formed under the thin oxide portions along the channels provided by the channel stop boundaries through doping the material immediately under the thin oxide to be of n-type conductivity as indicated above. For the surface channel charge-coupled devices, the thin oxide in the channels formed by the channel stops is directly over the p-type conductivity silicon substrate.

A long dashed line, 28, forms a single closed loop in FIG. 3 at each cell 15 within which there no impurity doping occurs for converting the silicon substrate to n-type conductivity buried channel regions, but outside of which such impurity doping is undertaken everywhere to form buried channel regions beneath the thin oxide. Dashed line 28 is nearly completely covered by the edges of polysilicon gates in each signal processing cell 15 and in mesh 16 in FIG. 3 making it very difficult to determine the location of the regions which are subjected to the ion implantation doping used to form the buried channel regions. The actual buried channels, of course, are confined because of the fabrication process sequence to being beneath the thin oxide regions in the channels formed by the channel stop edges through which the implantation can reach the silicon semiconductor material below. The implantations cannot penetrate the thick oxide portions of the channel stop structure, and so do not change the silicon material portions below them from the $p^+$-type conductivity type provided during fabrication of the channel stop structures.

The primary gates for the charge-coupled device technology arrangements internal to each signal processing cell 15 are the two gates in the floating gate regenerator and the multiplier gate associated therewith. The floating gates of the floating gate regenerator in cells 15 in FIG. 3 are designated FGI for the inverting floating gate and FGNI for the non-inverting floating gate. Both of these gates are obtained from the first polysilicon deposition.

A further gate, a separating gate, is designated FGI-S and separates gates FGI and FGNI so that both of these gates will be overlapped by the separating gate. This assures that charge transfers can be made easily and smoothly between the inverting and non-inverting floating gates. However, separating gate FGI-S is electrically connected to inverting floating gate FGI so that both inverting floating gate FGI and the separating gate FGI-S are at the same electrical potential. Since any representation of the physical structures of metallization interconnections have been omitted from FIG. 3 for clarity, the electrical interconnection between inverting floating gate FGI and the separating gate FGI-S is shown by a solid line, 29, which occurs below port 21 in FIG. 3.

The interfaces between inverting floating gate FGI separating gate FGI-S, and non-inverting floating gate FGNI occur below port 22 in FIG. 3. The designations FGI, FGI-S and FGNI are set out in FIG. 3 with an underline beneath each of them to indicate that these are gate designations and not clocking or control signal designations.

A multiplier gate, 30, is also obtained from the first polysilicon deposition and is shown with the control signal MG marked thereon in FIG. 3. By adjusting the voltage level of signal MG, each signal cell 15 is capable of multiplying the charge quantity in a charge packet in the floating gate regenerator by a selected constant depending on the voltage level of signal MG as will be explained below.

Near these gate structures just mentioned within each signal processing cell 15 in FIG. 3 are a number of diffusions made through openings mentioned above in the channel stop structures indicated by channel stop structure edges 27 forming minor loops which are located entirely within each signal processing cell 15. These diffusions are shown in full crosshatching, i.e., shown with diagonals running in both directions. The first of these diffusions, 31, receives clocking signal RSI and serves as the drain of a first n-channel, metal-oxide-semiconductor field-effect transistor, 32, the remainder of which transistor is formed by a doped polysilicon gate, 33, obtained from the second polysilicon deposition and by a further diffusion, 34, serving as the source of transistor 32. The end of diffusion 34 away from gate 33 in transistor 32 is connected by metallization interconnection representational line 29 to inverting floating gate FGI and to separating gate FGI-S. Again, line 29 represents what would otherwise be a metal interconnection which, as above indicated, has not been shown for purposes of clarity.

Gate 33 of transistor 32 is provided with clocking or control signal FGR. Thus, signal RSI can be supplied to inverting floating gate FGI and separating gate FGI-S under the control of signal FGR. That is, signal FGR can switch transistor 32 from the "off condition" to the "on condition" to thereby supply clock signal RSI to inverting floating gate FGI and separating gate FGI-S. Switching back to the off condition removes signal RSI from these gates.

Silicon gate 33 also serves as a gate for a second n-channel, enhancement mode metal-oxide-semiconductor field-effect transistor, 35, comprising a drain diffusion, 36, to which is supplied clock signal RSNI, and a source diffusion, 37, as well as gate 33. The end of diffusion 37 away from gate 33 is electrically connected to non-inverting floating gate FGNI by metal interconnection represented in FIG. 3 by only a solid line, 38, again for purposes of clarity. Thus, clock signal FGR through controlling transistor 35 controls also the application of signal RSNI to non-inverting floating gate FGNI. Note also diffusion 37 is immediately adjacent to multiplier gate 30 and, as explained below, couples the effects of multiplier gate 30 to non-inverting floating gate FGNI for purposes of performing the multiplying-by-a-constant process to be explained below.

A further diffusion, 39, is provided immediately adjacent to non-inverting floating gate FGNI as a source of charge for this gate. The other end of diffusion 39 is brought out past multiplier gate 30 for the purposes of being connected into the metallization interconnection network to receive clocking, or control, signal C.

The other end of non-inverting gate FGNI is provided near a final diffusion, 40, which serves as a charge sink for emptying charge out from this end of non-inverting gate FGNI when permitted to do so by that one of gates 20 receiving clocking signal D and which has an extension thereof over the channel stop region between non-inverting floating gate FGNI and diffusion 40. Diffusion 40 is supplied with a constant voltage signal designated ARV as an accumulator reset voltage for purposes of attracting charge from non-inverting floating gate FGNI.

There are three storage sites based on charge-coupled device technology shown provided in each signal processing cell 15 in FIG. 3, and each of these storage sites has a polysilicon gate obtained from the second polysilicon deposition. The first of these storage sites has a gate 41 and can receive charge packets through port 26, through another arm of the extension of the gate at the corresponding one of intersections 17, and then through an extension of that one of gates 20 receiving clocking signal B which is immediately above the just mentioned intersection 17 gate in FIG. 3. Gate 41 receives clocking or control signal ST1 and, by the proper sequencing of signals on the gates involved in port 26 and on the extension of that gate just mentioned as receiving clocking signal B, a charge packet will be transferred from mesh 16 to being under this first storage gate 41. A reverse sequence of some of such signals permits a charge packet stored under gate 41 to be returned to mesh 16, or to be provided to non-inverting floating gate FGNI by shifting underneath the extension of the gate just mentioned as receiving clocking signal B and then underneath the extension from corresponding intersection gate 17.

The second storage site has a gate, 42, and, with suitable signals, charge packets can be received from, or returned to, mesh 16 through port 25. Gate 42 receives clocking signal ST2 and this signal, in proper sequencing with signal XS on transfer control gate 24 and with signal C on that corresponding one of gates 20, permits such receptions and returns of charge packets to be accomplished between mesh 16 and the storage site associated with gate 42.

Similarly, the third storage site has a gate, 43, and again, with suitable signals, charge packets can be received from, or returned to, mesh 16 through port 23. Gate 43 receives clocking signal ST3 which, in conjunction with signal XS on transfer control gate 24 and with signal B on that corresponding one of gates 20, permits receptions and returns of charge packets to be accomplished between mesh 16 and the storage site associated with gate 43.

The understanding of the construction of each signal processing cell 15, and the operation thereof, is enhanced by cross section views of the major operating portions thereof so that the structural arrangements can be seen and so that the sequence of clocking or control signals and the corresponding charge packet transfers can be related thereto. FIG. 4 shows cross sectional views or elevations of four portions of the structure shown in layout or plan view in FIG. 3. The first of these cross sectional views is shown in FIG. 4 to the upper left, and is a broken cross section view taken through multiplier gate 30 and diffusion 37, the latter serving both as part of the interconnection between transistor 35 and non-inverting floating gate FGNI and as the coupling of multiplier gate 30 to gate FGNI. This cross section view is designated (i) in FIG. 4, and the corresponding broken cross section line is designated (4i) in FIG. 3.

The second of these cross sectional views is shown in FIG. 4 to the right of the view designated (i) there and is designated (ii) in turn in FIG. 4. The corresponding cross section line is designated (4ii) in FIG. 3. This cross sectional view is taken through diffusion 39, a portion of non-inverting floating gate FGNI, a portion of separating gate FGI-S, a portion of inverting floating gate FGI and that one of gates 20 involved port 22 which is shown, in FIG. 3, to receive clocking signal C.

Moving further to the right in FIG. 4, the next cross sectional view there is designated (iii). The corresponding cross section line in FIG. 3 is designated (4iii) and is taken through first storage site gate 41, the extension of that one of gates 20 having clocking signal B provided thereto and which is adjacent to gate 41, the extension of the adjacent gate in intersections 17 to that gate 20 and to a portion of non-inverting floating gate FGNI, and finally through that same portion of non-inverting floating gate FGNI.

The concluding cross sectional view is the one farthest to the right in FIG. 4 and is designated (iv). The corresponding section line is designated (4iv) in FIG. 3 and is taken through both inverting floating gate FGI and separating gate FGI-S where separating gate FGI-S is structurally above inverting floating gate FGI at the point they are electrically connected to one another by a metallization interconnection as represented by line 29, with neither this representation nor the actual metallization being shown in FIG. 4. The cross section is further taken through the extension of an intersection 17 gate which is adjacent to inverting floating gate FGI at port 21 and through that one of gates 20 at port 21 receiving clocking signal C.

In FIG. 4, displayed below the cross sectional views (i), (ii), (iii) and (iv) are potential energy diagrams taken at certain points in time during an operating sequence which will be described below. Each cross sectional view has a vertical series below it of such potential energy diagrams showing the potential energy at various points in the monolithic integrated circuit chip semiconductor material below the polysilicon gates and at various succeeding times in the operational sequence. The clocking or control signals, provided as voltage waveforms which are supplied to the polysilicon gates in the cross sectional views, are shown below these potential energy diagrams and these voltage waveforms have the same time axis horizontally that the potential energy diagrams have vertically. The higher parts of these voltage waveforms represent more positive voltages than lower parts of the waveforms in the clocking signal diagram in FIG. 4.

As already suggested, the cross sectional views of FIG. 4 omit the metallization interconnection structure for purposes of clarity as was done in FIG. 3. However, the overlapping of the polysilicon gates obtained from the first and second polysilicon depositions is shown in the cross section views of FIG. 4. As previously noted, cross sectional view (i) is a cross section taken through multiplier gate 30 and diffusion 37 and the silicon semiconductor material substrate, 44. Since this cross section view is provided with a broken section line (4i) in FIGS. 3, this section break has been shown in view (i) by a dashed line, 45. The p-type conductivity, silicon semiconductor material in substrate 44 is doped with boron to have a resistivity of around 10 Ω-cm. Diffusion 37 is provided by doping the substrate in that region with phosphorus in a concentration of $10^{18}$ atoms/cm$^3$ or more. Gate 30 is of arsenic doped polysilicon separated from a major surface, 46, of substrate 44 by silicon dioxide having a thickness of approximately 1000 Å. Channel stops are provided by relatively thick silicon dioxide portions, 47, which are over p$^+$-type conductivity regions, 48, formed in substrate 44 by doping these regions with boron to a concentration of $10^{18}$ atoms/cm$^3$ or more. Finally, there is shown a protective 3% phosphosilicate glass layer, 49, provided over multiplier gate 30 and over thick oxide regions 47, there being shown no boundaries between layer 49 and thick regions 47, although the composition in these regions do differ from one another.

Cross section view (ii) shows, as noted above, a cross section of diffusion 39 and of portions of the arsenic doped polysilicon floating gates of the floating gate regenerator at port 22 along with the arsenic doped polysilicon gate 20 at port 22 having clocking signal C applied thereto. Inverting floating gate FGI and non-inverting gate FGNI are easily seen to be obtained from the first polysilicon deposition and again are separated from major surface 46 by approximately 1000 Å of silicon dioxide. The same separation from surface 46 by silicon dioxide occurs in this view with respect to separating gate FGI-S and that gate 20 having clocking signal C. Under this latter gate, is shown a portion of the buried channel extending under mesh 16 bounded in this view by line 28 at major surface 46, and a corresponding thick oxide portion 47 marking the edge of the channel stop structure along this portion of mesh 16. The concentration of phosphorus in diffusion 39 is the same as in diffusion 37, but the concentration of phosphorus in the buried channel region under gate 20 is on the order of only about $10^{16}$ atoms/cm$^3$. The maximum depth of the pn semiconductor junction separating diffusion 37 and 39 from the remaining portions of substrate 44 is about 1.6 μm while the maximum depth of the pn semiconductor junction separating the buried channel region from the remaining portions of substrate 44 is approximately 1.0 μm.

Cross section view (iii), as previously stated, shows a cross section of non-inverting floating gate FGNI and an extension of corresponding gate 20 having clocking signal B applied thereto where both of these gates are obtained from the first doped arsenic polysilicon deposition. Also shown in cross section is gate 41 and an extension of a corresponding gate at an intersection 17 having clocking signal X applied thereto, where both of these gates are obtained from the arsenic doped second polysilicon deposition. All of these gates are separated from major surface 46 by approximately 1000 Å of silicon dioxide, and have below them, in the semiconductor material of substrate 44, a buried channel region.

Cross section view (iv), as stated above, shows a cross section of inverting floating gate FGI and a corresponding gate 20 having clocking signal C applied thereto, where both are obtained from the arsenic doped first polysilicon deposition. Also shown is another extension of a corresponding intersection 17 gate having clocking signal X applied thereto and separating gate FGI-S which were provided in the arsenic doped second polysilicon deposition. Separating gate FGI-S is very clearly shown to be obtained from the arsenic doped second polysilicon deposition as, in this view, it is fully over inverting gate FGI. All of these gates, except obviously separating gate FGI-S at this location, are separated from major surface 46 by approximately 1000 Å of silicon dioxide and are each over a buried channel region.

The two metallization interconnection portions represented as single lines in FIG. 3 have the interconnections they represent shown in FIG. 4 as interconnection lines which are to imply conductive interconnections. The first of these conductors is line 29 and it appears in cross section view (iv) where it is shown interconnecting inverting floating gate FGI, separating gate FGI-S and transistor 32. The other conductor is line 38 and is shown extending between cross section views (i) and (ii) to interconnect diffusion 37 with non-inverting floating gate FGNI.

Further shown in FIG. 4 are transistors 32 and 35 from FIG. 3. Here they are represented by circuit symbology, rather than being shown in a cross section view from FIG. 3, to aid in understanding the operation of signal processing cells 15 and because they are formed of well-known, standard device structures used for providing n-channel, enhancement mode metal-oxide-semiconductor field-effect transistors. The connections to each of the polysilicon gates and to the transistors are shown with further lines representing conductive interconnections in FIG. 4, but these lines do not represent metallization interconnection system conductors. Instead, they represent in some instances other portions of the polysilicon gates to which the transistors are connected, and they represent in other instances interconnecting diffusion runs in substrate 44.

The structures shown in FIGS. 3 and 4 are fabricated by generally well-known techniques. Such a fabrication begins upon a p-type conductivity wafer serving as substrate 44 which, as previously indicated, is doped with boron to have a resistivity of 10 Ω-cm. A thin layer of silicon dioxide is grown thereon and silicon nitride is deposited thereover. The portions desired have a thick oxide provided thereover for channel stop purposes, i.e. the field regions, are determined and photoresist with such a pattern is then provided on the silicon nitride. This provision is followed by etching away the unwanted silicon nitride portions over the desired channel stop regions, that is, the field regions. The silicon nitride is then used as a mask for etching away the now exposed underlying silicon dioxide portions to expose substrate 44 at locations where field regions are desired. A boron implant is made to provide the p+-type conductivity regions for the channel stops. The field oxide for the channel stop regions is then grown.

Then the remaining portions of the silicon nitride and the remaining underlying silicon dioxide regions are removed from over the remaining regions, i.e. the feature regions, and a new thin layer of silicon dioxide is grown over substrate 44 where exposed in at feature regions. A further boron ion implantation step is made through this thin oxide to adjust the threshold voltage for inverting the substrate material by a voltage on a gate separated from the substrate material by an insulator layer.

Thereafter, photoresist is placed over everything except the portions of the feature regions where buried channels are desired to occur and a phosphorus ion implantation step is performed to provide the buried channel regions. The photoresist and the feature region silicon dioxide layer are then stripped away and an annealing step is performed to repair the lattice of the silicon semiconductor material at the locations of the foregoing implantations.

A new thin layer of silicon dioxide is grown and the first deposition of arsenic doped polysilicon is performed. Photoresist is used to define the portions of the feature regions which are to obtain polysilicon gates from the first deposition and an etching step then removes the unwanted portions of the first polysilicon deposition followed by removal of the photoresist. The now exposed silicon dioxide in the feature regions not covered by the remaining portions of the first polysilicon deposition are stripped away and a new thin layer of silicon dioxide is then grown over the exposed semiconductor material of substrate 44 and over the remaining portions of the first polysilicon deposition. Thereafter, a second deposition of arsenic doped polysilicon is provided. Again, photoresist is used to define the portions of the second polysilicon deposition which are to be used as polysilicon gates. The unwanted portions of the second polysilicon deposition are then etched away and the photoresist is thereafter stripped away. Also stripped away then is any of the thin layer of silicon dioxide which has not been covered by the second polysilicon deposition.

A phosphorus ion implantation step is then made which leads to phosphorus reaching the surface of the silicon semiconductor material in any places where the last thin layer of silicon dioxide has been stripped away. Thereafter, a 3% phosphosilicate glass deposit is made over the wafer followed by a thermal annealing cycle to repair lattice damage and to drive into substrate 44 the last implanted phosphorus to form sources and drains for the transistors and other desired diffusions. Thereafter, the usual etching steps, metal deposition steps and patterning of such metal steps are made to provide the metallization interconnection network. Finally, a passivation layer is applied followed by providing openings therein to expose metallization pads for electrical interconnections to other electrical components.

The portions of chip 14 in FIG. 3 in which the cross sectional views are taken, as shown in FIG. 4, comprise the essentials of the floating gate regenerator used in each signal processing cell 15 of chip 14 which perform all the arithmetical and logic operations in signal processing cells 15. The basic mode of operation for formation of an output charge packet with some selected relation to certain input charge packets is shown in FIG. 4 by both the clocking or control signal voltage waveforms over time and the potential energy diagrams set out there.

The proper initial conditions in which the various portions of the floating gate regenerator are placed to develop an output charge packet with some selected relationship to certain input charge packets are shown in the voltage waveforms over time and the potential diagrams over space and time of FIG. 4 at various times $t_i$. As the voltage waveform diagram shows, the various portions of the floating gate regenerator are placed in the proper initial conditions at different times so that there is a different time $t_i$ for each of the cross section views in FIG. 4 in the first horizontal set of potential energy diagrams in the row labelled with time $t_i$—the conditions shown in the $t_i$ row actually come into being at different times during the operation.

Cross sectional view (i) shows the situation when there is multiplication of the input charge packets by a standard value constant (here 0.5) which always occurs in the operation of the floating gate regenerator, this standard value being appropriate for showing the basic operation of this generator. Where the standard multiplication is desired, clock signal MG is at a calibrated, relatively low, positive voltage with the result that the potential energy over surface 46 of substrate 44 under gate 30 is at higher levels. Nothing further will be stated here about the multiplication operation during the immediately following basic regenerator operation description. The multiplication operation will be described subsequently.

Clock signal RSNI at the drain of transistor 35 and clock signal RSI at the drain of transistor 32 can be assumed to be at 15 volts during the entire sequence of operational steps set out in FIG. 4. As a result, at time $t_{i(ii)}$, with clock signal FGR at the gates of transistors 32 and 35 being also at 15 volts as is indicated in the voltage waveforms in FIG. 4, clocking signal RSNI is applied directly to diffusion 37 in cross section view (i) making it a reduced value source of charge, the charge being indicated by the single direction crosshatching of the potential diagram portion corresponding to diffusion 37 thereabove for time $t_i$.

In cross section view (ii) of FIG. 4, clocking signal FGR, being at 15 volts, leads not only to clocking signal RSNI being applied to diffusion 37 as indicated and to commonly connected floating gate FGNI, but also to clocking signal RSI being applied to both floating gate FGI and separating gate FGI-S. The result is shown in the potential energy diagram therebelow of the surface potential at surface 46 of substrate 44 for time $t_{i(ii)}$ where the potential energy is indicated to be relatively low. The surface potential shown below separating gate FGI-S is slightly lower than that shown below floating gates FGNI and FGI. This is because the doping level of substrate 44 is slightly lowered below the separating gate due to the etching away of the thin layer of silicon dioxide prior to the second polysilicon deposition and concomitant slight reduction of the doping concentration at surface 46, this etching being required prior to providing the second polysilicon deposition from which separating gate FGI-S is obtained.

At time $t_{i(ii)}$, clocking signal C is also at 15 volts so that the potential energy diagram for view (ii) below the portion of gate 20 having clocking signal C is approximately equal to that below the floating gates for the small portion of this gate 20 which does not have a buried layer below it, but then is shown considerably lower beneath that portion of this gate 20 having the buried layer region underneath it. Note that the potential energy shown in the diagrams of FIG. 4 is that occurring at surface 46 in those instances where there is no buried layer, but that the potential energy shown in these diagrams where there is a buried layer region is that occurring near the pn semiconductor at the junction between the buried layer regions and remaining portions of substrate 44. The potential energy in these buried layer regions is so much lower that breaks are indicated by slash lines in the potential energy curve as it approaches or leaves potential energy curve portions for these buried layer regions.

This application of voltage waveforms to the otherwise "floating" gates FGI, FGI-S and FGNI removes any residual charge from underneath these gates. This prepares these gates for generating, at that location, an output charge packet at the end of the operation cycle following, i.e. resets the floating gate generator for a new operation.

In cross section view (iii) of FIG. 4, at time $t_{i(iii)}$, clock signal ST1 on gate 41 for storage site 1 has gone to zero in voltage value while gate 20 having clocking signal B thereon has 15 volts applied to it. The first input charge packet, designated $q_1$ and shown by single direction crosshatching, has been assumed to have been stored at the storage site beneath gate 41 prior to beginning the coming operational sequence of the floating gate regenerator. As a result of the voltage waveforms at time $t_{i(iii)}$, charge packet $q_1$ has been transferred from the storage site beneath gate 41 to being beneath gate 20 as shown there by the crosshatching. Charge packet $q_1$ does not go beyond gate 20 at this time because of the 7.5 volt potential applied to the extension of the gate at corresponding intersection 17 having clock signal X applied thereto.

The potential energy near the buried channel region junction beneath floating gate FGNI established there by transistor 35 and clock signals RSNI and FGR is maintained at this later time $t_{i(iii)}$ because of the various capacitances effectively connected to this node. This potential energy is of a lower value in cross section view (iii) than in cross section view (ii) because of the buried layer being underneath the portion of floating gate FGNI in cross section view (iii) but not in view (ii). The slash lines in the potential energy diagram in cross section view (iii) again indicates there is a substantial offset in the potential energy diagram here due to the buried channel region.

In cross section view (iv) of FIG. 4 at time $t_{i(iv)}$, the second input charge packet is assumed to have been brought along mesh 16 to gate 20 having clock signal C thereon. Thus, the second charge input packet, $q_2$, is shown by crosshatching below this gate 20. The charge packet is kept there by there being a channel stop on the left side and by having clock signal X being at 7.5 volts on the extension of the gate at the corresponding intersection 17. Again the potential energy beneath the buried channel region beneath floating gate FGI established earlier by transistor 32 and clock signals RSI and FGR is maintained at this time by $t_{i(iv)}$ by the effective capacitance connected to this node. Also again, there are slash line breaks on either side of the potential energy diagram in cross section view (iv) at time $t_{i(iv)}$ to indicate there is a substantial offset in the potential energy due to the buried layer region there.

The initial conditions depicted for cell 15 structures at times $t_{i(ii)}$, $t_{i(iii)}$ and $t_{i(iv)}$ are essentially maintained until clocking signals C and B decrease from 15 volts to zero volts which can be seen as occurring by time $t_2$ in the voltage waveforms of FIG. 4. With this change in clocking signal C, which is followed by the change in clocking signal B, the input charge packet $q_2$ and then the input charge packet $q_1$ are transferred to being beneath floating gate FGI and floating gate FGNI, respectively. This is shown as having been accomplished by time $t_2$ in the horizontal set of potential energy diagrams for time $t_2$ shown in FIG. 4. At time $t_2$ clock signal FGR has returned to zero volts so that both transistors 32 and 35 are switched into the off condition preventing clock signals RSI and RSNI from further affecting the floating gate regenerator until such time as clocking signal FGR returns to 15 volts.

The transfer of the input charge packets $q_1$ and $q_2$ to being under floating gates FGNI and FGI, respectively, causes the voltages previously maintained on these gates by the associated charged capacitances to decrease and, since charge packets $q_1$ and $q_2$ in general differ in the charge quantities contained in each, the voltage changes by a differing amount on floating gate FGNI as compared to the voltage change on floating gate FGI. This change in voltage leads to a change in the potential energy below the floating gates and to a different potential energy below each. This can be seen in cross section view (ii) for time $t_2$ where the potential energy beneath floating gate FGNI is greater than it is beneath floating gate FGI as well as beneath separating gate FGI-S. The decrease in voltage on floating gate FGNI also makes charge available at a higher potential energy at the pn semiconductor junction of diffusion 37 and substrate 44 in cross section view (i) but this has no operational significance.

The decrease in voltage from 15 to zero volts in clocking signal C by time $t_2$ also makes charge abundantly available at a much greater potential energy in diffusion 39 of cross section view (ii). As a result, charge flows beneath floating gates FGNI and FGI and beneath separating gate FGI-S. However, with clocking signal C being at zero volts, a relatively high potential energy occurs beneath gate 20 having clock signal C applied thereto in view (ii) at that portion thereof which does not have a buried channel region below it. Thus, there is a sufficient potential barrier to prevent the charge flowing from the junction of diffusion 39 beneath the floating gates to being transferred beneath gate 20 in view (ii).

The subsequent decrease in voltage in clocking signal B from 15 volts to zero volts raises the potential energy below gate 20 in view (iii) with the result being shown there of input charge packet $q_1$ being transferred over the potential barrier provided by clocking signal X to being beneath floating gate FGNI by time $t_2$. Similarly, the decrease in voltage in clocking signal C on gate 20 in view (iv) from 15 to zero volts leads, as earlier indicated, to input charge packet $q_2$ being transferred over the potential barrier provided by clocking signal X to being beneath floating gate FGI by $t_2$.

At time $t_3$, clocking signal C has begun to rise from zero volts back toward 15 volts. This has no affect in the multiplier structure shown in view (i). However, in the view (ii), charge at the junction of diffusion 39 is made available at lower and lower potential energy until the potential energy at the junction equals that beneath floating gate FGNI. At this point, any charge beneath gate FGNI has spilled back to diffusion 39 and there is an amount of charge trapped beneath floating gate FGI and separating gate FGI-S by the potential barrier on either side thereof. These potential barriers are due to the potential energy below floating gate FGNI because of charge packet $q_1$ and below gate 20 because of clocking signal C applied thereto in view (ii).

Even though clock signal C is increasing, it is not increasing so fast that it does not maintain a potential barrier beneath gate 20 in this view until the charge beneath floating gate FGI and separating gate FGI-S is trapped. As indicated in the potential energy diagram for view (ii) at time $t_2$ the difference in voltage on floating gate FGNI, on the one hand, and floating gate FGI and separating gate FGI-S, on the other, leads to the difference in potential energy below these gates and provides the basis for charge being trapped beneath floating gate FGI and separating gate FGI-S. The potential energy diagram beneath view (ii) for time $t_3$ indicates this trapped charge becomes the output charge packet, $q_{out}$, of the floating gate regenerator in this operation.

Notice that the trapped charge is proportional to the difference in potential energy beneath floating gate FGNI and the potential energy beneath floating gate FGI and separating gate FGI-S. This potential energy difference is directly due to the difference in charge quantities in the input charge packets $q_1$ and $q_2$ as indicated above. Furthermore, because of connection 38 between diffusion 37 and floating gate FGNI, multiplier gate 30 affects in a manner to be described below the voltage level of floating gate FGNI and, hence, the potential energy below this floating gate to effect multiplication by a constant. The result is that the floating gate regenerator output charge packet, $q_{out}$, has the following dependence:

$$q_{out} = F(V_{MG})q_1 - kq_2 \qquad q_1 > q_2$$
$$q_{out} = 0 \qquad q_1 \leq q_2$$

Symbols $q_{out}$, $q_1$ and $q_2$ have been explained in the foregoing and are shown explicitly in FIG. 4. $V_{MG}$ is the voltage in signal MG and the symbology $F(V_{MG})$ represents the effect of the multiplier gate in providing $q_{out}$. The symbol k is a constant depending on the capacitance of the floating gate FGI. The foregoing equations represent the floating gate regenerator operation and from this expression the arithmetical and logic capabilities of the generator can be derived.

Finally, at time $t_4$, clocking signal C has risen to a full 15 volts reducing the potential energy barrier below logic gate 20 in view (ii). As a result, output charge packet $q_{out}$ is transferred beneath logic gate 20 and ready to be transferred along mesh 16 to a desired destination therefor. Note that neither of the input charge packets $q_1$ and $q_2$ have been altered nor lost in this process and, therefore, are still available.

The multiplier structure of view (i) in FIG. 4 operates by changing the capacitance value associated with floating gate FGNI to thereby change the voltage on this gate otherwise due to an input charge packet $q_1$. As a result, the potential energy under floating gate FGNI in view (ii) changes to thereby change the quantity of charge provided in the output charge packet $q_{out}$ at the end of the operational sequence described above in connection with FIG. 4.

This changing of the capacitance associated with floating gate FGNI is accomplished through use of the gated diode structure of view (i) of FIG. 4 by changing the voltage value of signal MG, i.e. $V_{MG}$, applied to gate 30 in view (i). Varying positive voltage $V_{MG}$ varies the surface potential at surface 46 under multiplier gate 30. A sufficient change in this voltage can change the doped silicon semiconductor material of substrate 44 at surface 46 under gate 30 from the (a) depletion condition, i.e. the absence of majority carriers, to the (b) inversion condition, i.e. the accumulation of minority carriers to the point of changing the conductivity type of the semiconductor material near surface 46 from p-conductivity to n-conductivity. If the voltage on multiplier gate 30 is such that semiconductor material therebelow is well into the depletion condition, the capacitance seen at diffusion 37, which is electrically connected to floating gate FGNI, is essentially nothing more than that associated with the depletion condition of the pn semiconductor junction separating diffusion 37 from the remaining portions of substrate 44. This is the minimum capacitance condition at diffusion 37 and in this condition the junction has about twice the capacitance value of the capacitance occurring at that portion of floating gate FGNI adjacent to separating gate FGI-S.

Figure 5A:
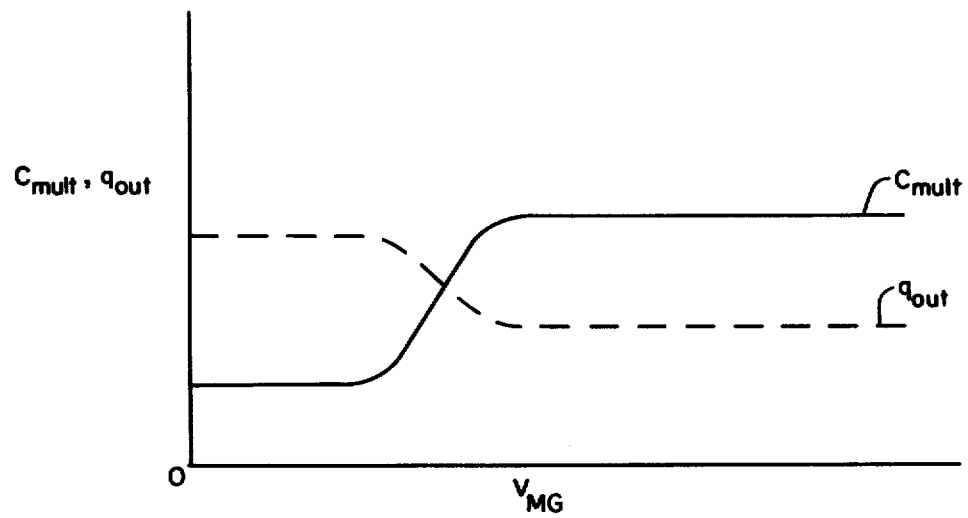
FIG. 5A is a graph of the multiplication capability of the monolithic integrated circuit chip shown in FIGS. 3 and 4.

As voltage $V_{MG}$ applied to gate 30 is increased thereby driving the semiconductor material near surface 46 toward inversion, the effective extent of diffusion 37 begins to spread under multiplier gate 30 so that at strong inversion the capacitance at diffusion 37 is essentially the oxide capacitance of the multiplier gate. This capacitance has about five times the value as that capacitance associated with that portion of floating gate FGNI adjacent to separating gate FGI-S. This change in effective capacitance value at diffusion 37 with changes in value of voltage $V_{MG}$ in signal MG as applied to gate 30 is shown in FIG. 5A where this effective capacitance $C_{mult}$, is represented by a solid line. Thus, a range exists for voltage $V_{MG}$ within which one can control the effective capacitance $C_{mult}$ over a range of capacitance values. $C_{mult}$, because of conductor 38, is one of the capacitances associated with floating gate FGNI in addition to the structural capacitances associated with gate FGNI occurring between it and the chip structural features therebelow.

Figure 5B:
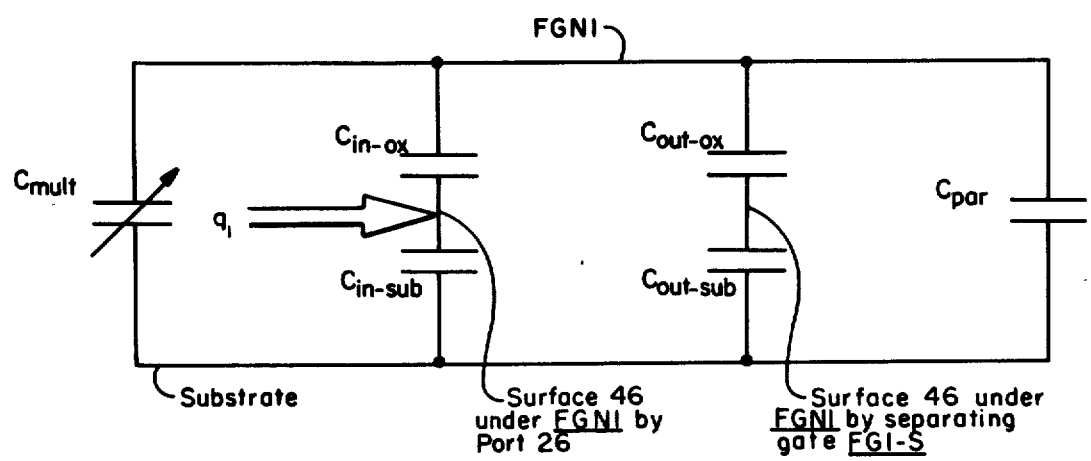
FIG. 5B is an equivalent circuit of a portion of the structure shown in FIGS. 3 and 4, FIGS. 6A through 6F are further schematic diagrams representing system aspects of the present invention.

A circuit schematic diagram is shown in FIG. 5B where all the capacitances associated with floating gate FGNI are presented and are indicated as "lumped" capacitances in an equivalent circuit. The first capacitances on the left is just the variable multiplier gate control capacitances $C_{mult}$ described in the immediately preceding paragraphs. The first set of series capacitors to the immediate right of capacitance $C_{mult}$ represent input capacitances associated with the portion of floating gate FGNI that is adjacent to port 26. The upper capacitance, $C_{in-ox}$, in this series string represents the oxide capacitance between the portion of floating gate FGNI near port 26 and surface 46 of the doped silicon semiconductor material of substrate 44. The lower capacitance in the string is the substrate capacitance, $C_{in-sub}$, and represents the depletion capacitance between surface 46 of semiconductor material 44 below gate FGNI near port 26 and the remaining portions of this material. Note that the introduction of input charge packet $q_1$ beneath floating gate FGNI in FIG. 4 corresponds to placing this charge between these two capacitances, $C_{in-ox}$ and $C_{in-sub}$, in FIG. 5B.

The next series string of capacitances to the right of the input capacitances represent the output capacitances associated with the portion of floating gate FGNI that is adjacent to separating gate FGI-S. The upper one in this string of capacitances, $C_{out-ox}$, represents the oxide capacitance between the portion of floating gate FGNI near gate FGI-S and surface 46 of semiconductor material substrate 44 at this location. The lower capacitance, $C_{out-sub}$, in this string represents the substrate capacitance between surface 46 of substrate 44 below gate FGNI near gate FGI-S and remaining parts of this substrate. Note that the surface potential at surface 46 beneath this portion of floating gate FGNI in FIG. 4 corresponds in FIG. 5B to the voltage occurring between these two output capacitances.

Finally, the capacitance on the far right in the circuit schematic in FIG. 5B is the parasitic capacitance, $C_{par}$, representing all the other capacitances that are unavoidable associated with floating gate FGNI. An obvious source of such capacitance can be seen in FIG. 3 as that capacitance associated with the connecting portion of gate FGNI between the portion of floating gate FGNI adjacent to port 26 and the portion thereof adjacent to separating gate FGI-S.

During the operation of the floating gate regenerator depicted in FIGS. 3 and 4, the input capacitances $C_{in-ox}$ and $C_{in-sub}$, the output capacitances $C_{out-ox}$ and $C_{out-sub}$, and the parasitic capacitance $C_{par}$ can be considered essentially constant. Thus, the varying results obtained are due almost solely to the changing of the multiplier capacitance $C_{mult}$.

In operation, in resetting floating gate FGNI by application of clock signal RSNI thereto through the application of clock signal FGR to the gate of transistor 35, gate FGNI is charged to the particular voltage of signal RSNI through the charging of the effective capacitances associated with floating gate FGNI shown in FIG. 5B. The transfer of an input charge packet $q_1$ from storage site 1 at gate 41 to introduce it under the portion of floating gate FGNI where it is adjacent to port 26 has the effect of changing the voltage occurring on floating gate FGNI.

The effect of this voltage change is indicated in the potential energy diagram for floating gate FGNI in view (ii) from the initial condition occurring thereunder at time $t_{i(ii)}$, to the condition occurring at time $t_2$. The voltage change on gate FGNI in FIG. 5B referred to the substrate will equal $\Delta V_{FGNI} = q_1/C_{FGNI-TOT}$. Here $q_1$ is the input charge packet charge quantity as earlier indicated, $V_{FGNI}$ is the voltage on floating gate FGNI, and $C_{FGNI-TOT}$ is the total capacitance occurring between floating gate FGNI and other structural portions of chip 14.

Analysis of the circuit of FIG. 5B shows that the concomitant change in charge induced at the junction of the two output capacitances is equal to $\Delta V_{FGNI} C_{FGNI-OUTPUT}$. Here, $C_{FGNI-OUTPUT}$ represents the effective capacitance occurring at the junction of the two output capacitances in FIG. 5B. If input charge packet $q_2$ shown in FIG. 4 is zero, as will usually be the case when there is a desire to multiply an input charge packet, here $q_1$, by a constant value, this induced charge under the portion of floating gate FGNI adjacent to separating gate FGI-S will just be equal to the output charge $q_{out}$ obtained in completing the operational sequence shown in FIG. 4, or $q_{out} = V_{FGNI} C_{FGNI-OUTPUT}$. Eliminating $V_{FGNI}$ in the last two equations results in $q_{out} = q_1 C_{FGNI-OUTPUT}/C_{FGNI-TOT}$, i.e. the output charge packet is a fraction of the input charge packet where the fraction is set by a ratio of capacitances.

As is well known from circuit theory, capacitance $C_{FGNI-OUTPUT}$ will not be very strongly affected by changes in multiplier capacitance $C_{mult}$. On the other hand, capacitance $G_{FGNI-TOT}$ will be a strong function of $C_{mult}$. Thus, as the last equation indicates, the output charge packet $q_{out}$ will be a function of the input charge packet $q_1$ weighted by a ratio of capacitances only one of which is a substantial function of multiplier capacitance $C_{mult}$ which in turn is determined by $V_{MG}$. Note therefore, the last equation above is effectively in the same form as that of the general output equation (with $q_2=0$) first set out above for the floating gate regenerator of cell 15 characterizing the result obtained from the basic operational sequence described in connection with the diagrams of FIG. 4. That is, $q_{out}$ is a function of $V_{MG}$. Thus, the dashed line curve in FIG. 5A for the size of the output charge packet $q_{out}$ indicates the value of $q_{out}$ is a function of $V_{MG}$.

The value of the multiplier in the last equation above will be in the range from 0.2 to 0.5 as capacitance $C_{FGNI-TOT}$ varies from being approximately two times that of capacitance $C_{FGNI-OUTPUT}$ to being five times that capacitance as indicated above. If the desired multiplying constant has a value which lies outside of the range of 0.2 to 0.5, the multiplication process can be repeated on the resulting output charge packet from the first operation, $q_{out}$, or another input charge packet can be operated upon by the multiplication process to provide another fractional output charge packet to be added to the first. Such an addition process will be described below. Thus, multiplication by constants smaller than 0.2 or by constants greater than 0.5 can be effectively accomplished.

The floating gate regenerator of FIGS. 3 and 4 is so named because of its ability to regenerate, i.e. replicate, at its output, an input charge packet. This can be accomplished by adjusting voltage $V_{MG}$ so that output charge packet $q_{out}$ is a fractional portion of input charge packet $q_1$, assuming input charge packet $q_2$ to be zero, where one over that fraction equals an integer, N. Then N output charge packets $q_{out-1}, q_{out-2}, \ldots q_{out-N}$ are formed all of which are the same fractional size of input charge packet $q_1$ and accumulated at one of the storage sites. By accumulation at a common storage site, each of the outputs $q_{out-1}, q_{out-2}, \ldots q_{out-N}$ is effectively added to provide a charge packet at that storage site having a charge quantity equal to that in input charge packet $q_1$.

Obviously, essentially the same procedure can be used to add a number of unrelated charge packets by merely substituting a different input charge packet for charge packet $q_1$ during forming some of the output charge packets prior to accumulating these at a storage site. That is, if it is desired to add quantities of charge together in charge packets $q_a, q_b, q_c,$ and $q_d$ these charge packets can be substituted sequentially for $q_1$ in the operation sequence shown in FIG. 4 with $q_2$ set to zero. Assuming that multiplier control signal MG has a voltage such that the multiplier provides a multiplication constant of 0.5, sequential repetition of the operations set out in FIG. 4 followed by transmitting the resulting $q_{out}$ to a common storage site leads to the following results $q_{sum}=0.5(q_a+q_b+q_c+q_d)$.

Of course, the original charge packets $q_a, q_b, q_c$ and $q_d$ could all have been routed to the same storage site without use of the regenerator, instead of sending one-half of each of these input charge packets to that storage site, to apparently provide the result $q'_{sum}=(q_a+q_b+q_c+q_d)$. This alternative operation, however, leads to two problems: (i) the likelihood that the storage site will not be able to hold all of the charge that would accumulate there from the four input charge packets, particularly if the charge quantity in each of these input charge packets was relatively great and near the capacity of some of the charge-coupled device gates, and (ii) the original input charge packets would be completely lost and could not be used again in other computations arising under the data processing algorithms being used.

The inverse operation to addition, that is subtraction, can be performed directly in the floating gate regenerator without resort to use of a storage site to perform some part of this operation. To accomplish this, the input charge packet which is to have another input charge packet subtracted therefrom becomes charge packet $q_1$, while the charge packet that is to be subtracted therefrom becomes charge packet $q_2$ for the operational sequence shown in FIG. 4. The multiplier signal MG has the voltage therein adjusted so that the weighing factor in the first term-$F(V_{MG})$-in the general equation characterizing the operation of the floating gate regenerator, as first set out above, is equal to the weighing factor in the second term of that equation, k. By then performing the sequence of steps indicated in FIG. 4, the result is that $q_{out}=q_{diff}=k(q_1-q_2)$.

Note that this subtraction operation also preserves the original input charge packets $q_1$ and $q_2$ for further use in succeeding signal processing computations. Note also that the results of this operation will be zero if the charge quantity in input charge packet $q_2$ exceeds that in input charge packet $q_1$. Thus, the absolute value of the difference between two input charge packets can be found by simply subtracting one from the other in a first sequence of operations corresponding to those shown in FIG. 4 and storing the results in a storage site, followed by reversing the position of the two input charge packets in the floating gate regenerator and subtracting them again in the same sequence of operations followed by sending the result of the second sequence to the same storage site.

The floating gate regenerator, in having the ability to subtract, can also operate as a comparator. To operate thus, the quantity of charge to serve as a reference charge is introduced as a charge packet $q_2$ in FIG. 4. The input charge packet which is to be compared against the reference charge packet $q_2$ to determine whether this input charge packet is greater or smaller than the reference charge packet is introduced as input charge packet $q_1$ in FIG. 4. The above-described subtraction process, i.e. the basic process set out in connection with FIG. 4, is performed, and if input charge packet charge quantity $q_1$ is greater than that of reference charge packet $q_2$, there will be some output charge (perhaps small) appearing under gate 20 having clocking signal C applied thereto in view (ii) of FIG. 4. If not, there will be no charge appearing under this gate 20. If $q_1$ exceeds $q_2$ by too slight an amount, the output charge may be too small for further operations and $q_1$ will be treated in the system as not being greater than $q_2$. Thus, the presence or absence of sufficient charge under gate 20 having clocking signal C applied thereto in view (ii) of FIG. 4 after the subtraction process has been completed serves as the indication of whether the input charge packet was greater or smaller in charge quantity than the quantity of charge in the reference charge packet.

The floating gate regenerator of FIGS. 3 and 4 provided in each signal processing cell 15 of chip 14, through the capability thereof for performing comparisons and subtractions, can also serve as an analog-to-digital converter. The charge packet data sample to be converted to digital data is introduced in each cell 15 as input charge packet $q_1$ in the basic operational sequence set out in connection with FIG. 4. The number of quantization levels, and so the number of output bits, which can be provided depends upon the smallest difference in charge quantity that can be distinguished between the charge quantities in charge packets $q_1$ and $q_2$ in the operational sequence described in connection with FIG. 4 by the floating gate regenerator and in subsequent operations, i.e. the resolving power of the regenerator. Of course, if desired, fewer levels and output bits can be used. There must be independent storage sites available in each signal processing cell 15 in sufficient number so that there is one such site for each place position in the output digital number such that each digit has a corresponding storage site in which it can be stored.

In operation, a reference charge packet having a reference charge quantity equal to the maximum possible value of an output digital number is provided as reference charge packet $q_2$ in the operational sequence set out in connection with FIG. 4. This reference charge can be designated $q_{2r,N}$ and can be generated by providing a voltage on each of gates FGN and FGI having a suitable difference in voltage value and performing the operation sequence of FIG. 4. A comparison is then performed to determine whether the charge quantity in the analog data sample, $q_1$, for which a digital equivalent is desired, either exceeds or does not exceed the charge quantity in reference charge packet $q_2$. If $q_1$ does so exceed, the output charge resulting under gate 20 having clocking signal C applied thereto after the comparison operational sequence is routed to the storage site in signal processing cell 15 which represents the most significant bit in an output digital number. Thus, the presence of charge resulting from the comparison will lead to there being charge in this storage site and it will represent the binary number 1; the absence of charge will lead to there being no charge in this storage site representing the binary number 0.

Thereafter, a new reference charge packet $q_{2r,N-1}$, having a charge quantity equal to one-half the charge quantity represented by the largest possible output digital number is then introduced as charge packet $q_2$ in FIG. 4 and the comparison operational sequence is again performed with the result transmitted to the storage site having the next most significant position in the digital number. This procedure is repeated until a similar sequence has been performed for each of the place positions possible in an output digital number. As a result, the digital number equivalent to the analog data sample input charge packet $q_1$ is formed by the digit representations now located in the various storage sites used in this process in each signal processing cell 15. The contents of these storage sites can then be taken out and used to set flip-flops in a digital register inside signal processing cell 15, the digital register outputs being connected to other digital processing circuitry provided in signal processing cell 15. This other digital circuitry is used to perform further digital signal processing operations with respect to the digital data samples provided from this register as opposed to, or possibly in conjunction with, performing further operations in the floating gate regenerator on the analog data sample $q_1$ or other charge packets.

FIG. 3 shows only a few storage sites and no such digital circuitry provisions in cells 15, but clearly such further storage sites and such monolithic integrated circuit digital circuitry could be provided in such a signal processing cell where desired to have the advantages of digital circuitry processing for some or all of the computations involved in giving effect to a signal processing algorithm. In such a system, the possibility exists for eliminating intercellular communication mesh 16 in the form shown in FIGS. 1 and 3 by having the analog-to-digital converter of the kind just described, or another kind, operating entirely within a signal processing cell 15, and having the digital processing structures in each such signal processing cell connected by the metallization interconnection system to corresponding structures in each of its immediate neighbors, and having each of the immediate neighbors likewise so connected to each of its immediate neighbors, etc.

As can be seen from the foregoing discussion, the sequence of signal processing operations selected, and the directions to perform them, to occur in intercellular communication mesh 16 and in signal processing cells 15 in FIGS. 3 and 4 is arranged through providing a variety of waveforms of necessary voltage amplitudes to the various doped polysilicon gates occurring in these structures. Obviously, the selection of sequences of signal processing operations in the directions to perform them, if performed in digital circuitry, would require different kinds of waveforms applied to the inputs of various logic gates and flip-flop circuits and any other more elaborate digital circuits based on such basic digital circuits.

The source of the analog data for which the floating gate regenerator serves as an analog-to-digital converter has not been described, nor has the source of any of the input charge packets. These input considerations, and the corresponding output considerations, will be further described below, but clearly the input charge packets for analog-to-digital conversion can be obtained from transmissions along intercellular communication mesh 16 to each signal processing cell 15. However, the input charge packet can also be provided directly at each signal processing cell 15 by virtue of the dashed line components shown at the top of FIG. 4, including the photodetectors shown there, as will be further described below.

A variety of further modifications in the design of signal processing cells 15 are possible, either by modifying the floating gate regenerator itself, or by the adding of other circuits, functions or storage capabilities to each such signal processing cell. Thus, neither the layout of FIG. 3 with its resulting capabilities, nor the textual description given so far, should be considered either exhaustive or exclusive. For instance, a further simple change would be to add a further polysilicon gate at port 21 to provide logical control of arithmetic operations through "gating" the results onto mesh 16, such as is desirable in sorting operations occurring in some kinds of signal processing. Thus, if the added gate had no voltage applied thereto, the result of a subtraction operation, for instance, would not be passed out into the intercellular communication mesh 16, while the application of voltage to such an additional gate would provide results of the subtraction operation to intercellular communication mesh 16.

As indicated in FIG. 1, input signals containing the input information obtained by information acquisition means 11 are provided to parallel processor 10. The results of the processing of such input information in processor 10 can then be passed onto control systems means 12 for display purposes, control purposes, etc. This arrangement necessitates the provision of an information input means with respect to chip 14 in processor 10 and of an information output means with respect to chip 14 in processor 10. There are various possibilities for accomplishing these information transfers.

Figure 6A:
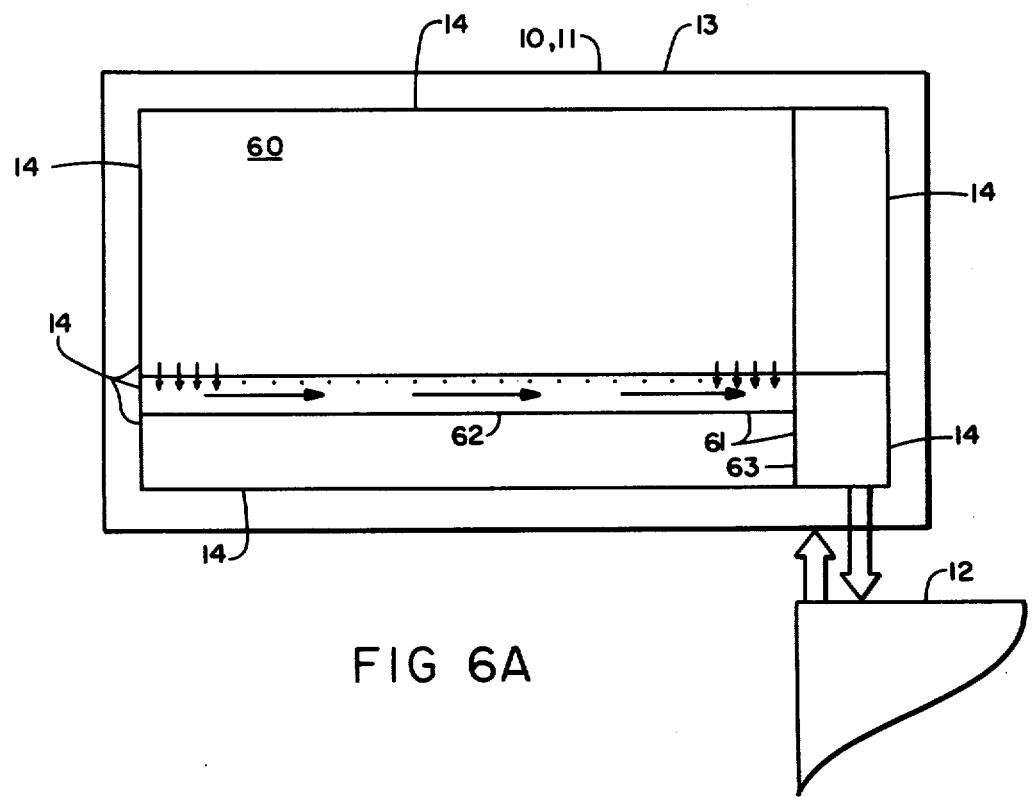

Perhaps the most straightforward manner of acquiring the information from parallel operating information sources is to provide each such information source right at a corresponding signal processing cell 15. Although not shown in FIG. 3, one example for input signals derived from arriving electromagnetic radiation would be to provide a photodetector right in the structure of each signal processing cell 15 along with the associated control circuitry needed to operate the photodetector, i.e. merge acquisition means 11 of FIG. 1 with processor 10. FIG. 6A is a schematic layout diagram of such an arrangement with acquisition means 11 and processor 10 indicated as merged in chip 14 by the designation 10, 11, the arrangement being provided in package 13. Signal processing cells 15 and mesh 16 are contained in a chip processing area, 60, having an output multiplexer, 61, arrayed along the bottom thereof. Multiplexer 61 is shown with a data gathering-translation means, 62, and an output port 63. Output port 63 is shown in communication with system control means 12 by a block-form arrow passing through the border of package 13 to means 12. The other block-form arrow coming from means 12 provides control signals for processor 10.

The feasibility of providing photodetectors in cells 15 will depend upon the particular signal processing operations contemplated because the physical size of each signal processing cell 15 will have to be accommodated to the amount of charge-coupled device structure or digital circuit structure needed to accomplish the kind and amount of signal processing desired. Typically, sufficient processing capability will be required to make the signal processing cells 15 sufficiently large so as to lead to the spacing between adjacent photodetectors, where one is provided in each cell, to being too great to achieve the resolution desired of the image scene focused across such an array of photodetectors.

Another alternative which retains a photodetector in each signal processing cell 15 is to make use of a fiber optic faceplate arrangement. An optical fiber is provided for each photodetector with the end of such an optical fiber that is farthest from the corresponding photodetector being provided in the closest possible proximity to similar ends of other optical fibers corresponding to other photodetectors to form an ordered array of such fiber ends in a manner such that these ends combine in a surface there across to receive image scenes. Each such optical fiber flares from this ordered array surface grouping (forming the faceplate) such that the opposite end is presented to its corresponding photodetector. Thus, the ends of the optical fibers that meet the photodetectors are spread out as is necessary for each to reach its corresponding photodetector. Yet the other ends of the optical fibers are in a faceplate on which the image scene is focused, and they are packed as tightly with each other as practical in an ordered array, with the ends also flush with one another in a surface, to achieve maximum scene resolution.

Figure 6B:
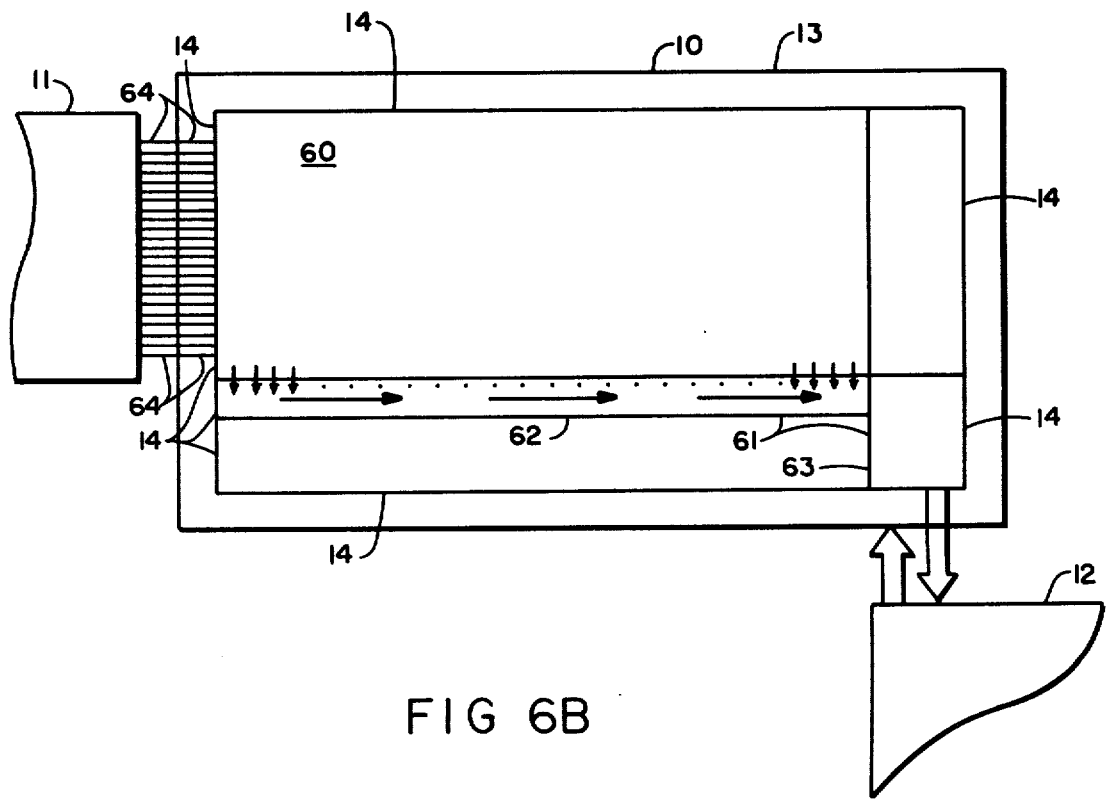

An alternative involving more significent structural change is to make acquisition means 11 another physical entity containing either just the photodetecting elements, or both the photodetecting elements and the associated circuitry necessary to operate these elements, with appropriate interconnections between each signal processing cell 15 and the appropriately associated portions of this separate physical structure. This is shown in FIG. 6B where the interconnections are designated 64 as a group and are shown going through the border of package 13 between acquisition means 11 and chip 14 to the cells 15 in operating area 60. Other than the separation of means 11, and the addition of the interconnections 64 necessitated thereby, the FIG. 6B layout is just that of FIG. 6A. In many instances, acquisition means 11 will have just the photodetectors themselves provided in one unit to thereby reach maximum density of such elements, and the circuitry necessary to operate the photodetectors will either be provided in a separate portion of acquisition means 11 or will be provided in each signal processing cell 15 of chip 14 corresponding to a particular photodetector.

Typical photodetector and operating circuitry arrangements, to be used in any of the immediately foregoing structural arrangements for the direct insertion of inputs into the signal processing cells 15 themselves, are shown by circuit symbology in FIG. 4 in dashed line form (but not shown in any manner in FIG. 3). A first possible arrangement comprises an n-channel, enhancement mode metal-oxide-semiconductor field-effect transistor, 50, and a silicon photodiode, 51. The cathode of photodiode 51 is assumed connected to a suitable source of voltage while the anode of diode 51 is connected to the drain of transistor 50. The source of transistor 50 is electrically connected to both floating gate FGI and separating gate FGI-S. The gate of transistor 50, in operation, is connected to a source of sampling signals which switches transistor 50 into the "on condition" each time a sample of the signal from photodiode 51 is desired.

Diode 51 can be operated as a photovoltaic photodiode in which the voltage signal therefrom corresponding to impinging electromagnetic radiation, 52, is used to adjust the voltage occurring on floating gate FGI and separating gate FGI-S after these gates and floating gate FGNI have been set at suitable reference voltage levels. In this operation, there would be no charge packets of the sort labelled $q_1$ and $q_2$ provided at this time. The photovoltaic voltage from diode 51 would then serve to adjust floating gate FGI and separating gate FGI-S to voltage level differing from the reference level so that the potential energy under these gates would differ from that under floating gate FGNI. At this point the sequence of steps shown at times $t_2$, $t_3$ and $t_4$ under view (ii) of FIG. 4 would be performed with the resulting output charge packet $q_{out}$ representing the sample taken of radiation 52 falling on photodiode 51. Charge packet $q_{out}$ would then be routed by intercellular communication mesh 16 to storage or to wherever desired for the first signal processing step thereon, and which might be analog-to-digital conversion.

Alternatively, photodiode 51 could be operated as a photoconductor by allowing radiation 52 impinging thereon to create a signal which discharges floating gate FGI and separating gate FGI-S where these gates were earlier charged to some reference level. Of course, for this mode of operation photodiode 51 could be replaced by a photoconducting resistor. Thereafter, the same steps shown under view (ii) in FIG. 4 beginning at time $t_2$ are performed to provide an output charge packet.

Another alternative photosensor and operating circuit arrangement is shown in FIG. 4 comprising a pair of n-channel, enhancement mode metal-oxide-semiconductor field-effect transistors, 53 and 55, along with a photodiode, 54. The source of transistor 55 and the drain of transistor 53 are electrically connected to diffusion 39 in place of an arrangement providing clocking signal C to diffusion 39. Clocking signal C is instead provided to the drain of transistor 55. Diode 54 is connected with its anode to a suitable voltage source (relatively negative) while its cathode is connected to the source of transistor 53. A sampling signal is provided to the gate of transistor 53 whenever a sample is desired from the signal developed by photodiode 54 in response to electromagnetic radiation, 56, impinging thereon. A clocking or control signal is provided to the gate of transistor 55 whenever operation of the floating gate regenerator is desired in the manner previously described in connection with the diagrams of FIG. 4, the signals to the gates of transistors 53 and 54 being always opposite the other insofar as being applied so that only one of these transistors is switched into the "on condition" at a time.

Photodiode 54 is operated as a photoconductor with its output signal in response to radiation 56 being provided to diffusion 39 whenever transistor 53 is switched into the on condition. At those times, transistors 32 and 35 are operated by clocking or control signal FGR in such a manner as to provide a voltage on floating gates FGNI, FGI and FGI-S to invert the material in substrate 44 at surface 46 thereof beneath them to being of n-type conductivity near that surface to thus provide a metal-oxide-semiconductor field-effect transistor action between diffusion 39 as the source and the potential energy well under gate 20 having clocking signal C applied thereto serving as the transistor drain. The charge packet thereby accumulated under gate 30 then represents the sample taken of electromagnetic radiation 56 impinging on photodiode 54 which charge packet can thereafter be sent to storage or to wherever desired for the first signal processing step thereon, again which might be analog-to-digital conversion.

Directly presenting inputs obtained from the parallel operating information sources in information acquisition means 11 to the corresponding signal processing cells 15 may not be convenient or may be relatively costly in many systems. An alternative procedure is to sample signals obtained from each of the parallel operating information sources and then use a multiplexer to provide these samples in an ordered, serial stream to processor 10 where a demultiplexer receives the ordered, serial stream and sorts them properly to be suitably placed into intercellular communication mesh 16 for transmittal to the corresponding signal processing cells 15.

Another, but similar, possibility would be to use a multiplexer to provide a portion of each input signal from each parallel operating information source to a sampler in processor 10 which would successively take a sample of each signal portion provided to it and distribute the samples so obtained properly into intercellular communication mesh 16 for transmittal to corresponding signal processing cells 15. An input information system of this latter kind might be constructed having the multiplexer applied directly to the parallel source signals associated with the physical entity containing the parallel operating information sources, while the system portion from that point onward, including the sampler, would be provided in chip 14 of process 10. Chip 14 may also contain a multiplexer and an output buffer circuit arrangement for collecting output results from signal processing cells 15 through these results having been placed in intercellular communication mesh 16 for transmittal to such an arrangement and then to portions of the system in control means 12 of FIG. 1. A schematic layout diagram of such an arrangement is shown in FIG. 6C.

Acquisition means 11 in FIG. 6C provides a stream of signal portions from the parallel operating information sources contained therein to parallel processor 10 through the border of package 13 as shown by the block-arrow leading from means 11. Chip 14 is shown in FIG. 6C to have a dashed line outline which will be explained later. Assuming that the dashed line outline denotes the edge of a monolithic integrated circuit chip 14, the stream of signal portions from means 11 is received at an input sampler and demultiplexer means, 65. Input sampler and demultiplexer means 65 comprises an input port, 66, in which the signal portions from means 11 are received and the sampling is performed, and further comprises a translating and distributing means, 67, for providing the samples so obtained to intercellular communication mesh 16 in operating area 60. Other than the provision of the input sampler and demultiplexer 65, to accommodate the change in form of the input information provided from acquisition means 11, the layout of FIG. 6C is just that of FIG. 6B.

The edge of chip 14 is shown just in dashed line form in FIG. 6C because the layout there for parallel processor 10 can be used to illustrate a further system concept available in implementing parallel processor 10. This concept is based on the need to sometimes partition the parallel processor apparatus to being on more than one monolithic integrated circuit chip for reasons of fabrication necessity or convenience, or system configuration limitations, or fabrication cost. If, at this point, dashed line 14 is ignored, the input sampling and demultiplexing means 65 and the output multiplexing means 61 can be considered to be supplying input data to and taking output results from, respectively, an array of parallel processor chips, such as chip 14, each appropriately interconnected to at least some of the others within operating area 60.

Thus, the inputs of two or more such chips might be connected to sampler and demultiplexer 65 and the outputs of two or more such chips might be connected to multiplexer 61. Provisions in processor 10 may then also be needed for the other chips in the array to receive inputs and transmit outputs to those chips directly connected to structures 65 and 61, if these other chips are not directly connected to structures 65 and 61, and provisions in processor 10 may also be needed for all the chips in the array to be appropriately interconnected to some of the others to thereby enable them to pass information back and forth between them as may be required by the system signal processing algorithms to be used.

On the other hand, the structure 65 can be dispensed with altogether if acquisition means 11 is again merged into processor 10 so that each chip carries a portion of acquisition means 11 in the manner of FIG. 6A. In this circumstance, provision need be made only for permitting the chips to pass information back and forth between them and for providing the resulting outputs. Alternatively, this dispensation can be accomplished if means 11 is directly connected to each chip in the array thereof in the manner shown in FIG. 6B.

The interconnections required between chips in the array to permit information to flow back and forth between them, regardless of the methods used for providing input information to processor 10 and taking results from processor 10, can be provided in a variety of manners. FIG. 6D shows direct interconnections, 68, being provided between each chip, or chip package, in the array where a small portion of the operating array structure from area 60 is presented in somewhat greater detail. The chips can be individually packaged in which case package 13 in FIG. 6C would be a printed circuit board or a ceramic board with the packaged chips in the array mounted thereon, or the chips may not be packaged individually, but instead mounted in a common package which package 13 in FIG. 6C would represent. Thus, in FIG. 6D, the interconnected entities are designated 14, 13' to indicate that they be either unpackaged chips 14 or individually packaged chips in package 13'. Assuming the chips are of the general nature shown in FIG. 3, the direct interconnections between chips can be placed between corresponding portions of intercellular communication mesh 16 provided in each chip if suitable output and receiving circuit arrangements are provided at the ends of such mesh portions as they occur at the corresponding edges of the array of processing cells 15 in each chip. The connections could alternatively be between the processing cells 15 in each chip along corresponding edges thereof assuming again that some suitable output and receiving circuit arrangement is provided in these signal processing cells 15.

There are several disadvantages to such direct interconnection arrangements. If the number of chips in the array is sufficiently large, there will be a very large number of terminal pins or the like to be interconnected, assuming the chips are individually packaged. If the chips are not individually packaged and even if the interconnection runs between termination points can be accomplished relatively cheaply by batch processing, the assembly cost can still be quite high for a large number of chips because of the precise chip registration required on the interconnection surface. Also, in either case, a rather large number of input and output circuits may have to be provided taking up a considerable space in each chip which leads to higher chip costs.

The number of pins or other output termination means can be considerably reduced as shown in FIG. 6E by the use of multiplexer and demultiplexer combinations, 69, on each side of the signal processing cell 15 arrays in each chip 14, 13'. This reduces interconnections 68 in FIG. 6D to the interconnections, 68', shown in FIG. 6E of four input interconnections and four output interconnections per array. Each combination 69 receives data from the array side of the chip in which it is located in parallel and converts it into serial form for transmission to the adjacent chip to its combination 69 which in turn reconverts the transmitted data back to parallel form for distribution into the signal processing cells of that destination chip, and vice versa.

Since the multiplexer and demultiplexer combinations 69 along the sides of the signal processing cell 15 array in each chip 14 covers the full number of cells along that array side, the amount of time to translate out in a serial stream all of outputs gathered along the entire array side is relatively long. The use in chips 14, 13' of dual multiplexer and demultiplexer combinations, 69', as shown in FIG. 6F, where each of the dual combinations covers just half of the signal processing cells array along a corresponding array side, leads to the time for transfer from one chip to an adjacent chip being approximately halved. On the other hand, this arrangement doubles the number of input and output interconnections, 68", being used per chip 14, 13', and also doubles the number of special circuits provided for multiplexer and demultiplexer combinations 69'.

However, operating an array of processor chips in area 60 of FIG. 6C does not necessarily require one of the foregoing interconnection arrangements. A further possibility is to eliminate all of the interconnections between chips in the array for information trading purposes, and instead supply each chip in the array with just input information from corresponding information sources and with an output arrangement to gather the output results from each of the chips in the array for transmittal to control system means 12. This is quite possible because often output information from only certain of the information sources is to be utilized at a given time in applying a signal processing algorithm. Often then, guidelines on which information source outputs are to be utilized at any one time can be arranged such that utilization of information means outputs is confined to just those having the signal processing cells corresponding thereto being all within a given chip in the array.

In image signal processing, for instance, quite commonly the processing efforts at any point in time occur with respect to a 32×32 photodetector element square or a 64×64 photodetector element square, or the like. Then the processing rules can be arranged so that such a square of photodetectors is always chosen so that the corresponding signal processing cells 15 always occur in just one of the chips in the array thereof in area 60 of FIG. 6C.

Return now to the point of view in FIG. 6C that there is but a single chip 14 represented there, as indicated by the dashed lines, such that operating area 60 again contains just an array of signal processing cells 15 and mesh 16. Then the input sampler and demultiplexer 65 can be a charge-coupled device arrangement in FIG. 6C at least if the signal processing cells are more or less of the type shown in FIG. 3 and they are in communication with an intercellular communication mesh of the nature of that in FIG. 3. A suitable sampler and demultiplexer structure for this arrangement is shown in FIG. 7 in a portion of chip 14 from FIG. 1.

Figure 7:
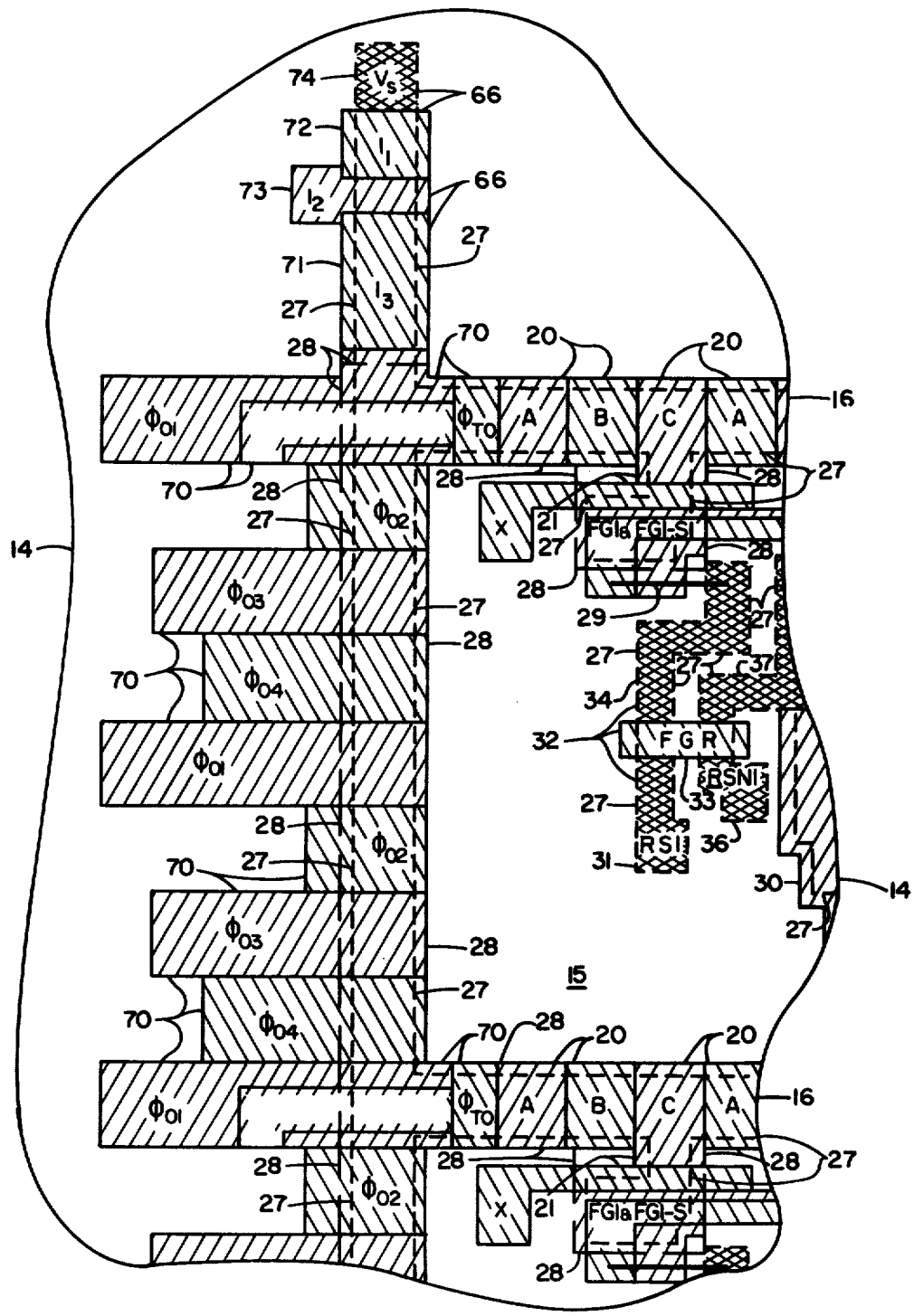
FIG. 7 is a representational layout of a monolithic integrated circuit chip portion embodying an aspect of the present invention.

Structural features in FIG. 7 which are similar to those shown in FIG. 3 retain the same designations in FIG. 7 as they had in FIG. 3. This is also true of the crosshatching conventions used for showing polysilicon gates obtained from the first and second polysilicon depositions and for showing those substantial overlaps of these gates where a substantial portion of one occurs over the other in FIG. 7. Small overlaps again are ignored between adjacent polysilicon gates even though these are necessary in practice. Note that channel stop edges 27 and the edges of buried channel implantations 28 are again designated in the same manner, not only with respect to mesh 16 and signal processing cells 15, but also where used in structuring the further features provided in the sampling and the multiplexing arrangement shown in FIG. 7. None of the metallizations interconnection structures is shown in FIG. 7.

Signal processing cells 15 along the side of the array thereof which is adjacent to the sampler and demultiplexer are nearly identical to signal processing cells 15 shown in FIG. 3, but there is an exception to this at the gate portion at port 21 receiving clocking signal X. Since along this side of the signal processing cell array there are no intersections in mesh 16 such as intersections 17 in FIG. 3, with corresponding intersection gates which receive clocking signal X, the gate clocking signal X is provided to a gating structure both next to and part of the structure of port 21, without this gating structure extending into mesh 16 beyond signal cell 15.

The input sampling arrangement and demultiplexer 65 of FIG. 6C is shown in part in FIG. 7 and is shown to comprise (i) distribution means 67 of FIG. 6C formed in FIG. 7 by a number of polysilicon gates, 70, obtained from the first and second polysilicon depositions, which are part of a buried-channel charge-coupled device which interfaces with various portions of intercellular communication mesh 16 successively along the side of the array of signal processing cells 15, and (ii) input port 66 of FIG. 6C formed in FIG. 7 by a sampling means based on the well-known "fill and spill" charge-coupled device input arrangement. This input arrangement in input port 66 in FIG. 7 is typically used to convert signal portions from parallel operating information sources in acquisition means 11 to charge packets as data samples. Such sampling is typically accomplished by successively applying the signal portions from the parallel operating information sources in acquisition means 11 to a second polysilicon deposition gate, 71, as input signal $I_3$. However, a differential input arrangement is available in input port 66 by applying a first set of signal portions from acquisition means 11 to another second polysilicon deposition gate, 72, as signal $I_1$ with another set of signals—those to be used in forming the differential signals in conjunction with the first set—being applied to gate 71 as signal $I_3$.

Assuming that the former input signal situation exists, that is, a single-ended input signal rather than a differential input signal, then signal portions from acquisition means 11 are applied to gate 71 as input signal $I_3$ and this situation will be the basis for the following description. In this situation, a constant voltage reference is applied to gate 72 as input $I_1$, and similarly, a constant voltage reference is applied to a first polysilicon deposition gate, 73, as signal $I_2$. The first of gates 70 in FIG. 7 adjacent to gate 71, which has a clocking or control signal $\phi_{01}$ applied thereto, is kept at zero volts to prevent any charge from passing beyond gate 71 during sampling.

At this point in the sampling process, a clocking signal designated $V_s$ is applied to a diffusion, 74, adjacent to gate 72. As a result, charge from diffusion 74 has the potential energy thereof increased sufficiently to pass across the pn semiconductor junction separating n-type conductivity diffusion 74 from the remaining parts of substrate 44, and overcome the potential energy barrier established by the reference voltages on gates 72 and 73. Thereby, this charge fills the potential energy well established below gate 71 by the input signal portion applied thereto from one of the parallel operating information sources in acquisition means 11. Thereafter, clock signal $V_s$ applied to diffusion 74 is reduced to zero volts and charge residing under any of gates 71, 72 and 73 is drawn back to diffusion 74 except for that amount of charge which is trapped under gate 71 by the potential energy barriers established by the reference voltages on gates 72 and 73. That trapped charge then is proportional to the voltage value of the input signal portion from acquisition means 11 provided as signal $I_3$, and forms a charge packet data sample of that particular signal portion.

Thereafter, the charge packet beneath gate 71 is ready for translation down the four phase buried-channel charge-coupled device and transfer control arrangement, formed by gates 70, serving as a demultiplexer to distribute the charge packet data samples to the appropriate interfaces with intercellular communication mesh 16. This distribution is suitably arranged and controlled to get that charge packet data sample taken from one of the parallel operating information sources in acquisition means 11 to the corresponding one of signal processing cells 15. The clock signals to provide the four phases, which are applied in succession to adjacent gates 70, are $\phi_{01}$, $\phi_{02}$, $\phi_{04}$.

Each time a charge packet translating along gates 70 comes to interface point with mesh 16 a new charge packet is injected from input port 66 to the buried channel charge-coupled device demultiplexer, corresponding to a different input signal portion to input port 66, so that at some point in time there is a charge packet under every one of those of gates 70 in the buried channel charge-coupled device demultiplexer which are relatively near a portion of intercellular communication mesh 16. A further one of gates 70, which receives a further clock signal $\phi_{TO}$, serves as a transfer gate for transferring such charge packets at such a point in time from the buried channel charge-coupled device demultiplexer to intercellular communication mesh 16. From that point on, each of the charge packets so transferred becomes subject to control of the clocking or control signals applied to intercellular communication mesh 16 and to signal processing cells 15.

Figure 8:
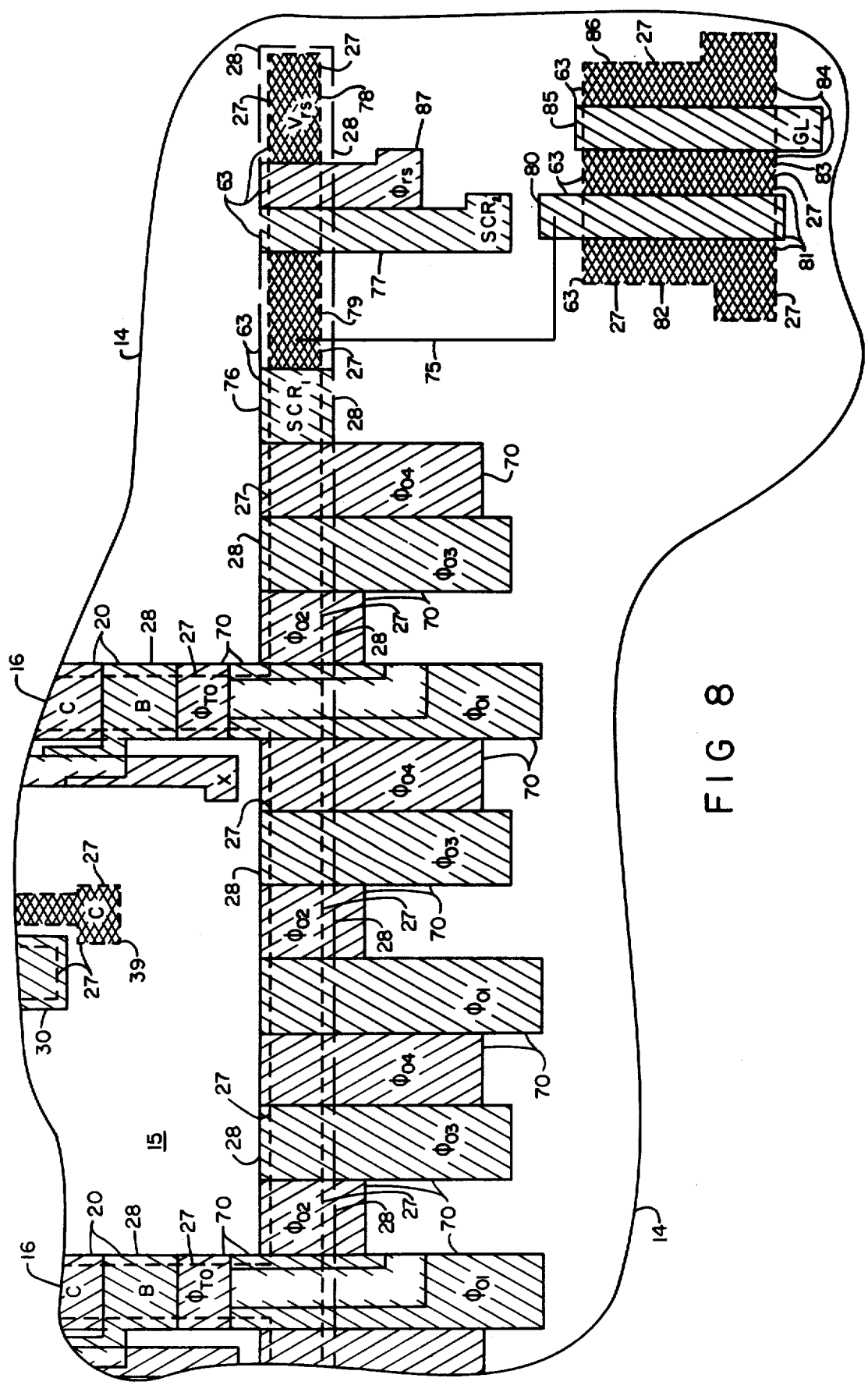
FIG. 8 is a representational layout of a monolithic integrated circuit chip portion embodying an aspect of the present invention.

FIG. 8 shows another portion of chip 14 containing part of output multiplexer 61 of FIG. 6C which is shown to comprise (i) gathering and translating means 62 of FIG. 6C formed in FIG. 8 by a number of polysilicon gates 70 again obtained from the first and second depositions of polysilicon which are part of a buried channel charge-coupled device which interfaces with various portions of intercellular communication mesh 16 successively along the side of the array of signal processing cells 15, and (ii) output port 63 of FIG. 6C formed in FIG. 8 by a well-known floating diffusion output arrangement for charge-coupled devices with two screens to minimize clocking signal feed-through and a pair of n-channel, enhancement mode metal-oxide-semiconductor field-effect transistors forming a load and a source follower.

The same crosshatching symbology is used in FIG. 8 was was used in FIGS. 3 and 7, and again, structures in FIG. 8 similar to those in FIGS. 3 and 7 are designated similarly in FIG. 8 as they were in those figures. As before, the major overlaps of gates in the second polysilicon deposition over gates provided in the first polysilicon deposition are shown, but the small overlaps at the edges of such gates are ignored in FIG. 8. Also, no metallization interconnections are shown in FIG. 8, but here a line representation, 75, is shown to represent such an interconnection in output port 63.

Again, a slight change is required in the signal processing cells 15 along the lower edge of the array thereof in operating area 60 in FIG. 6C that border gathering and translating means 62 because, again, of the lack of intersections 17 and the corresponding polysilicon gates thereover receiving clocking signal X. As can be seen in FIG. 8, a gate portion is formed within each such signal processing cell 15 which does not extend toward either mesh 16 or gathering and translating means 62 beyond the confines of that signal processing cell 15.

At points during operation of parallel processor 10 where output results are desired to be provided to control system means 12, charge packets representing such results are translated along intercellular communication mesh 16 to those places where mesh 16 comes closest to gates 70 of output gathering and translating means 62 in FIG. 8. Those of gates 70 having clocking signal $\phi_{TO}$ applied thereto serving as the transfer gates at the interface between mesh 16 means 62, and those of gates 70 adjacent in the buried channel charge-coupled device of means 62 having clocking signal $\phi_{01}$ applied thereto, are appropriately energized by these signals to transfer such charge packets under such buried channel charge-coupled device gates. Thereafter, gates 70 in the buried channel charge-coupled device operate as part of a four phase, buried-channel charge-coupled device for translating these results to output port 63 using once more clocking signals $\phi_{01}$, $\phi_{02}$, $\phi_{03}$ and $\phi_{04}$.

The floating diffusion output circuit of output port 63 has therein a small positive and constant voltage applied as signal $SCR_1$ to a first polysilicon deposition gate, 76, and a significantly larger positive, constant voltage as signal $SCR_2$ applied to another first polysilicon deposition gate, 77. A larger, yet constant, positive voltage is applied as signal $V_{RS}$ to an n-type conductivity diffusion, 78.

The floating n-type conductivity diffusion, 79, is connected by a metallization interconnection, represented by line 75, to a gate, 80, obtained from the first polysilicon deposition which is the gate of a source follower transistor, 81, used as the output driver in chip 14. Transistor 81 has an n-type conductivity drain diffusion, 82, and an n-type conductivity source diffusion 83 which also serves as a drain for a load transistor, 84. Load transistor 84 has a gate, 85, obtained from the first polysilicon deposition and a source formed by an n-type conductivity diffusion, 86. A constant positive voltage is supplied as signal GL to gate 85 of load transistor 84. Both of these transistors are, as previously indicated, n-channel, enhancement mode metal-oxide-semiconductor field-effect transistors. The output point for the transmission of output results to control system means 12 is taken at diffusion 83. Suitable voltage levels are applied to diffusion 86 and diffusion 82 for operating this source follower pair.

In operating the floating gate diffusion output arrangement of output port 63, the arrangement is first reset prior to accepting a charge packet from the last of gates 70 preceding output port structure 63. This last gate 70 receives clocking or control signal $\phi_{04}$ which will have a voltage thereon of approximately 15 volts to hold temporarily the charge packet received thereby at that location and which is further prevented from getting into output port 63 by the relatively smaller voltage $SCR_1$ on gate 76 setting up a potential barrier. To reset output port 63, a pulse of 15 volts occurs in clocking signal $\phi_{RS}$ which is applied to a second polysilicon deposition gate, 87, adjacent to diffusion 78. Any charge occurring under floating diffusion 79 or screen gate 77 will be dumped into the charge sink diffusion 78 and thereby removed.

Upon clocking signal $\phi_{RS}$ returning to zero, clocking signal $\phi_{04}$ has the voltage therein reduced to zero to transfer the output data sample charge packet stored thereunder, as indicated above, to being beneath floating diffusion 79 and gate 77. The passing of this charge through floating diffusion 79 affects the voltage occurring on gate 80 of transistor 81 to thereby vary the output taken at diffusion 83 accordingly. Such an operating cycle is repeated each time a charge packet, transferred from mesh 16 to gates 70, if any, is timed to reach output port 63.

In FIG. 1, and again in FIGS. 6A, 6B and 6C there is a block-form arrow representation indicating a flow of information from control system means 12 to parallel processor 10 as well as an arrow indicating an output from parallel processor 10 to control system means 12. This flow to parallel processor 10 from control system means 12 represents the control signals used for selecting the desired signal processing operations and for the directing of the performance of such operations and associated operations to facilitate signal processing operations. For an implementation of the parallel processor of the form shown in FIG. 3 for chip 14, these control signals will be clocking signal voltage waveforms over time which in various sequences must precisely overlap one another in time, as is required for the suitable operation of charge-coupled devices, and which must have proper waveform voltage amplitudes. Such waveforms will usually be generated from information stored in a computer, either a minicomputer or a microcomputer depending on the system needs.

Figure 9A:
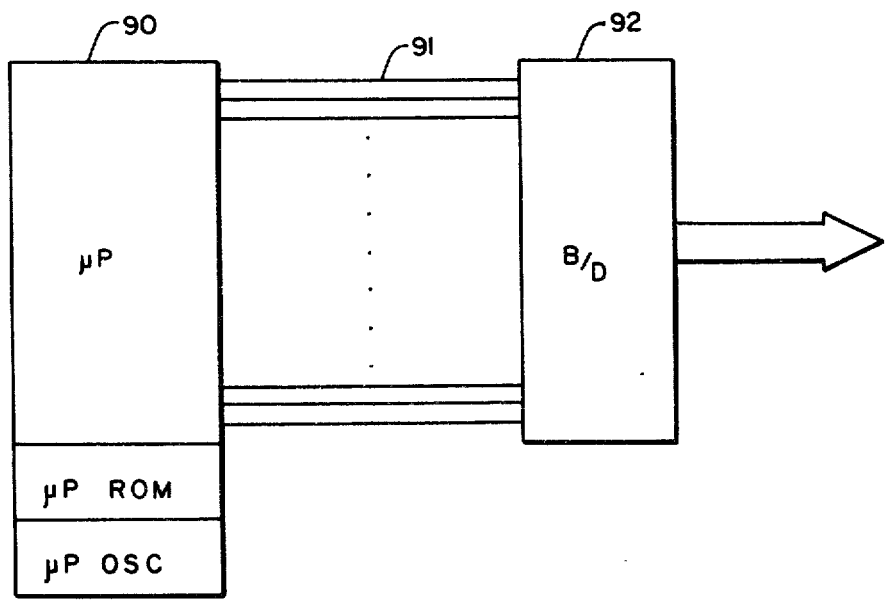
FIGS. 9A and 9B are system diagrams representing control system configurations available for the present invention.

Assuming that a microcomputer will usually be a sufficient choice, and often a microcomputer having the microprocessor portion thereof provided on a single monolithic integrated chip, FIG. 9A is a block diagram of a system which might be chosen to implement a portion of control system means 12 to thereby supply the clocking waveforms to parallel processor 10. The system shown in FIG. 9A shows a block diagram microcomputer system, 90, at least those parts thereof that are most pertinent for these purposes in control system means 12. Microcomputer system 90 is shown to comprise a microprocessor, $\mu P$, with an associated read-only-memory, $\mu P$ ROM, and a source of fundamental clocking signal waveforms and timing provided by an oscillator, $\mu P$ OSC. The program provided for microcomputer 90 leads to output waveforms on control signal lines, 91, which are provided to a buffer-driver system, 92. System 92 then, under control of microcomputer 90, provides the actual control signal voltage waveforms to parallel processor 10.

This foregoing arrangement, while feasible, has some disadvantages. Because of situations where precise overlapping in time between certain voltage waveform transitions is required, the fundamental clock $\mu P$ OSC must operate at a frequency which is at least five times higher than the highest frequency required in the full signal waveforms. Given some maximum rate at which the microcomputer 90 can be operated, clearly then parallel processor 10 would have to operate at frequencies no higher than one-fifth that of microcomputer 90, a severe limitation in many parallel processing operations. Another disadvantage is that the microcomputer 90 will be rather burdened since all of the output lines therefrom to system 92 will have to be continually operated to generate the continuous control waveforms for the ongoing operation of parallel processor 10.

Figure 9B:
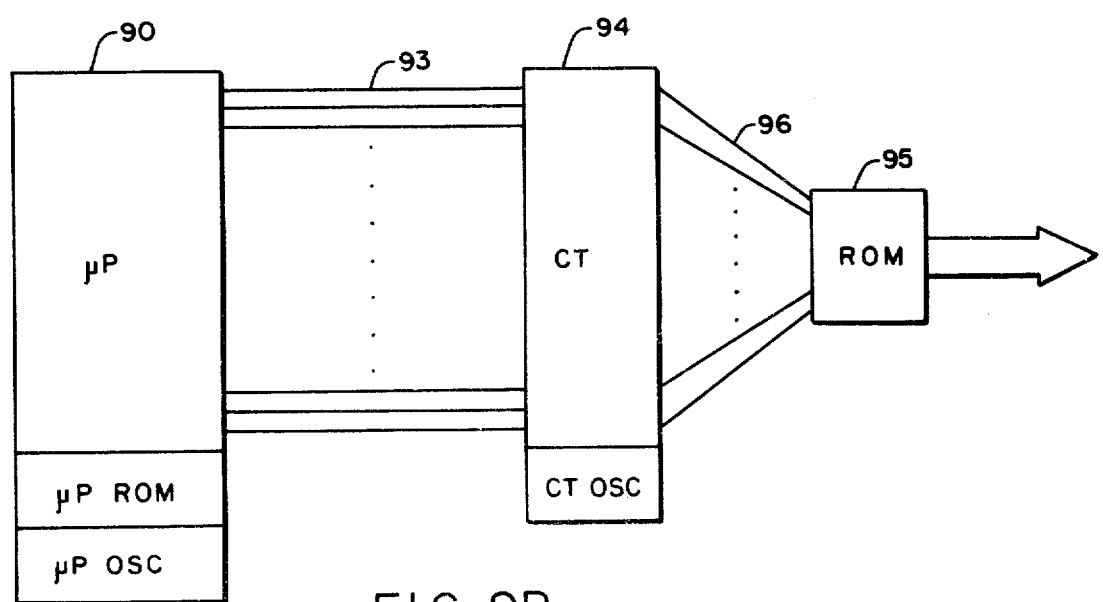

These problems can be averted by use of the somewhat different arrangement shown in FIG. 9B. Here again there is provided microcomputer 90 but with a set of signal lines, 93, which are now used to control in an oscillator-driven counting system, 94. Counter system 94 comprises a digital counter, CT, which is driven through its count sequence by an oscillator, CT OSC, and for most counters and most microprocessors, oscillator CT OSC can be operated at a much higher frequency than can oscillator $\mu P$ OSC. Counter system 94 then provides signals to an output read-only-memory, 95, which is operated by counter system 94 along a further set of signal lines, 96. In operation, microcomputer 90 need only generate output signals on signal lines 93 which reset counter system 94 to some initial count in a count series where this count series serves as addresses for memory system 95 such as to cause memory system 95 to provide a sequence of outputs over time which represents the control signals desired for operating parallel processor 10. Thus, once the initial count is set in counter system 94, relatively higher frequency oscillator CT OSC is enabled such that counter system 94 rapidly counts through the sequence of counts corresponding to a desired signal processing operation to thereby rapidly supply a sequence of addresses to memory system 95. This sequence of addresses then leads to a sequence of state changes at the outputs of memory system 95 which over time constitutes the control signals supplied to parallel processor 10. Memory system 95 may involve more than a digital read-only-memory in that it may also have certain analog circuitry to shape the digital waveforms brought out of the memory stations in system 95.

Thus, with oscillator CT OSC running at a relatively high frequency compared to the frequency which oscillator $\mu$P OSC can operate, control signals coming out of memory system 95 can be supplied at high frequency rates. At the same time, microcomputer 90 is freed of doing anything but every so often applying preset signals to counting system 94 at the beginning of a signal processing operation. Hence, the disadvantages of the system FIG. 9A have been overcome by the system in FIG. 9B.

Figure 10A:
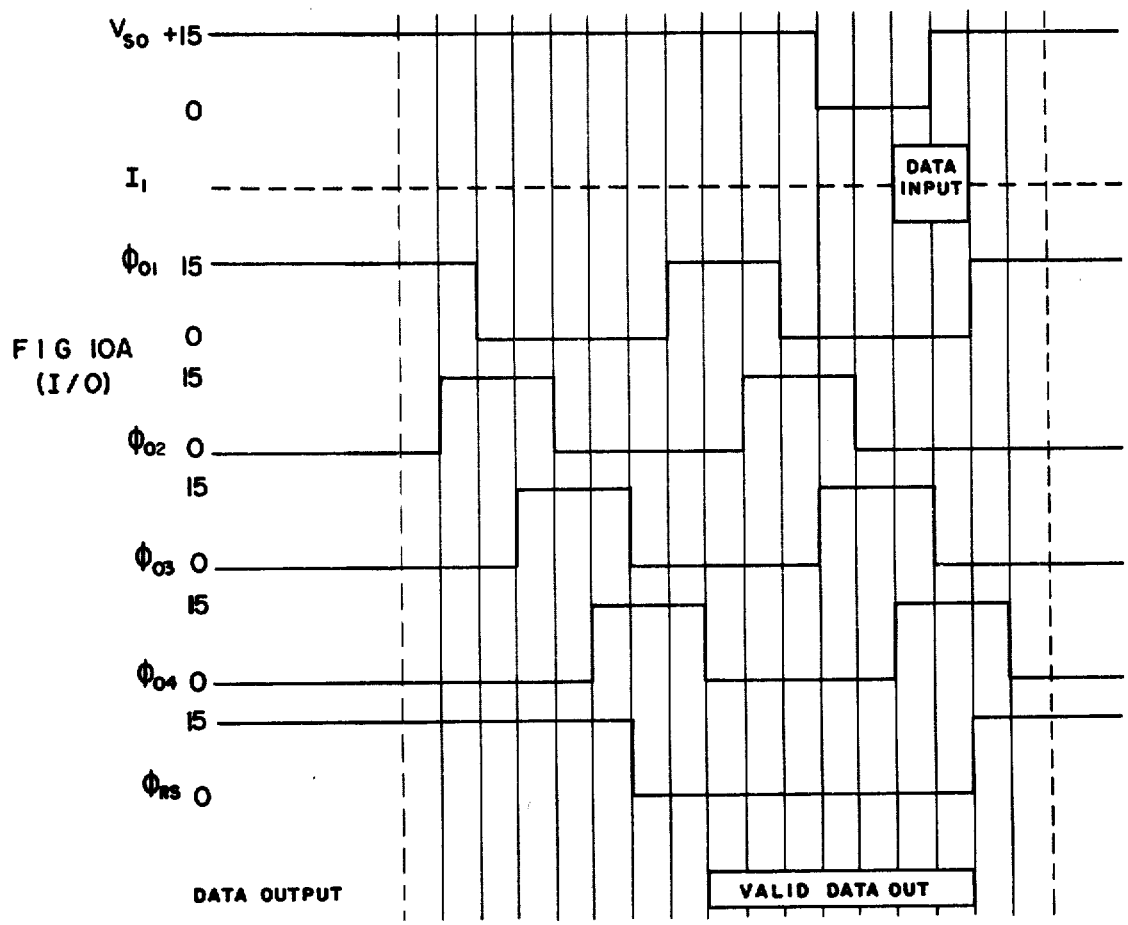
FIGS. 10A through 10R show various basic signal processing operations for use with one configuration of the present invention.
Figure 10B:
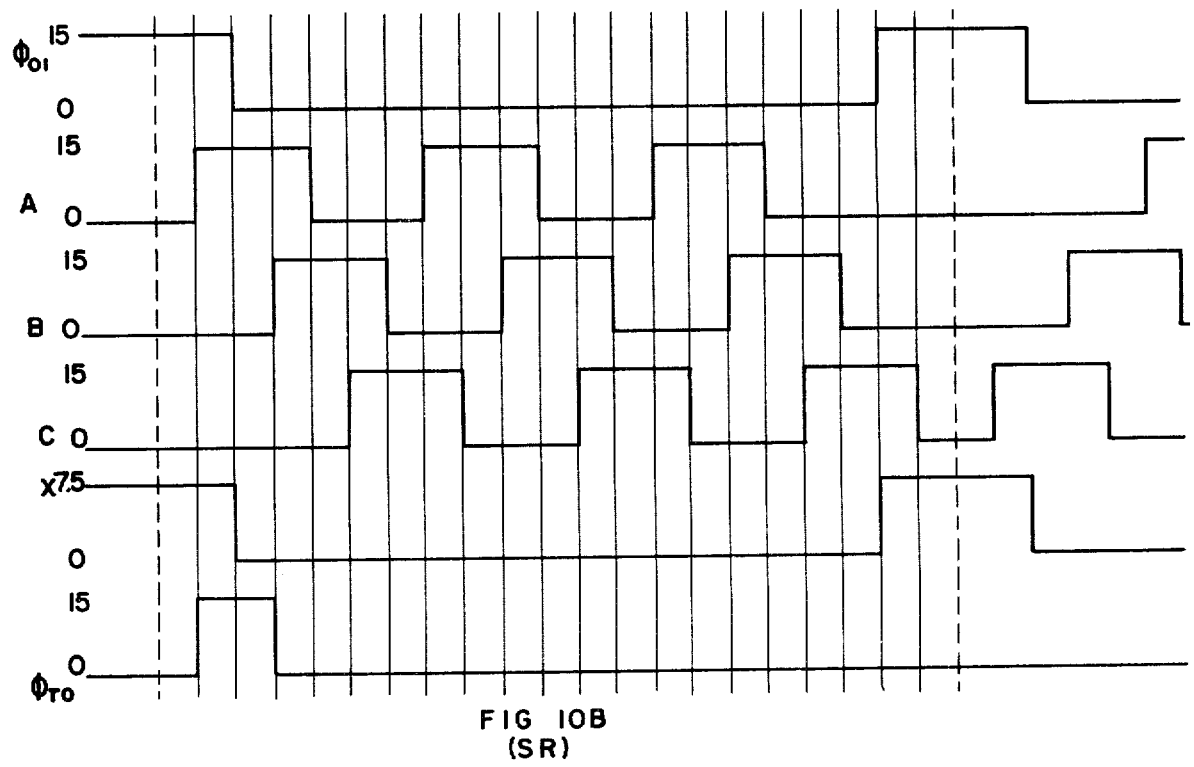
Figure 10C:
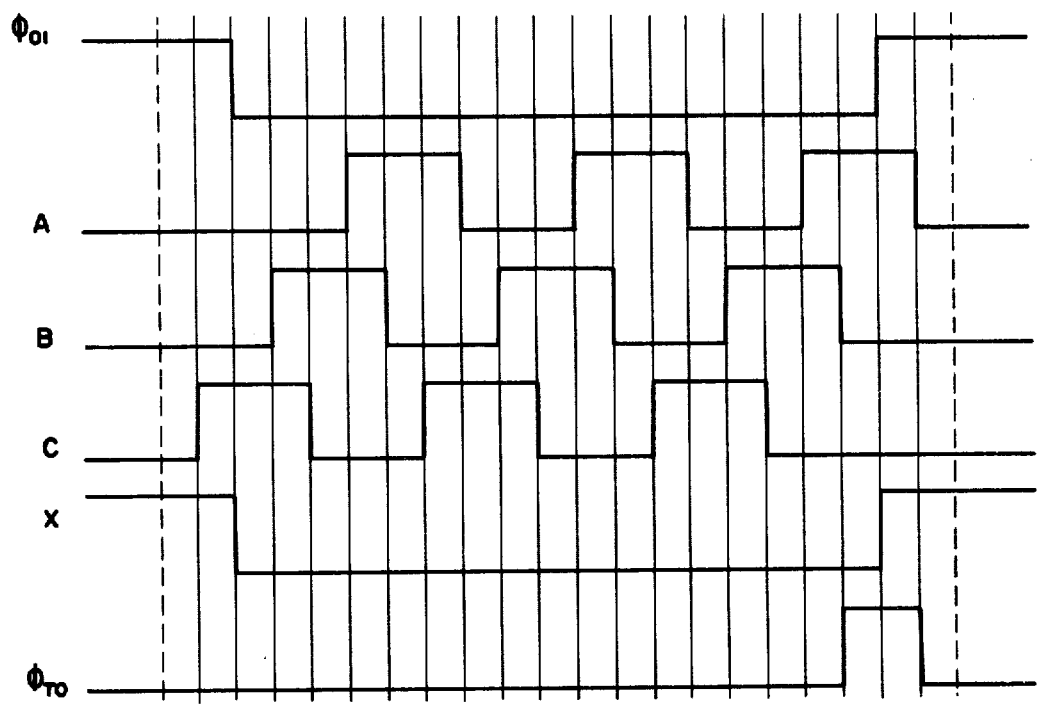
Figure 10D:
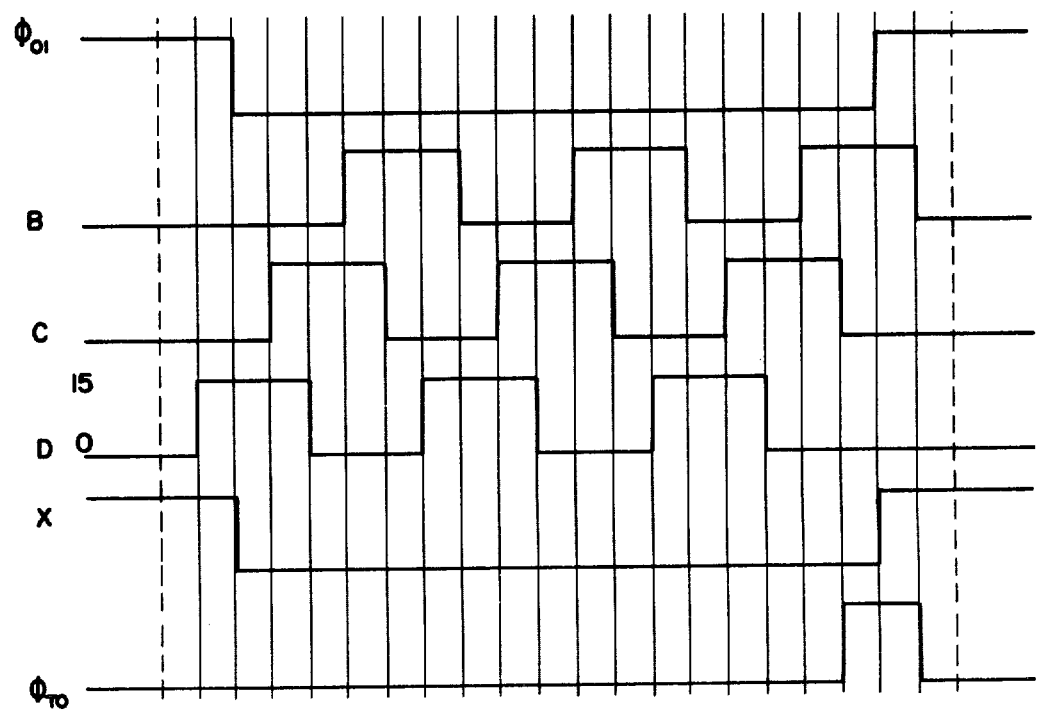
Figure 10F:
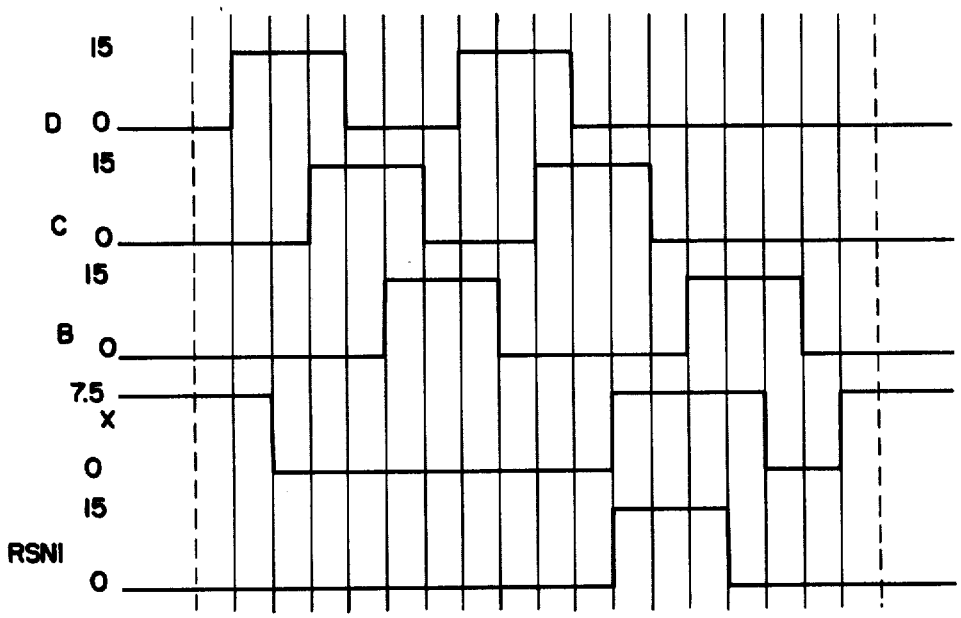
Figure 10G:
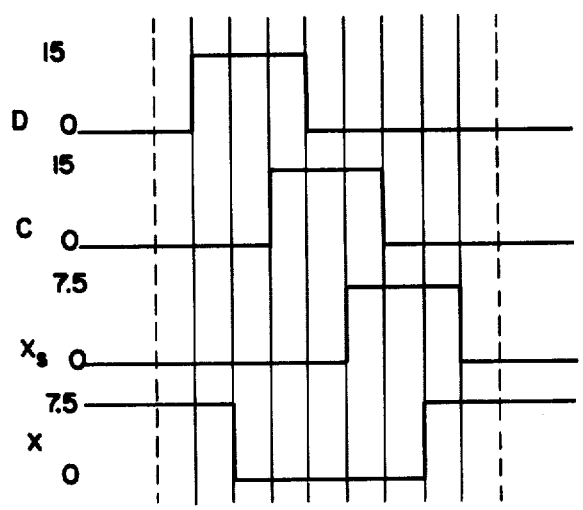
Figure 10H:
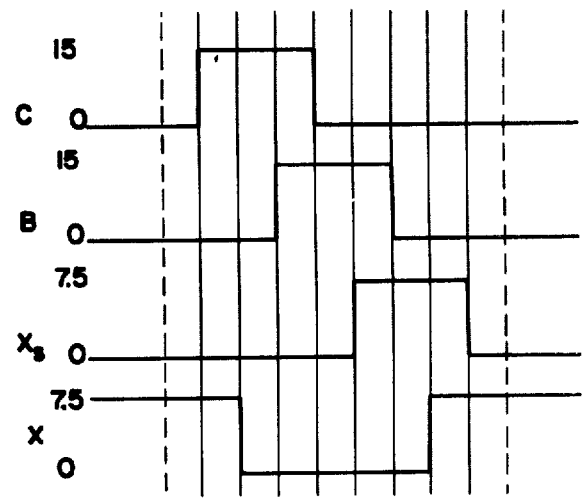
Figure 101:
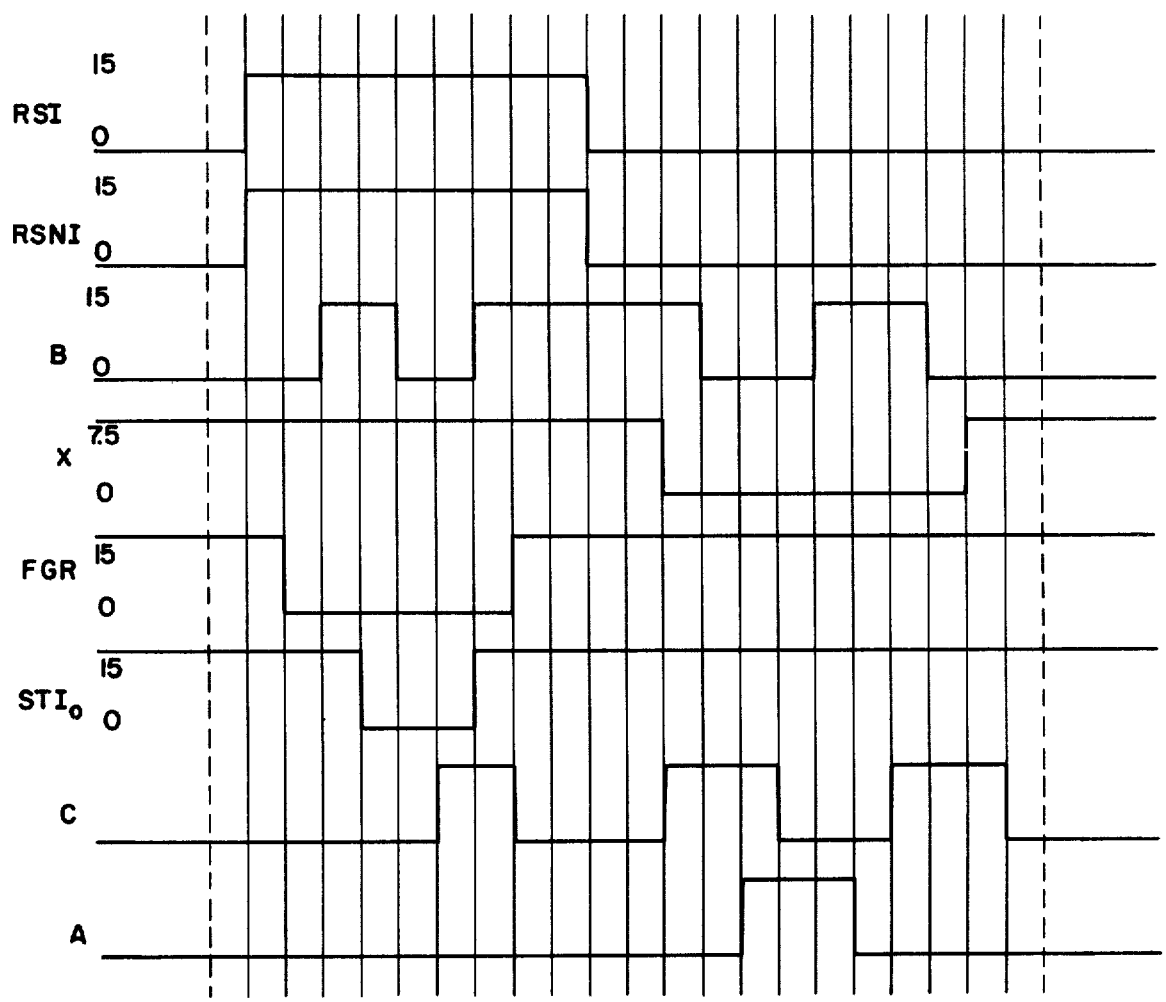
Figure 10J:
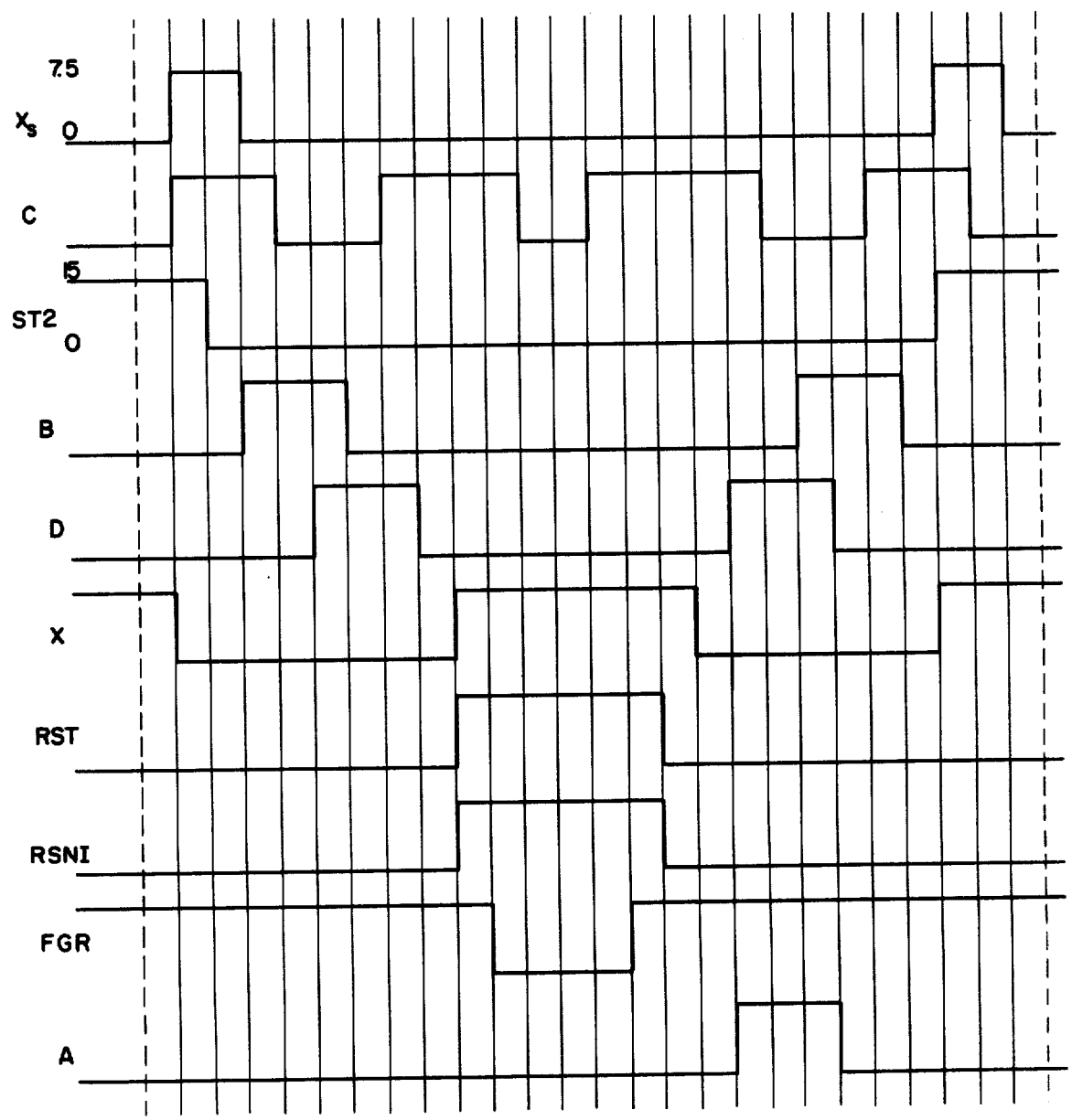

FIGS. 10A-10R depict the control signal, or clocking signal, voltage waveforms suitable for performing certain basic signal processing operations in parallel processor 10. The clocking signal designation for each such waveform is set out at the left of that waveform and the vertical lines can be taken to be time unit markers. The time duration between each vertical line, a time unit, is typically less than a microsecond but varies depending on the signal processing needs involved. The voltage levels also appear to the left of the waveforms. The corresponding command mnemonic for each figure, the function performed by the command, the corresponding figure number and the appropriate assumptions are set out in the following list. Below that list is set out the list of initial conditions to which parallel processor 10 is returned to at the end of performance of each command in the preceding list as the basis for beginning the next command from that list as directed by control system means 12.

BASIC COMMANDS

| Command Symbol | Function | Figure No. | Assumptions |
|---|---|---|---|
| I/O | Read in, Shift, Read Out | 10A | |
| SR | Shift Right | 10B | Assumes Charge Packet at Intersection. |
| SL | Shift Left | 10C | Assumes Charge Packet at Intersection |
| SU | Shift Up | 10D | Assumes Charge Packet at Intersection |
| SD | Shift Down | 10E | Assumes Charge Packet at Intersection |
| L1 | Load Storage Site 1 | 10F | Assumes Charge Packet at Intersection |
| L2 | Load Storage Site 2 | 10G | Assumes Charge Packet at Intersection |
| L3 | Load Storage Site 3 | 10H | Assumes Charge Packet at Intersection |
| R1 | Regenerate (S1×MG) | 10I | Assumes Intersections Empty |
| R2 | Regenerate (S2×MG) | 10J | Assumes Intersections Empty |
| R3 | Regenerate (S3×MG) | 10K | Assumes Intersections Empty |
| U1 | Unload Storage Site 1 | 10L | Assumes Charge Packet Sent to Intersection |
| U2 | Unload Storage Site 2 | 10M | Assumes Charge Packet Sent to Intersection |
| U3 | Unload Storage Site 3 | 10N | Assumes Charge Packet Sent to Intersection |
| E1 | Erase Storage Site 1 | 10O | Assumes Charge Packet at Intersection |
| E2 | Erase Storage Site 2 | 10P | Assumes Charge Packet at Intersection |
| E3 | Erase Storage Site 3 | 10Q | Assumes Charge Packet at Intersection |
| M2 | Subtract S2 from S1 | 10R | Assumes No Charge Packet in Intersection and ST3 is Empty |

INITIAL CONDITIONS FOR COMMANDS

| Clocking Signal | Initial Condition | Processor Locations |
|---|---|---|
| $V_s$ | High + 5V | Input Diffusion |
| $\phi 01$ | High + 15V | Input-Output Phase 1 gates |
| $\phi 02$ | Low (Ground) | Input-Output Phase 2 gates |
| $\phi 03$ | Low (Ground) | Input-Output Phase 3 gates |
| $\phi 04$ | Low (Ground) | Input-Output Phase 4 gates |
| $\phi TO$ | Low (Ground) | Transfer to Mesh |
| A | Low (Ground) | Mesh Transfer Phase 1 gates |
| B | Low (Ground) | Mesh Transfer Phase 2 gates |
| C | Low (Ground) | Mesh Transfer Phase 3 gates |
| D | Low (Ground) | Mesh Transfer Phase 4 gates |
| X | High + 7V | Intersection Gate |
| XS | Low (Ground) | Storage Transfer Gate |
| ST1 | High + 20V | Storage Site 1 Gate |
| ST2 | High + 15V | Storage Site 2 Gate |
| ST3 | High + 15V | Storage Site 3 Gate |
| FGR | High + 15V | Floating Gate Reset Transistor Gates |
| RSNI | Low (Ground) | Reset Transistor Drain Noninverting |
| RSI | Low (Ground) | Reset Transistor Drain Inverting |
| MG | Low (TBD) | Multiplier Gate |
| $\phi RS$ | High + 15V | Output Reset Gate |

The embodiments of the invention in which an exclusive property or right is claimed are defined as follows:

1. A monolithic integrated circuit parallel signal processing system for processing information source signals, and entities derived therefrom, said system comprising:

a semiconductor material body of a first conductivity type except in selected regions thereof, said semiconductor material body having a first major surface;

a plurality of signals processing cells each of which is located to some extent in said semiconductor material body substantially adjacent to said first major surface in an array adjacent said major surface such that each of said plurality of signal processing cells corresponds to a plurality of immediately neighboring signal processing cells thereabout spaced apart from that corresponding one of said plurality of signal processing cells but which to a substantial degree together surround that corresponding one of said plurality of signal processing cells, where at least two of said plurality of signal processing cells serve as part of such neighboring signal processing cells with respect to one another, each of said plurality of signal processing cells being capable of receiving at least some kinds of signals, each of said plurality of signal processing cells being capable of being directed to perform, and of performing, a sequence of signal processing operations selected from a set of signal processing operations in a selectable order and of a selectable number upon at least some kinds of any of said signals that can be received, as aforesaid, and each of said plurality of said signal processing cells being capable of providing signals, representing results of that said signal processing cell performing said sequence, as aforesaid; and an intercellular communication means provided in said monolithic integrated circuit including portions thereof extending between each of said plurality of signal processing cells and said plurality of neighboring signal processing cells to which it corresponds and which is capable of transmitting directly signals to each of said plurality of signal processing cells from said plurality of neighboring signal processing cells to which it corresponds.

2. The apparatus of claim 1 wherein said intercellular communications means is an intercellular communications mesh having a plurality of connecting portions bordering each of said plurality of signal processing cells and each of those said neighboring signal processing cells corresponding thereto with each said connecting portion occurring between two intersection locations where each said intersection location is such that a plurality of said connecting portions are joined thereby, with each of said plurality of signal processing cells being completely bordered by certain of said connecting portions and said intersections.

3. The apparatus of claim 1 wherein at least one of said plurality of said signal processing cells is capable of receiving information source signals from a source means independent of said intercellular communication means.

4. The apparatus of claim 1 wherein a selection of, and a direction to perform, a said signal processing operation in said plurality of said signal processing cells in a selected time duration is accomplished by providing a selected set of control signals of selected amplitude values over said selected time duration to various portions of each of said plurality of signal processing cells through an interconnection means.

5. The apparatus of claim 1 wherein a selection of, and a direction to perform, a said signal processing operation is provided through an interconnection means by a microprocessor formed in a monolithic integrated circuit.

6. The apparatus of claim 2 wherein said connecting portions comprise devices which are charge-transfer devices.

7. The apparatus of claim 3 wherein said source means is a photodetecting means.

8. The apparatus of claim 4 wherein said selected set of control signals is generated at least in part by a microprocessor formed in a monolithic integrated circuit.

9. The apparatus of claim 4 wherein said selected set of control signals is generated at least in part by use of a read-only memory formed in a monolithic integrated cirsiut.

10. The apparatus of claim 6 wherein said connecting portion charge-transfer devices are charge-coupled devices.

11. The apparatus of claim 7 wherein each of said plurality of signal processing cells is capable of receiving signals from a photodetecting means independently of said intercellular communication means.

12. The apparatus of claim 9 wherein a selection of, and a direction to perform, a said signal processing operation is provided by a microprocessor formed in a monolithic integrated circuit.

13. The apparatus of claim 10 wherein said connecting portion charge-transfer devices are buried channel charge-coupled devices.

14. The apparatus of claim 11 wherein each of said plurality of signal processing cells receives signals from a corresponding said photodetector means at an analog-to-digital converter therein.

15. The apparatus of claim 13 wherein each of said plurality of signal processing cells and each of those said neighboring signal processing cells corresponding thereto contain charge-coupled device floating gate regenerators having two adjacent floating gates which each receive a plurality of distinct charge aggregations as said information source signals, and entities derived therefrom, but in a manner such that those distinct charge aggregations received at either of said floating gates can be kept from those distinct charge aggregations received at that other said floating gate.

16. The apparatus of claim 14 wherein each said analog-to-digital converter is formed by charge-coupled device floating gate regenerator having two adjacent floating gates which can each receive a plurality of distinct charge aggregations as said information source signals, and entities derived therefrom, but in a manner such that those distinct aggregations received at either of said floating gates can be kept from those distinct charge aggregations received at that other said floating gate.

17. A monolithic integrated circuit parallel signal processing system for processing signal samples, and entities derived therefrom, said samples and derived entities formed as distinct charge aggregations, said system comprising:

a semiconductor material body of a first conductivity type except in selected regions thereof including first, second, third and fourth selected regions, said semiconductor material body having a first major surface;

an intercellular communications mesh, substantially adjacent said first major surface, having a plurality of connecting portions placed between cell locations with each said connecting portion also occurring between two intersection locations where each said intersection location is such that a plurality of said connecting portions are joined thereby, each said connecting portion comprising a charge-transfer device capable of substantially translating distinct charge aggregations and with a plurality of said cell locations each being completely surrounded by certain of said connecting portions and said intersection locations; and a plurality of signal processing cells each of which is located at a corresponding one of said cell locations, each said signal processing cell being capable of receiving distinct charge aggregations from a said connecting portion charge-transfer device bounding at least in part a said cell location corresponding to that said signal processing cell, each said signal processing cell being capable of performing a selected sequence of a selected number of signal processing operations upon distinct charge aggregations received by that said signal processing cell as aforesaid, and each said signal processing cell being capable of transferring distinct charge aggregations, representing results of that said signal processing cell performing said selected sequence, as aforesaid, to a said connecting portion charge-transfer device bounding at least in part a said cell location corresponding to that said signal processing cell.

18. The apparatus of claim 17 wherein said connecting portion charge-transfer devices are charge-coupled devices.

19. The apparatus of claim 17 wherein at least one of said signal processing cells is capable of receiving distinct charge aggregations from a source means independent of said intercellular communication mesh.

20. The apparatus of claim 17 wherein each said signal processing cell is capable of being directed to perform, and of performing, a selectable sequence, including said selected sequence, of a selectable number of signal processing operations upon distinct charge aggregations received by that said signal processing cell as aforesaid.

21. The apparatus of claim 17 wherein said signal processing cells each contain a charge-coupled device floating gate regenerator having two adjacent floating gates which can each receive a plurality of distinct charge aggregations but in a manner such that those distinct charge aggregations received at either of said floating gates can be kept from those distinct charge aggregations received at that other said floating gate.

22. The apparatus of claim 17 wherein said signal processing operations performed by each of said plurality of said signal processing cells includes among them an operation for providing a distinct charge aggregation which contains charge equal to selectable multiples of that charge contained in a distinct charge aggregation received by that said signal processing cell as aforesaid.

23. The apparatus of claim 17 wherein said intersection locations each contain a routing means which is capable of receiving distinct charge aggregations from any of said plurality of said connecting portion charge-transfer devices joined thereby, and which is capable of routing any of said distinct charge aggregations so received to any of said plurality of said connecting portion charge-transfer devices joined thereby.

24. The apparatus of claim 17 wherein said monolithic integrated circuit has a first input port and an associated charge-transfer device extending therefrom, said first input port being capable of receiving a signal for processing from outside of said monolithic integrated circuit and to provide information in such an outside signal as distinct charge aggregations to said first input port charge-transfer device, said first input port charge-transfer device being capable of transferring distinct charge aggregations at a plurality of locations to a plurality of connecting portion charge-transfer devices.

25. The apparatus of claim 17 wherein said monolithic integrated circuit contains a first output port having an associated charge-transfer device extending therefrom, said first output port charge-transfer device being capable of receiving distinct charge aggregations at a plurality of locations from a plurality of connecting portion charge-transfer devices, and transferring same to said first output port, said first output port being capable of providing an output signal substantially based on said distinct charge aggregations received by said first output port charge-transfer device.

26. The apparatus of claim 18 wherein said connecting portion charge-transfer devices are buried channel charge-coupled devices.

27. The apparatus of claim 19 wherein said source means is a photodetecting means.

28. The apparatus of claim 19 wherein said monolithic integrated circuit contains a first output port having an associated charge-transfer device extending therefrom, said first output port charge-transfer device being capable of receiving distinct charge aggregations at a plurality of locations from a plurality of connecting portion charge-transfer devices, and transferring same to said first output port, said first output port being capable of providing an output signal substantially based on said distinct charge aggregations received by said first output port charge-transfer device.

29. The apparatus of claim 20 wherein a selection of, and a direction to perform, a said signal processing operation in a selected signal processing cell in a selected time duration is accomplished by providing a selected set of control signals of selected amplitude values over said selected time duration to various portions of said signal processing cell through an interconnection means.

30. The apparatus of claim 20 wherein a selection of, and a direction to perform, a said signal processing operation is provided through an interconnection means by a microprocessor formed in a monolithic integrated circuit.

31. The apparatus of claim 20 wherein said signal processing operations performed by each of said plurality of said signal processing cells includes among them an operation for providing a distinct charge aggregation which contains charge equal to selectable multiples of that charge contained in a distinct charge aggregation received by that said signal processing cell as aforesaid.

32. The apparatus of claim 21 wherein said charge-coupled device floating gate regenerator has an inverting floating gate separated from said first major surface by first and second insulating layers with said inverting floating gate being across said first and second insulating layers from first and second portions of said semiconductor material body, respectively, where said first and second portions of said semiconductor material body are separated from one another by means sufficient to prevent a distinct charge aggregation in one of said first and second portions from transferring into that one remaining, and wherein said charge-coupled device floating gate regenerator further has a non-inverting floating gate separated from said first major surface by third and fourth insulating layers with said non-inverting floating gate being across said third and fourth insulating layers from third and fourth portions of said semiconductor material body, respectively, where said first and second portions of said semiconductor material body are separated from one another by means sufficient to prevent a distinct charge aggregation in one of said third and fourth portions from transferring into that one remaining.

33. The apparatus of claim 22 wherein said signal processing operations performed by each of said plurality of said signal processing cells includes among them an operation for providing a distinct charge aggregation which contains charge equal to a sum of those charges contained in a plurality of distinct charge aggregations received by that said signal processing cell, as aforesaid, and wherein said signal processing operations further include among them an operation for providing a distinct charge aggregation which contains charge equal to a difference in those charges contained in a plurality of distinct charge aggregations received by that said signal processing cell, as aforesaid.

34. The apparatus of claim 23 wherein said routing means comprises a routing gate separated from said first major surface by a first insulating layer with said routing gate having a side thereof immediately proximate each said connecting portion charge-transfer device joined thereby.

35. The apparatus of claim 24 wherein said monolithic integrated circuit has a plurality of input ports each with an associated charge-transfer device extending therefrom including said first input port and said first input port charge-transfer device.

36. The apparatus of claim 24 wherein said outside signal is a series of substantially continuous analog signal portions consecutively provided to said first input port.

37. The apparatus of claim 24 wherein said input port comprises first, second and third input port gates, each separated from said first major surface by a first insulating layer, said first, second and third input port gates being arranged such that said first and third input port gates are each immediately adjacent to said second input port gate, said first input port gate being also immediately adjacent to said first selected region where it intersects said first major surface, and said third input port gate being also immediately adjacent to said input port charge-transfer device.

38. The apparatus of claim 25 wherein said monolithic integrated circuit has a plurality of output ports each with an associated charge-transfer device extending therefrom including said first output port and said first output port charge-transfer device.

39. The apparatus of claim 25 wherein said output port comprises first, second and third output port gates each separated from said first major surface by a first insulating layer, said first output port gate being immediately adjacent to said output port charge-transfer device and also to said first selected region where it intersects said first major surface, said second output port gate being immediately adjacent to said first selected region where it intersects said first major surface and also being immediately adjacent to said third output port gate, and said third output port gate being immediately adjacent to said second selected region where it intersects said first major surface.

40. The apparatus of claim 28 wherein said source means is a photosensing means.

41. The apparatus of claim 29 wherein a substantially identical said selected set of control signals is applied to each of said signal processing cells in said plurality thereof in said selected time duration.

42. The apparatus of claim 29 wherein said selected set of control signals is generated at least in part by a microprocessor formed in a monolithic integrated circuit.

43. The apparatus of claim 29 wherein said selected set of control signals is generated at least in part by use of a read-only memory formed in a monolithic integrated circuit.

44. The apparatus of claim 32 wherein said first portion of said semiconductor material body across said first insulating layer from said inverting floating gate is free of any of said selected regions at said first major surface thereof and wherein said second portion of said semiconductor material body across said second insulating layer from said inverting floating gate contains said first selected region where it intersects said first major surface, and wherein said third portion of said semiconductor material body across said third insulating layer from said non-inverting floating gate is free of any of said selected regions at said first major surface thereof and wherein said fourth portion of said semiconductor material body across said fourth insulating layer from said non-inverting floating gate contains said second selected region where it intersects said first major surface.

45. The apparatus of claim 32 wherein said non-inverting floating gate is electrically connected to said third selected region, there being a multiplier gate separated from said first major surface by a fifth insulating layer and across from a portion of said semiconductor material body which is immediately adjacent to said third selected region.

46. The apparatus of claim 32 wherein that portion of said inverting floating gate across said first insulating layer from said first portion of said semiconductor material body is immediately adjacent to a first transfer gate, said first transfer gate being separated by said first insulating layer from said first major surface, and wherein that portion of said inverting floating gate across said second insulating layer from said second portion of said semiconductor material body is immediately adjacent to a second transfer gate, said second transfer gate being separated by said second insulating layer from said first major surface, and wherein that portion of said non-inverting floating gate across said fourth insulating layer from said fourth portion of said semiconductor material body is immediately adjacent to a third transfer gate, said third transfer gate being separated from first major surface by said fourth insulating layer.

47. The apparatus of claim 34 wherein said routing gate is across said first insulating layer from said first selected region in said semiconductor material body.

48. The apparatus of claim 36 wherein said input port comprises first, second and third input port gates, each separated from said first major surface by a first insulating layer, said first, second and third input port gates being arranged such that said first and third input port gates are each immediately adjacent to said second input port gate, said first input port gate being also immediately adjacent to said first selected region where it intersects said first major surface, and said third input port gate being also immediately adjacent to said input port charge-transfer device.

49. The apparatus of claim 37 wherein said input port charge-transfer device is a buried channel charge-coupled device.

50. The apparatus of claim 39 wherein said output charge-transfer device is a buried channel charge-coupled device.

51. The apparatus of claim 43 wherein a selection of, and a direction to perform, a said signal processing operation is provided by a microprocessor formed in a monolithic integrated circuit.

52. The apparatus of claim 44 wherein said first portion of said semiconductor material body, across said first insulating layer from said inverting floating gate, is immediately adjacent to said third selected region where said third selected region intersects said first major surface.

53. The apparatus of claim 44 wherein said third portion of said semiconductor material body, across said third insulating layer from said non-inverting floating gate, is immediately adjacent to said fourth selected region where said fourth selected region intersects said first major surface.

54. The apparatus of claim 44 wherein that portion of said inverting floating gate across said first insulating layer from said first portion of said semiconductor material body and that portion of said non-inverting floating gate across said third insulating layer from said third portion of said semiconductor material body are each immediately adjacent to a separating gate, said separating gate being separated from said first major surface by a common insulating layer comprising both said first and third insulating layers.

55. The apparatus of claim 44 wherein said first and second selected regions are of a second conductivity type opposite that of said first conductivity type.

56. The apparatus of claim 46 wherein said first portion of said semiconductor material body, across said first insulating layer from said inverting floating gate, is free of any said selected regions at said first major surface thereof and wherein said second portion of said semiconductor material body across said second insulating layer from said inverting floating gate contains said first selected region where it intersects said first major surface, and wherein said third portion of said semiconductor material body across said third insulating layer from said non-inverting floating gate is free of any of said selected regions at said first major surface thereof and wherein said fourth portion of said semiconductor material body across said fourth insulating layer from said non-inverting floating gate contains said second selected region where it intersects said first major surface.

57. The apparatus of claim 52 wherein said third portion of said semiconductor material body, across said third insulating layer from said non-inverting floating gate, is immediately adjacent to said fourth selected region where said fourth selected region intersects said first major surface.

58. The apparatus of claim 56 wherein said first portion of said semiconductor material body, across said first insulating layer from said inverting floating gate, is immediately adjacent to said third selected region where said third selected region intersects said first major surface across said first insulating layer from said first transfer gate.

59. The apparatus of claim 56 wherein said third portion of said semiconductor material body, across said third insulating layer from said non-inverting floating gate, is immediately adjacent to said fourth selected region where said fourth selected region intersects said first major surface.

60. The apparatus of claim 56 wherein that portion of said inverting floating gate across said first insulating layer from said first portion of said semiconductor material body and that portion of said non-inverting floating gate across said third insulating layer from said third portion of said semiconductor material body are each immediately adjacent to a separating gate, said separating gate being separated from said first major surface by a common insulating layer comprising both said first and third insulating layers.

61. The apparatus of claim 56 wherein said first and second selected regions are a second conductivity type opposite that of said first conductivity type.

62. The apparatus of claim 57 wherein said first and third insulating layers are a common insulating layer.

63. The apparatus of claim 57 wherein said first, second and third selected regions are of a second conductivity type opposite that of said first conductivity type.

64. The apparatus of claim 58 wherein said third portion of said semiconductor material body, across said third insulating layer from said non-inverting floating gate, is immediately adjacent to said fourth selected region where said fourth selected region intersects said first major surface.

65. The apparatus of claim 58 wherein said first, second and third selected regions are of a second conductivity type opposite that of said first conductivity type.

66. The apparatus of claim 64 wherein said first and third insulating layers are a common insulating layer.

67. The apparatus of claim 64 wherein said first, second, third and fourth selected regions are of a second conductivity type opposite that of said first conductivity type.

* * * * *